United States Patent
Rub et al.

(10) Patent No.: US 6,480,125 B2
(45) Date of Patent: Nov. 12, 2002

(54) METHOD AND APPARATUS FOR EFFICIENT ENCODING OF LARGE DATA WORDS AT HIGH CODE RATES

(75) Inventors: Bernardo Rub, Edina, MN (US); Kinhing P. Tsang, Plymouth, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/871,513

(22) Filed: May 31, 2001

(65) Prior Publication Data

US 2002/0014980 A1 Feb. 7, 2002

Related U.S. Application Data

(60) Provisional application No. 60/210,641, filed on Jun. 9, 2000, and provisional application No. 60/212,547, filed on Jun. 20, 2000.

(51) Int. Cl.[7] .................................................. H03M 7/00
(52) U.S. Cl. ............................ 341/50; 341/59; 341/67
(58) Field of Search ............................ 341/50, 59, 67, 341/58, 95, 65; 714/752, 784, 756; 360/77.08

(56) References Cited

U.S. PATENT DOCUMENTS

| | | | |
|---|---|---|---|
| 4,855,742 A | 8/1989 | Verboom | 341/102 |
| 5,177,482 A | 1/1993 | Cideciyan et al. | 341/59 |
| 5,243,348 A | 9/1993 | Jackson | 341/64 |
| 5,537,112 A * | 7/1996 | Tsang | 341/59 |
| 5,652,583 A * | 7/1997 | Kang | 341/67 |
| 5,903,410 A * | 5/1999 | Blaum et al. | 360/77.08 |
| 6,052,072 A * | 4/2000 | Tsang et al. | 341/59 |
| 6,111,834 A | 8/2000 | Rub et al. | 360/48 |
| 6,198,582 B1 * | 3/2001 | Tsang et al. | 714/701 |
| 6,317,856 B1 * | 11/2001 | Fredrickson et al. | 714/755 |

FOREIGN PATENT DOCUMENTS

| | | |
|---|---|---|
| EP | 0 209 671 | 1/1987 |
| EP | 1 024 601 A1 | 1/1999 |
| WO | PCT/IB99/01594 | 4/2000 |

* cited by examiner

*Primary Examiner*—Peguy JeanPierre
*Assistant Examiner*—Jean Bruner Jeanglaude
(74) *Attorney, Agent, or Firm*—Theodore M. Magee; Westman, Champlin & Kelly, P.A.

(57) ABSTRACT

Methods of encoding and decoding as well as an encoder and decoder are provided for encoding data words into codewords and decoding codewords into data words. The data words are encoded by mapping each data word into a number of data segments. Each data segment is then encoded to form a codeword segment that has the same number of bits as the data word segment. The codeword segments are concatenated to form the codeword. The codewords are decoded by decoding individual codeword segments into data word segments that are the same size as the codeword segments. The data word segments are then mapped into the data word, which has fewer bits than the total number of bits across all data word segments.

21 Claims, 11 Drawing Sheets

METHOD AND APPARATUS FOR EFFICIENT ENCODING OF LARGE DATA WORDS AT HIGH CODE RATES

CROSS-REFERENCE TO RELATED APPLICATION

This application claims priority from U.S. Provisional Application having Ser. No. 60/210,641, filed on Jun. 9, 2000, and entitled EFFICIENT BLOCK CODE IMPLEMENTATION FOR VERY LARGE CODEWORDS and U.S. Provisional Application having Ser. No. 60/212,547, filed on Jun. 20, 2000, and entitled SEQUENTIAL ENCODER/DECODER IMPLEMENTATION FOR BLOCK CODES WITH LARGE CODEWORDS.

FIELD OF THE INVENTION

The present invention relates to encoding systems. In particular, the present invention relates to encoding systems in disc drives.

BACKGROUND OF THE INVENTION

In the field of digital communications, digital information is conveyed from a transmitter to a receiver through a channel. "Channel" is a generalized term that can include many things. For instance, in satellite communication systems, the channel consists of the atmosphere between an earth-bound transmitter and a satellite. In data storage devices, such as magnetic disc drives, the channel includes a storage medium where the signal is stored for some period of time before being delivered to the receiver.

All channels introduce noise into the signals they convey. To detect and sometimes to correct errors caused by this channel noise, the art has developed a large number of coding techniques. These coding techniques convert data words formed of "m" data bits into larger codewords formed of "n" code bits. The additional bits in the codewords permit the detection and sometimes the correction of errors in the signals received from the channel.

The ratio of the number of data bits to the number of code bits, m/n, is known as the code rate of the code. In general, the ability to detect and correct errors in a received signal increases as the code rate decreases because a lower code rate means a greater number of additional bits in the codeword. However, each additional bit added by the encoder increases the time and energy needed to transmit the signal through the channel. Thus, to minimize the time and energy needed to send the code, the code rate should be maximized.

In one type of coding, known as Non-Return-to-Zero Inverse (NRZI), every digital one in a codeword is represented by a transition in the transmitted signal, and every digital zero is represented by a lack of transitions in the transmitted signal. To allow the receiver to generate a clock signal from the received signal, the encoded signal is generally limited so that the number of consecutive zeros is no greater than a maximum number "k". This kind of code is known as a run-length-limited (RLL) code with a "k" constraint.

It is also known to limit the number of consecutive ones codewords to limit the effects of inter-symbol interference, which occurs when consecutive transitions in the transmitted signal interfere with each other. This is sometimes done by requiring some number, d, of zeros between ones. An RLL code with a d and k constraint are usually referred to as a (d,k) RLL code.

To achieve higher code rates, the number of bits being encoded can be increased. For example, a 64/65 code has a higher code rate than a 17/18 code. However, with each additional bit in the input data word, the number of possible input data words increases by a multiple of 2. Thus, there are twice as many possible 64-bit data words($2^{64}$) as there are 63-bit data words($2^{63}$).

For even modest data word sizes, the number of available data words makes encoding through a simple table look-up inefficient. For example, for a word length of 20 bits, a table look-up encoding scheme would need to search a database of $2^{20}$ (1,048,576) entries. Thus, a system is needed for encoding and decoding large words without using a large look-up table.

The present invention addresses this and other problems, and offers other advantages over the prior art.

SUMMARY OF THE INVENTION

Methods of encoding and decoding as well as an encoder and decoder are provided for encoding data words into codewords and decoding codewords into data words. The data words are encoded by mapping each data word into a number of data segments. Each data segment is then encoded to form a codeword segment that has the same number of bits as the data word segment. The codeword segments are concatenated to form the codeword. The codewords are decoded by decoding individual codeword segments into data word segments that are the same size as the codeword segments. The data word segments are then mapped into the data word, which has fewer bits than the total number of bits across all data word segments.

DETAILED DESCRIPTION OF ILLUSTRATIVE EMBODIMENTS

Figure 1:
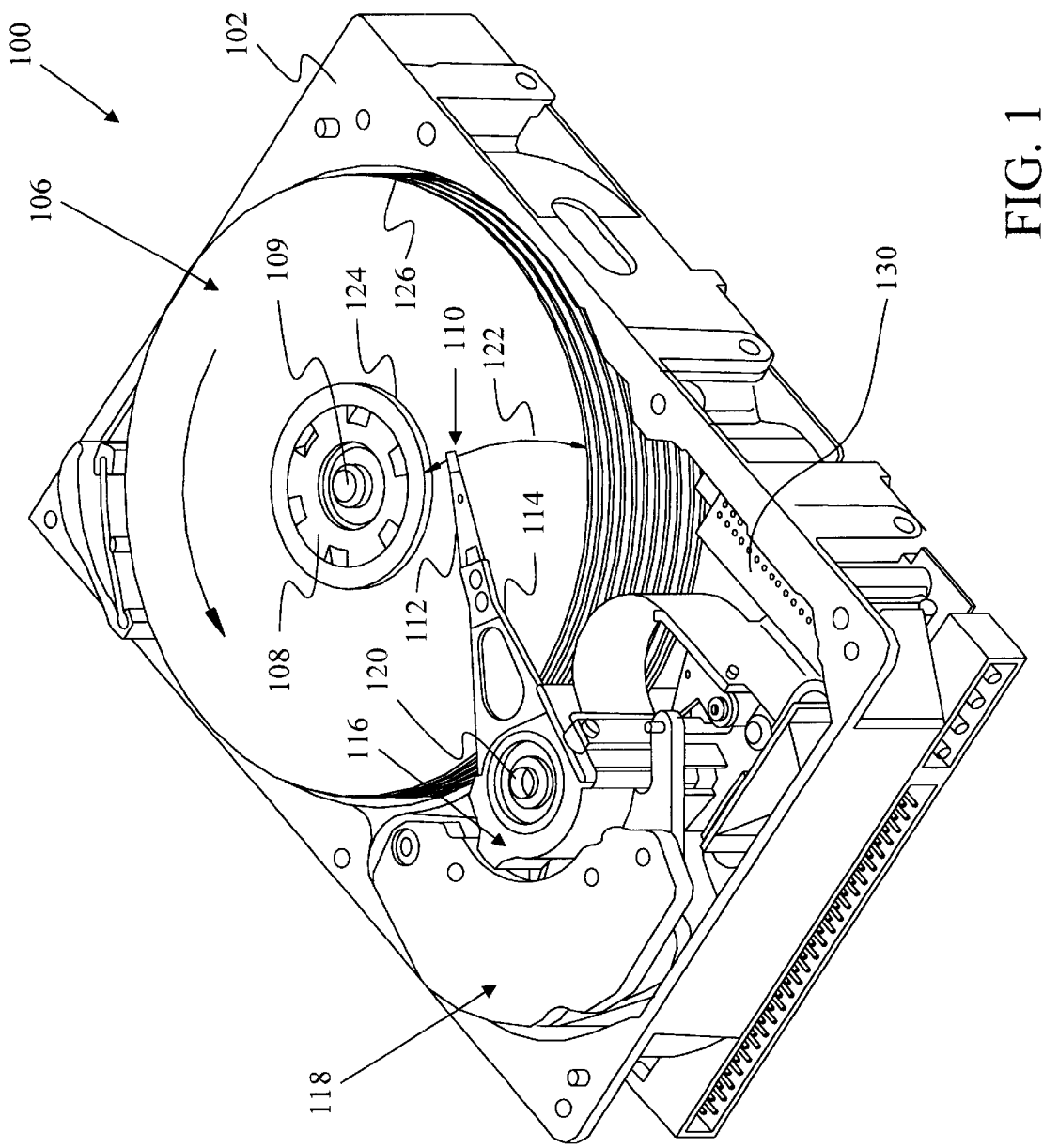
FIG. 1 is a perspective view of disc drive in which aspects of the present invention may be practiced.

FIG. 1 is a perspective view of a disc drive 100 in which the present invention is useful. Disc drive 100 includes a housing with a base 102 and a top cover (not shown). Disc drive 100 further includes a disc pack 106, which is mounted on a spindle motor (not shown), by a disc clamp 108. Disc pack 106 includes a plurality of individual discs, which are mounted for co-rotation about central axis 109. Each disc surface has an associated disc head slider 110 which is mounted to disc drive 100 for communication with the disc surface. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 is driven by servo electronics located in electronics 130 based on signals generated by heads 110 and a host computer (not shown).

Figure 2:
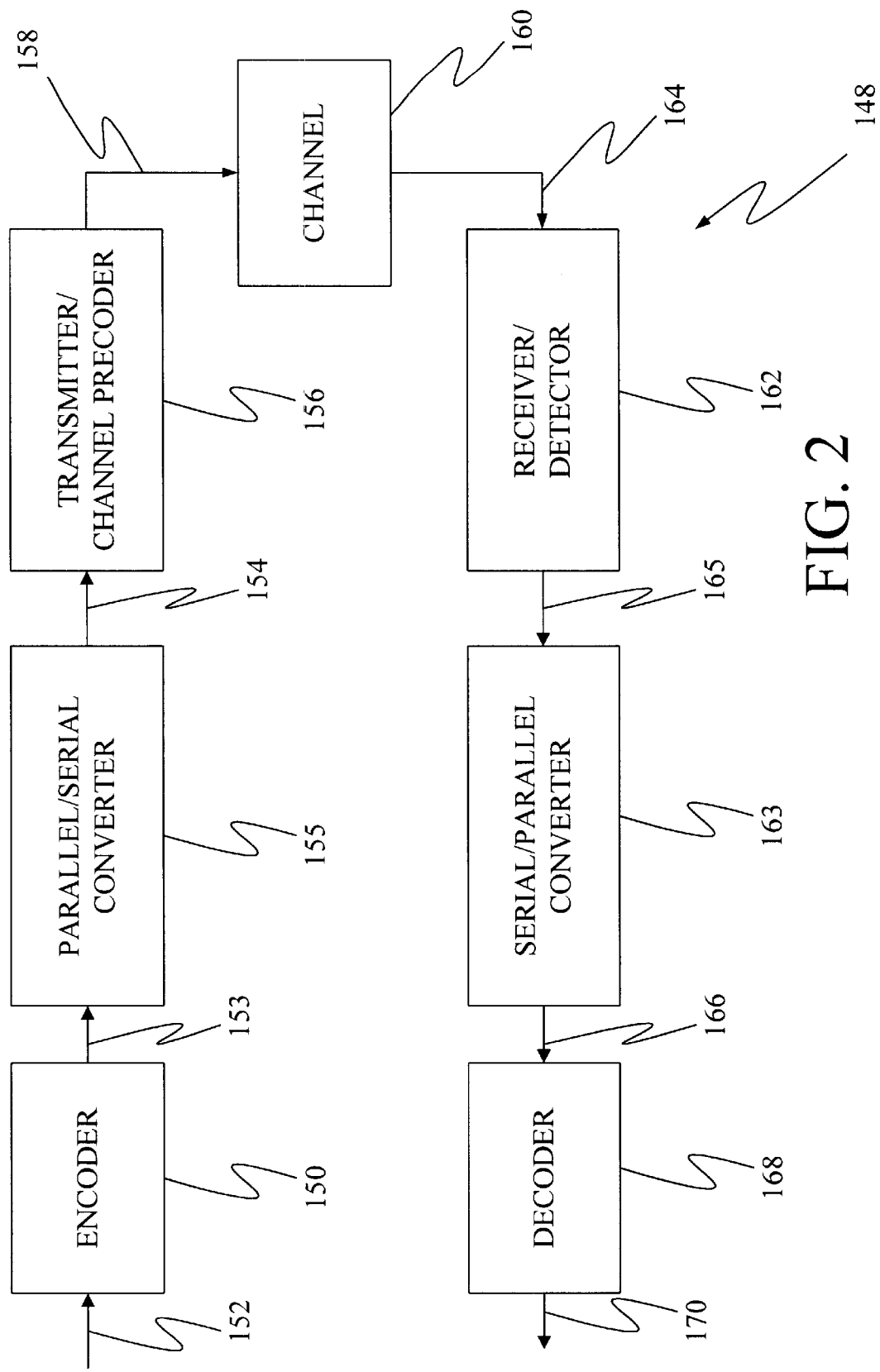
FIG. 2 is a block diagram of a read channel.

FIG. 2 is a block diagram of a generalized communication system 148 used with the present invention. For the disc drive of FIG. 1, communication system 148 is formed by head 110, disc 106, and internal logic in electronics 130. Within communication system 148, an encoder 150 receives data samples 152 and produces codewords 153. Codewords 153 are provided to parallel-to-serial converter 155 in a parallel manner such that all of the bits of a respective codeword are provided to converter 155 at the same time. Parallel-to-serial converter 155 converts each parallel codeword 153 into a serial representation and concatenates the serial representations to produce a sequence of bits 154. The sequence of bits 154 meets several constraints discussed further below.

Transmitter/channel precoder 156 receives the sequence of bits 154 and conditions the sequence so that it is optimized for the type of detector used to recover the signal from the channel. Transmitter/channel precoder 156 produces write signal 158, which is provided to channel 160.

Channel 160, which is comprised of a write head, a disc, and a read head when the communication system is a disc drive, conveys the encoded information from transmitter/ precoder 156 to receiver/detector 162 as a read signal 164. Receiver/detector 162 amplifies and filters read signal 164 and recovers an encoded signal from the read signal using one of several known detection methods. For instance, receiver/detector 162 may use a Viterbi detector, Decision Feedback Equalization (DFE), Fixed-Delay Tree Search with Decision Feedback (FDTS/DF) or Reduced State Sequence detection (RSSE).

After detecting and amplifying the signal from channel 160, receiver/detector 162 produces a recovered sequence of bits 165, which are provided to serial-to-parallel converter 163. Sequence of bits 165 is in a serial format at the input to serial-to-parallel converter 163. Serial-to-parallel converter 163 groups the bits into codewords and converts the codewords from a serial format to a parallel format. Serial-to-parallel converter 163 then outputs codewords 166 in a parallel format to decoder 168. Decoder 168 uses the inverse of the coding rules used by encoder 150 and converts the codewords 166 into recovered data stream 170.

The present invention provides an improved encoder and decoder that make it possible to encode large data words into large codewords while maintaining a rate of n/n+1, where n is the number of bits in the input data word. In addition, the present invention divides the task of encoding such that parallel encoders may be used or a single encoder may be used repeatedly to encode a single data word. The present invention allows for these benefits by performing an initial remapping of the data word from n bits to a collection of smaller data word segments that together have n+1 bits. Each data word segment is encoded to achieve the desired RLL constraints and the resulting codeword segments are then combined to form a single codeword of n+1 bits.

The encoding that is performed converts data segments with (n+1)/x bits into the codeword segments with (n+1)/x bits, where x is the number of segments. Because there are an equal number of bits on each side of the encoder, the data segments at the input to the encoder must be limited to only a subset of their possible values. Thus, the mapping of the data word into data segments is performed such that the data segments can only have a limited number of values. Under preferred embodiments, each of the data segments is limited to the same set of values so that the same segment block encoder may be used to encode each data segment.

The present inventors have found that the number of allowed values for each data segment when taken to the power of x, where x is the number of data segments, should be greater than but as close as possible to ½ the number of possible values for the n+1 bit codewords. The combination of the data segments must have at least ½ the values of the n+1 bit codewords so that they can represent each of the n data words. However, the number of possible values for the data segments should be as close to ½ as possible so as to maximize the number of extra codewords, thereby allowing greater flexibility in encoding the data segments to meet the RLL constraints.

Figure 3:
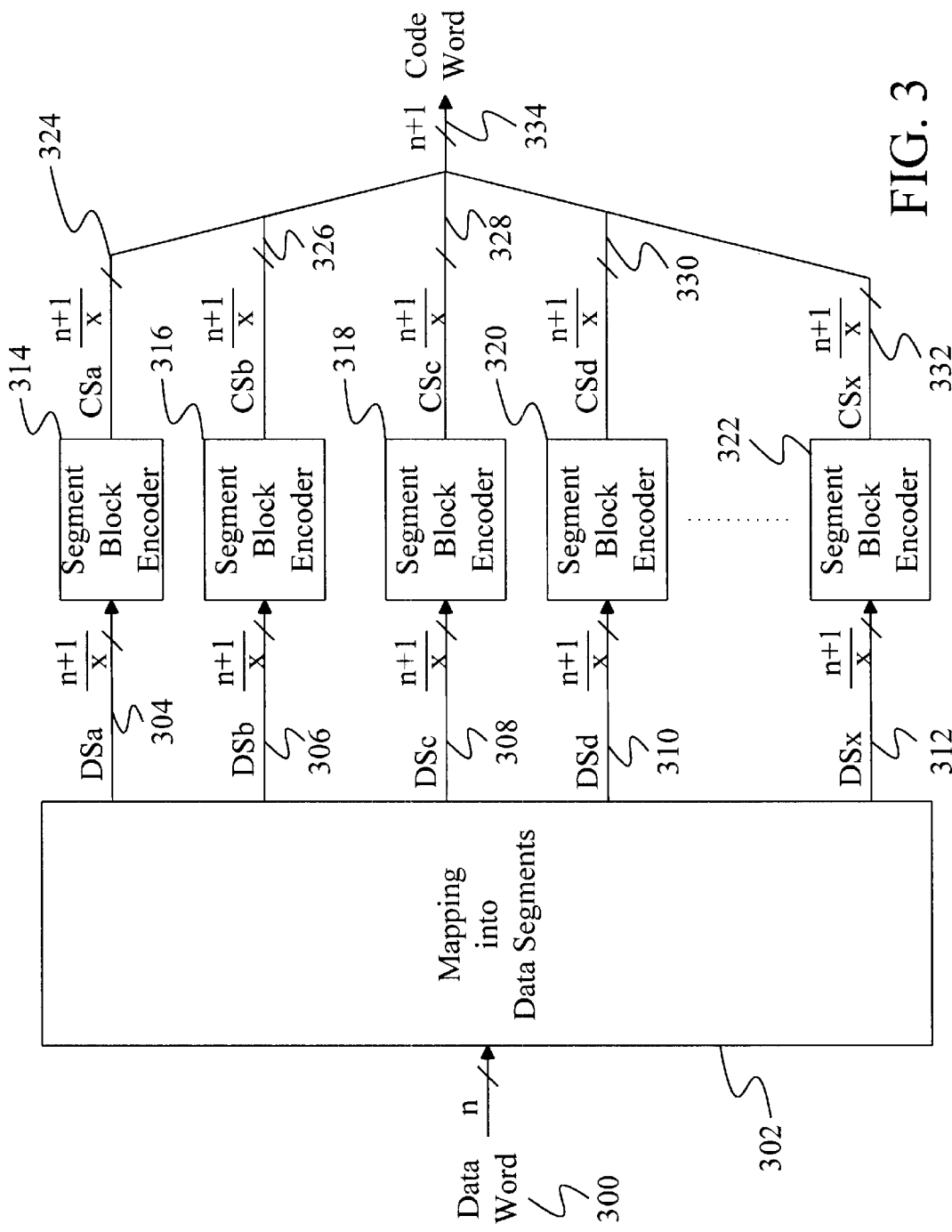
FIG. 3 is a block diagram of a parallel encoder under one embodiment of the present invention.

FIG. 3 provides a general block diagram of a parallel encoder under one embodiment of the present invention. In FIG. 3, a data word 300 having n bits is provided to a mapping unit 302. Mapping unit 302 maps the data word into a collection of x data segments, which are represented in FIG. 3 by data segments 304, 306, 308, 310 and 312 (also designated as DSA, DSB, DSC, DSD, and DSX). Each of the data segments has (n+1)/x bits.

Each data segment is provided to a segment block encoder such as block encoders 314, 316, 318, 320 and 322. Each segment block encoder converts the data segment into a codeword segment, which also has (n+1)/x bits. In FIG. 3, this results in codeword segments 324, 326, 328, 330, and 332, which are concatenated to form a codeword 334 having n+1 bits.

Each segment block encoder is capable of enforcing a required RLL constraint. In addition, the encoders can maintain a minimum Hamming weight, which is a minimum number of ones in each codeword segment. As mentioned above, in preferred embodiments, each segment block encoder is identical to the other segment block encoders. This simplifies the design and manufacturing of the complete encoder.

Figure 4:
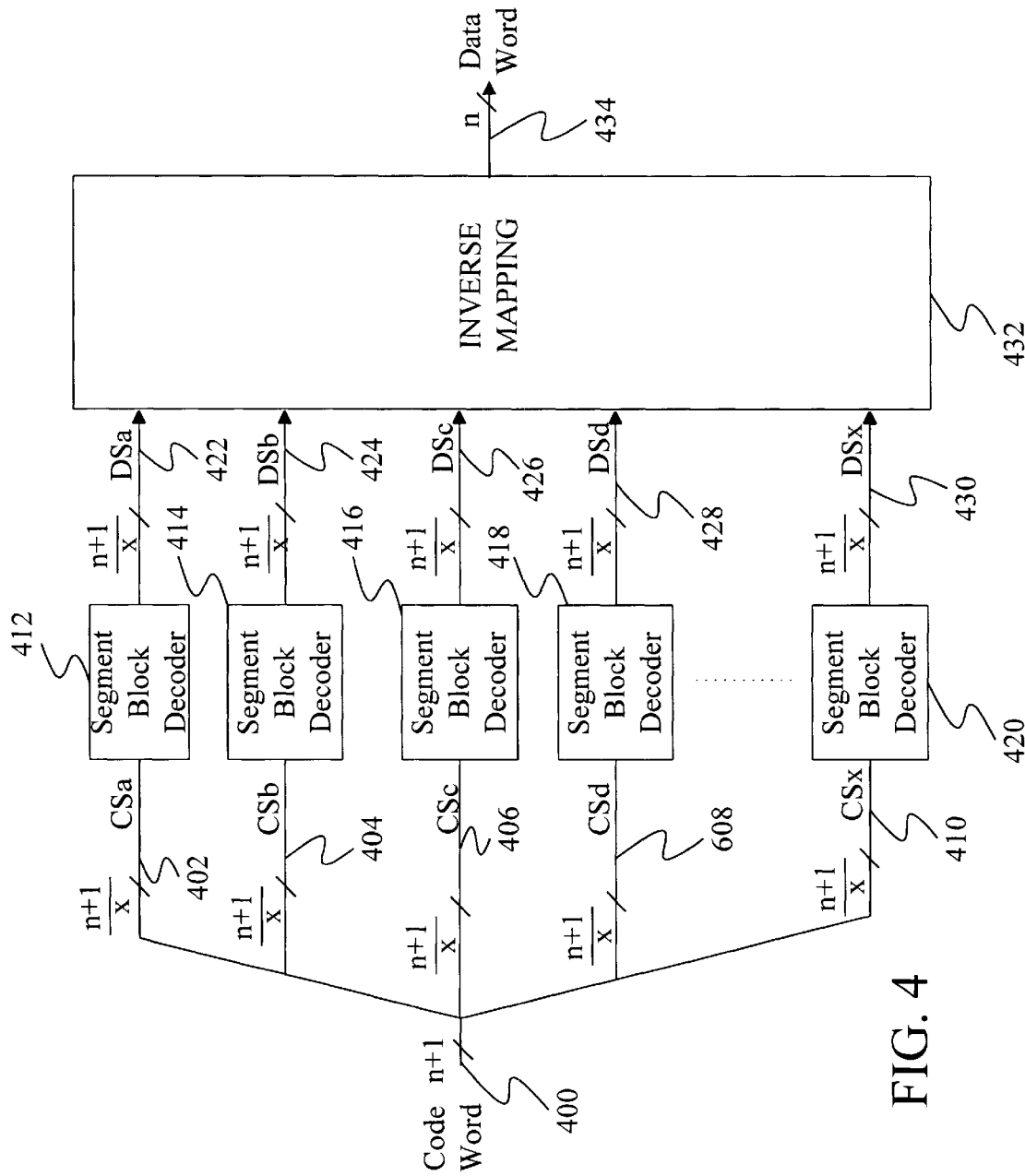
FIG. 4 is a block diagram of a parallel decoder under one embodiment of the present invention.

FIG. 4 provides a block diagram of a parallel decoder under one embodiment of the present invention. In FIG. 4, a codeword 400 with n+1 bits is divided into x code segments each having (n+1)/x bits. These code segments are represented by segments 402, 404, 406, 408 and 410 in FIG. 4.

Each code segment is provided to a segment block decoder such as segment block decoders 412,,414, 416, 418, and 420 of FIG. 4. These segment block decoders decode the code segments into data segments such as data segments 422, 424, 426, 428 and 430. The segment block decoders perform the inverse coding function of the encoders shown in FIG. 3.

The decoded data segments are then provided to an inverse mapping unit 432, which provides an inverse of the mapping function of mapping unit 302 of FIG. 3. The results of the inverse mapping is an n-bit data word 434.

Figure 5:
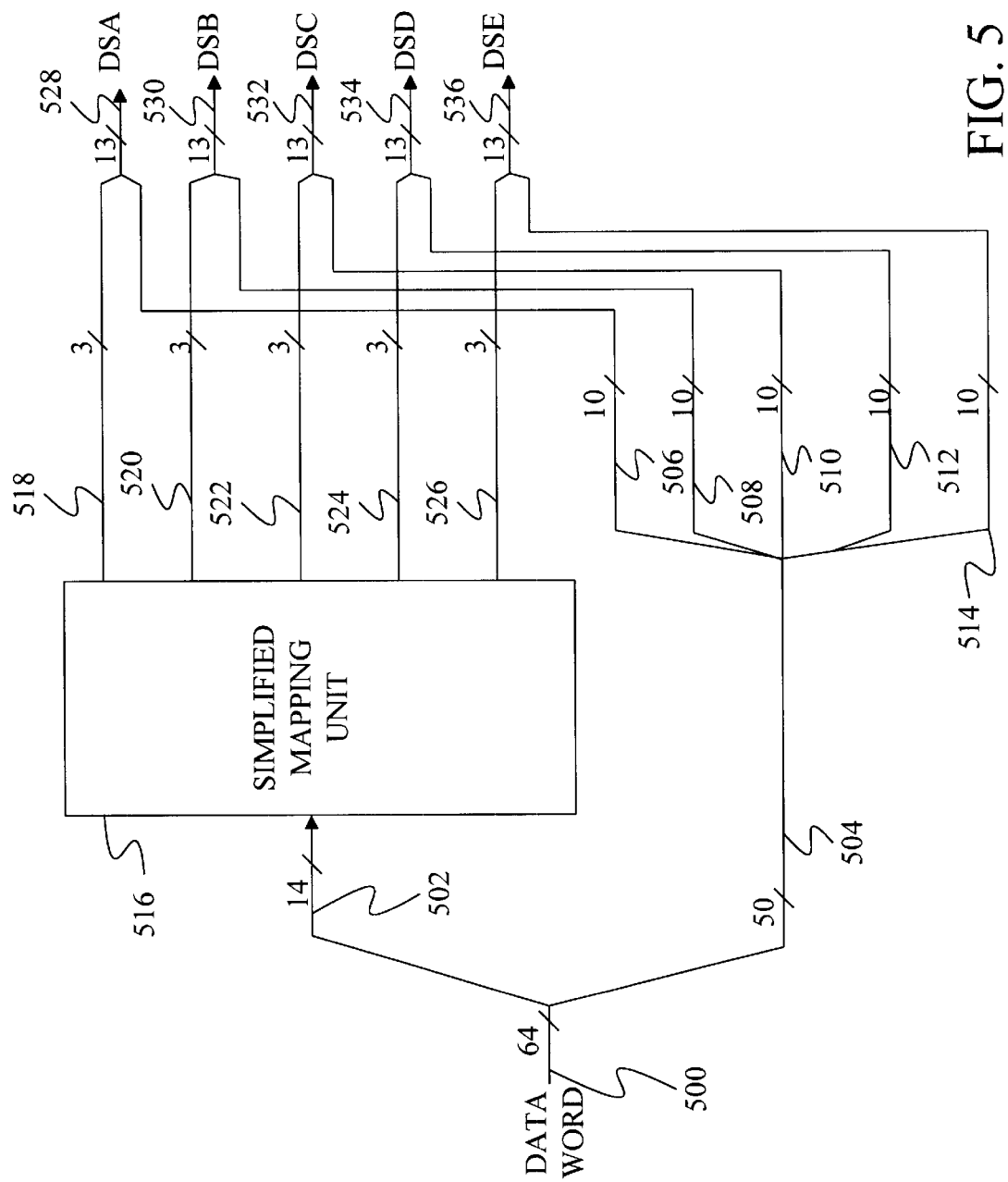
FIG. 5 is a more detailed block diagram of one embodiment of mapping unit 302 of FIG. 3.

FIG. 5 provides one embodiment of mapping unit 302 of FIG. 3 for mapping the data word into data segments. In the embodiment of FIG. 5, a 64-bit data word is mapped into five 13-bit data segments. In FIG. 5, the 64-bit data word 500 is first divided into a 14-bit word 502 and a 50-bit word 504. Note that all 64 bits of data word 500 do not have to be present at the same time. Instead, the bits of the data word can appear serially. Also note that no particular set of the 64 bits must be divided to form 14-bit word 502 or 50-bit word 504 as long as the selection is consistently made for each 64-bit data word.

Fifty-bit word 504 is divided into five 10-bit words 506, 508, 510, 512, and 514. As with the 64-bit word, 50-bit word 504 does not need to have all of its bits present at the same time. Instead, the bits may appear serially and may be assigned to the 10-bit words as they appear.

Fourteen-bit word 502 is provided to a simplified mapping unit 516 when all 14 bits are present. Simplified mapping unit 516 maps the 14 bits into five 3-bit segments 518, 520, 522, 524, and 526. In performing the mapping, simplified mapping unit 516 limits each of the output 3-bit segments to a subset of the eight possible values for a 3-bit segment. For example, under one particular embodiment, simplified mapping unit 516 limits each 3-bit segment to seven of the eight possible values. In the embodiment of FIG. 5, any seven of the eight valid values may be used, although under some embodiments of the present invention a particular value is excluded from the set of valid values to achieve a coding benefit as described further below.

Each 3-bit segment is then concatenated with a respective 10-bit segment to form the 13-bit data segment. Thus, 3-bit segment 518 is concatenated with the 10-bit 506 to form 13-bit data segment 528. Similar concatenations result in 13-bit segments 530, 532, 534, and 536.

One method for performing the simplified mapping in simplified mapping unit 516 is to convert 14-bit value 502 into a base seven representation of the that value where each 3-bit segment represents a base seven digit. By converting the 14-bit input into a 15-bit base seven representation of that 14-bit value, the mapping ensures that each of the 3-bit digits will be limited to seven of eight values. In its simplest form, this mapping would exclude the value 111, which equals 8, from each of the 3-bit values. In other embodiments, after the base seven conversion, a different value is substituted for the 111 value as the invalid value. To perform this swap, any values that take on the newly designated invalid value are given the value of 111.

In other embodiments, the mapping from a 14-bit word to five 3-bit words is performed based on the strategy of mapping data bits directly to intermediate bits if the data words do not include three ones. Thus, for 14 bits of data (W13, W12, W11, W10, W9, W8, W7, W6, W5, W4, W3, W2, W1, W0) the five groups of output bits (I14, I13, I12) (I11, I10, I9) (I8, I7, I6)(I5, I4, I3) and (I2, I1, I0) are formed using the following mapping:

TABLE 1

| W14 | W13 | W12 | W11 | W10 | W9 | W8 | W7 | W6 | W5 | W4 | W3 | W2 | W1 | W0 |
|---|---|---|---|---|---|---|---|---|---|---|---|---|---|---|
| 0 | I13 | I12 | I11 | I10 | I9 | I8 | I7 | I6 | I5 | I4 | I3 | I2 | I1 | I0 |

Thus, if none of the four groups (W11, W10, W9) (W8, W7, W6) (W5, W4, W3) or (W2, W1, W0) contain "111" the 14-bit data word can be mapped to the 15-bit codeword using table 1 above. If, however, one of these four groups contains "111" a valid value must be used in place of the invalid value. This mapping is defined through logical equations as follows:

G4=I13&I12

G3=I11&I10&I9

G2=I8&I7&I6

G1=I5&I4&I3

G0=I2&I1&I0

HH=!G3&!G2&!G1&!G0

H0=!G3&!G2&!G1&G0

H1=!G3&!G2&G1&!G0

H2=!G3&G2&!G1&!G0

H3=G3&!G2&!G1&!G0

H01=!G3&!G2&G1&G0

H02=!G3&G2&!G1&G0

H03=G3&!G2&!G1&G0

H12=!G3&G2&G1&!G0

H13=G3&!G2&G1&!G0

H23=G3&G2&!G1&!G0

H012=!G3&G2&G1&G0

H013=G3&!G2&G1&G0

H023=G3&G2&!G1&G0

H123=G3&G2&G1&!G0

H0123=G3&G2&G1&G0

JK=!HH

JJ=(JK&!G4)

KK=(JK&G4)

T2=(!H0&!H1&!H2&!H3)

T3=H012|H013|H023|H123|H0123

J6d9=(H0|H1|H2)

J3d9=(H01|H02|H12)

J3d6=(H0|H1|H03|H13)

J3d3=(H2|H3|H23)

J0d6=(H01|H013)

J0d3=(H0|H02|H03|H023)

J0d0=(H1|H2|H3|H12|H13|H23|H123)

J11=T2

J10=(H2|H3)

J9=(H1|H3)

J8=(I11&J6d9)|(I8 &H3)|H13|H23| T3

J7=(I10&J6d9)|(I7 &H3)|H03|H12| T3

J6=(I9 &J6d9)|(I6 &H3)|H02|H12|H23

J5=(I11&J3d9)|(I8 &J3d6)|(I5 &J3d3)|H0123

J4=(I10&J3d9)|(I7 &J3d6)|(I4 &J3d3)|H012|H013

J3=(I9 &J3d9)|(I6 &J3d6)|(I3 &J3d3)|H012|H023

J2=(I11&H012)|(I8 &J0d6)|(I5 &J0d3)|(I2 &J0d0)

J1=(I10&H012)|(I7 &J0d6)|(I4 &J0d3))|(I1 &J0d0)

J0=(I9 &H012)|(I6 &J0d6)|(I3 &J0d3)|(I0 &J0d0)

W14=JK

W13=(I13&(HH|JJ))|(KK&T2)

W12=(I12&(HH|JJ))|(KK&(H2|H3))

W11=(I11&HH)|(J11&JJ)|(KK)

W10=(I10&HH)|(J10&JJ)|(KK&(H1|H3))

W9=(I9 &HH)|(J9 &JJ)|(KK&(H0|H2|T2))

W8=(I8 &HH)|(J8 &JK)

W7=(I7 &HH)|(J7 &JK)

W6=(I6 &HH)|(J6 &JK)

W5=(I5 &HH)|(J5 &JK)

W4=(I4 &HH)|(J4 &JK)

W3=(I3 &HH)|(J3 &JK)

W2=(I2 &HH)|(J2 &JK)

W1=(I1 &HH)|(J1 &JK)

W0=(I0 &HH)|(J0 &JK)

Where "&" indicates a logical AND operation, "|" indicates a logical OR operation, and "!" indicates a logical NOT operation.

The mapping defined by the logical equations above is described by two tables. Each table is associated with a value for the group (D13, D12). If this group has a value that is not equal to "11" then the mapping is described by table 2 below as:

TABLE 2

| C14 | C13 | C12 | C11 | C10 | C9 | C8 | C7 | C6 | C5 | C4 | C3 | C2 | C1 | C0 |
|---|---|---|---|---|---|---|---|---|---|---|---|---|---|---|
| 1 | D13 | D12 | 0 | 0 | 0 | D11 | D10 | D9 | D8 | D7 | D6 | D5 | D4 | D3 |
| 1 | D13 | D12 | 0 | 0 | 1 | D11 | D10 | D9 | D8 | D7 | D6 | D2 | D1 | D0 |
| 1 | D13 | D12 | 0 | 1 | 0 | D11 | D10 | D9 | D5 | D4 | D3 | D2 | D1 | D0 |
| 1 | D13 | D12 | 0 | 1 | 1 | D8 | D7 | D6 | D5 | D4 | D3 | D2 | D1 | D0 |
| 1 | D13 | D12 | 1 | 0 | 0 | 0 | 0 | 0 | D11 | D10 | D9 | D8 | D7 | D6 |
| 1 | D13 | D12 | 1 | 0 | 0 | 0 | 0 | 1 | D11 | D10 | D9 | D5 | D4 | D3 |
| 1 | D13 | D12 | 1 | 0 | 0 | 0 | 1 | 0 | D8 | D7 | D6 | D5 | D4 | D3 |
| 1 | D13 | D12 | 1 | 0 | 0 | 0 | 1 | 1 | D11 | D10 | D9 | D2 | D1 | D0 |
| 1 | D13 | D12 | 1 | 0 | 0 | 1 | 0 | 0 | D8 | D7 | D6 | D2 | D1 | D0 |
| 1 | D13 | D12 | 1 | 0 | 0 | 1 | 0 | 1 | D5 | D4 | D3 | D2 | D1 | D0 |
| 1 | D13 | D12 | 1 | 0 | 0 | 1 | 1 | 0 | 0 | 1 | 1 | D11 | D10 | D9 |
| 1 | D13 | D12 | 1 | 0 | 0 | 1 | 1 | 0 | 0 | 1 | 0 | D8 | D7 | D6 |
| 1 | D13 | D12 | 1 | 0 | 0 | 1 | 1 | 0 | 0 | 0 | 1 | D5 | D4 | D3 |
| 1 | D13 | D12 | 1 | 0 | 0 | 1 | 1 | 0 | 0 | 0 | 0 | D2 | D1 | D0 |
| 1 | D13 | D12 | 1 | 0 | 0 | 1 | 1 | 0 | 1 | 0 | 0 | 0 | 0 | 0 |

If grouping (D13, D12) is equal to "11", then the mapping is:

TABLE 3

| C14 | C13 | C12 | C11 | C10 | C9 | C8 | C7 | C6 | C5 | C4 | C3 | C2 | C1 | C0 |
|---|---|---|---|---|---|---|---|---|---|---|---|---|---|---|
| 1 | 0 | 0 | 1 | 0 | 1 | D11 | D10 | D9 | D8 | D7 | D6 | D5 | D4 | D3 |
| 1 | 0 | 0 | 1 | 1 | 0 | D11 | D10 | D9 | D8 | D7 | D6 | D2 | D1 | D0 |
| 1 | 0 | 1 | 1 | 0 | 1 | D11 | D10 | D9 | D5 | D4 | D3 | D2 | D1 | D0 |
| 1 | 0 | 1 | 1 | 1 | 0 | D8 | D7 | D6 | D5 | D4 | D3 | D2 | D1 | D0 |
| 1 | 1 | 0 | 1 | 0 | 1 | 0 | 0 | 0 | D11 | D10 | D9 | D8 | D7 | D6 |
| 1 | 1 | 0 | 1 | 0 | 1 | 0 | 0 | 1 | D11 | D10 | D9 | D5 | D4 | D3 |
| 1 | 1 | 0 | 1 | 0 | 1 | 0 | 1 | 0 | D8 | D7 | D6 | D5 | D4 | D3 |
| 1 | 1 | 0 | 1 | 0 | 1 | 0 | 1 | 1 | D11 | D10 | D9 | D2 | D1 | D0 |
| 1 | 1 | 0 | 1 | 0 | 1 | 1 | 0 | 0 | D8 | D7 | D6 | D2 | D1 | D0 |
| 1 | 1 | 0 | 1 | 0 | 1 | 1 | 0 | 1 | D5 | D4 | D3 | D2 | D1 | D0 |
| 1 | 1 | 0 | 1 | 0 | 1 | 1 | 1 | 0 | 0 | 1 | 1 | D11 | D10 | D9 |
| 1 | 1 | 0 | 1 | 0 | 1 | 1 | 1 | 0 | 0 | 1 | 0 | D8 | D7 | D6 |
| 1 | 1 | 0 | 1 | 0 | 1 | 1 | 1 | 0 | 0 | 0 | 1 | D5 | D4 | D3 |
| 1 | 1 | 0 | 1 | 0 | 1 | 1 | 1 | 0 | 0 | 0 | 0 | D2 | D1 | D0 |
| 1 | 1 | 0 | 1 | 0 | 1 | 1 | 1 | 0 | 1 | 0 | 0 | 0 | 0 | 0 |

Figure 6:
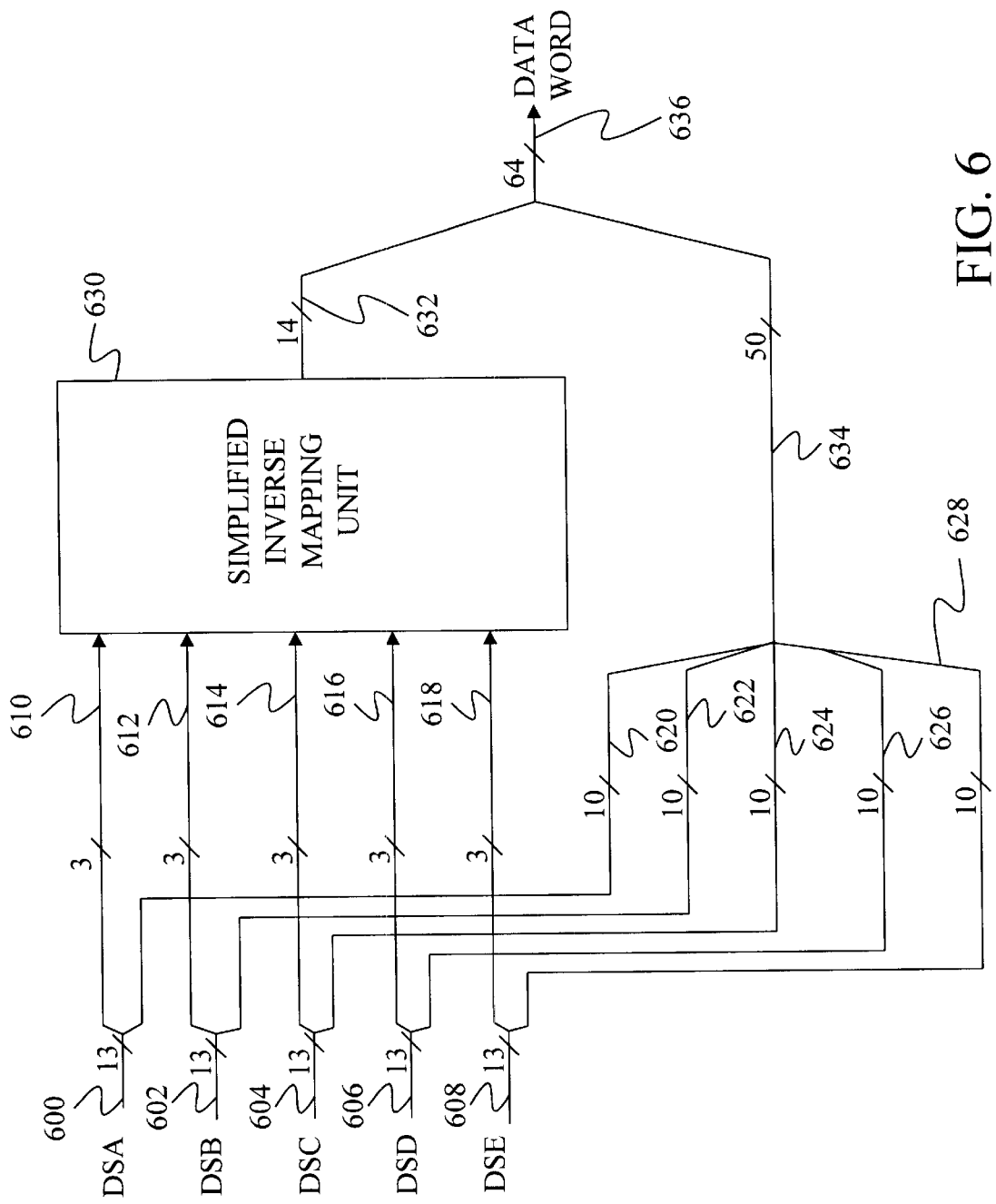
FIG. 6 is a block diagram of one embodiment of inverse mapping unit 432 of FIG. 4.

FIG. 6 provides a block diagram of one embodiment of inverse mapping unit 430 of FIG. 4. In FIG. 6, five data segments 600, 602, 604, 606, and 608 that each have 13 bits are received from the segment decoders of FIG. 4. Each data segment has its first three bits separated from its remaining 10 bits to produce 3-bit segments 610, 612, 614, 616, and 618 and 10-bit segments 620, 622, 624, 626, and 628.

Three-bit segments 610, 612, 614, 616, and 618 are provided to a simplified inverse mapping unit 630 which maps the 15 bits into a 14-bit portion 632 of the data word. This inverse mapping is the inverse of the mapping performed by simplified mapping unit 516 of FIG. 5.

Ten-bit segments 620, 622, 624, 626 and 628 are combined to form a 50-bit portion 634. Fourteen-bit portion 632 is then combined with 50-bit portion 634 to form 64-bit data word 636. During the combination, the bits of 14-bit portion 632 and 50-bit portion 634 are assigned bit locations in the 64-bit word based on an inverse of the mapping used in FIG. 5 to divide the data word into a 14-bit portion and a 50-bit portion. The resulting bits of the 64-bit data word may be produced in a parallel manner or serially.

The operation of one embodiment of inverse mapping unit 630 is described below with logical equations where the 15-bit input to inverse mapping unit 630 is represented by W14–W0 and the 14-bit output is represented by I13–I0. This mapping represents the inverse of the mapping unit described above by tables 2 and 3. The logical equations describing the inverse mapping are:

HH=!W14

JK=W14

JJ=(!W11|(!W10&!W9))&JK

KK=!JJ&JK

H0=(!W11&!W10&!W9&JJ)|(!W13&!W12& W11&!W10& W9&KK)

H1=(!W11&!W10& W9&JJ)|(!W13&!W12& W11& W10&!W9&KK)

H2=(!W11& W10&!W9&JJ)|(!W13&W12& W11&!W10& W9&KK)

H3=(!W11& W10& W9&JJ)|(!W13& W12& W11& W10&!W9&KK)

T2=(W11&!W10&!W9&JJ)|(W13&!W12& W11&!W10& W9&KK)

H01=!W8&!W7&!W6&T2

H02=!W8&!W7& W6&T2

H03=!W8& W7&!W6&T2

H12=!W8& W7& W6&T2

H13=W8&!W7&!W6&T2

H23=W8&!W7& W6&T2

T3=W8& W7&!W6&T2

H012=!W5& W4& W3&T3

H013=!W5& W4&!W3&T3

H023=!W5&!W4& W3&T3

H123=!W5&!W4&!W3&T3

H0123=W5&!W4&!W3&T3

J9c6=(H0|H1|H2)

J9c3=(H01|H02|H12)

J9c0=H012

J9ca=(H3|H03|H13|H23|H123|H023|H013|H0123)

J6c6=H3

J6c3=(H0|H1|H03|H13)

J6c0=(H01|H013)

J6ca=(H2|H02|H12|H23|H123|H023|H012|H0123)

J3c3=(H2|H3|H23)

J3c0=(H0|H02|H03|H023)

J3ca=(H1|H01|H12|H13|H123|H013|H012|H0123)

J0c0=(H1|H2|H3|H12|H13|H23|H123)

J0ca=(H0|H01|H02|H03|H023|H013|H012|H0123)

J11=(W8 &J9c6)|(W5 &J9c3)|(W2 &J9c0)|J9ca

J10=(W7 &J9c6)|(W4 &J9c3)|(W1 &J9c0)|J9ca

J9=(W6 &J9c6)|(W3 &J9c3)|(W0 &J9c0)|J9ca

J8=(W8 &J6c6)|(W5 &J6c3)|(W2 &J6c0)|J6ca

J7=(W7 &J6c6)|(W4 &J6c3)|(W1 &J6c0)|J6ca

J6=(W6 &J6c6)|(W3 &J6c3)|(W0 &J6cO)|J6ca

J5=(W5 &J3c3)|(W2&J3c0)|J3ca

J4=(W4 &J3c3)|(W1&J3c0)|J3ca

J3=(W3 &J3c3)|(W0&J3c0)|J3ca

J2=(W2 &J0c0)|J0ca

J1=(W1 &J0c0)|J0ca

J0=(W0 &J0c0)|J0ca

I13=(W13&(HH|JJ))|(KK)

I12=(W12&(HH|JJ))|(KK)

I11=(W11&HH)|(J11&JK)

I10=(W10&HH)|(J10&JK)

I9=(W9 &HH)|(J9 &JK)

I8=(W8 &HH)|(J8 &JK)

I7=(W7 &HH)|(J7 &JK)

I6=(W6 &HH)|(J6 &JK)

I5=(W5 &HH)|(J5 &JK)

I4=(W4 &HH)|(J4 &JK)

I3=(W3 &HH)|(J3 &JK)

I2=(W2 &HH)|(J2 &JK)

I1=(W1 &HH)|(J1 &JK)

I0=(W0 &HH)|(J0 &JK)

The segment block encoder may be used to enforce any number of desired RLL constraints and Hamming weights. The k constraint for a RLL code can be determined as:

$$k = \max(k_b + k_e, k_m)$$

where $k_b$ equals the maximum run of zeros at the beginning of the code segment; $k_m$ equals the maximum run of zeros at the middle of the code segment; and $k_e$ equals the maximum run of zeros at the end of the code segment.

Table 4 below shows the number of 13-bit code segment values available for a number of different k constraints and Hamming weights.

TABLE 4

| k | $k_b$ | $k_m$ | $k_e$ | Hamming Weight | Number of 13 bit Code Segment values available |
|---|---|---|---|---|---|
| 6 | 3 | 6 | 3 | 2 | 7073 |
| 7 | 4 | 6 | 3 | 4 | 7196 |
| 7 | 4 | 6 | 3 | 3 | 7306 |
| 8 | 4 | 7 | 4 | 4 | 7251 |
| 7 | 4 | 7 | 3 | 3 | 7381 |

In order to provide a 1-to-1 mapping, the constraints must allow for at least 7,168 code values. Thus, from Table 4, it can be seen that all of the constraints except the constraints in the first row may be applied to a segment block encoder under the present invention.

Under one embodiment of the present invention, a code is implemented that has a (0,7) RLL constraint with km equal to 6 and a minimum Hamming weight of 4. For this particular encoder, a simplified mapping unit is assumed that sets the first three bits of the 13-bit word using a base 7 conversion as discussed above. This base 7 conversion eliminates the value of "000" for each 3-bit segment. Thus, in a 13-bit pattern constructed of $(I_{12}, I_{11}, I_{10}, I_9, I_8, I_7, I_6, I_5, I_4, I_3, I_2, I_1, I_0)$ the string $(I_{12}, I_{11}, I_{10})$ cannot equal "000". Given this simplified mapping, the input values are then converted into an output string $O_{12}$–$O_0$ according to table 5 below:

TABLE 5

| | | | | | | | | | | | | | | | | | | | | | |
|---|---|---|---|---|---|---|---|---|---|---|---|---|---|---|---|---|---|---|---|---|---|
| $I_{12}$ | D | 0 | 0 | 0 | 0 | 0 | 0 | 0 | 0 | 0 | 1 | 1 | 1 | 1 | 1 | 1 | 1 | 1 | 1 | 1 | 1 |
| $I_{11}$ | C | 0 | !0 | !0 | !0 | φ | 1 | !0 | !0 | !0 | 0 | 0 | 0 | 0 | 0 | !0 | !0 | φ | φ | !0 | !0 |
| $I_{10}$ | | 0 | | | | | 1 | 0 | | | 0 | 0 | 0 | 0 | 0 | | | φ | φ | | |
| $I_9$ | | | φ | φ | 0 | !0 | !0 | !0 | 0 | φ | φ | 0 | 0 | 0 | 0 | 0 | | 0 | !0 | !0 | |
| $I_8$ | | | φ | φ | 0 | | | | | φ | φ | 0 | 0 | 0 | 0 | 0 | | 0 | | | |
| $I_7$ | B | | φ | 0 | 0 | 0 | 0 | 0 | 0 | !0 | !0 | 0 | 0 | !0 | 0 | !0 | 0 | 0 | 0 | 0 | !0 | !0 |
| $I_6$ | | | φ | 0 | 0 | 0 | 0 | 0 | 0 | | | 0 | 0 | | 0 | | 0 | 0 | 0 | 0 | | |
| $I_5$ | | | φ | 0 | 0 | 0 | 0 | 0 | 0 | | | 0 | 0 | | !0 | φ | 0 | 0 | 0 | 0 | | |
| $I_4$ | | | φ | 0 | 0 | 0 | 0 | 0 | 0 | | | 0 | 0 | | | φ | 0 | 0 | 0 | 0 | | |
| $I_3$ | A | | φ | 0 | !0 | 0 | 0 | 0 | !0 | 0 | !0 | 0 | !0 | 0 | !0 | !0 | 0 | !0 | 0 | !0 | 0 | !0 |
| $I_2$ | | | φ | 0 | | 0 | 0 | 0 | | 0 | | 0 | | 0 | | | 0 | | 0 | | 0 | |
| $I_1$ | | | φ | 0 | | φ | 1 | 1 | φ | 0 | | 0 | | 0 | | | 0 | | !0 | φ | 0 | |
| $I_0$ | | | φ | 0 | | 1 | 0 | 0 | φ | 0 | | 0 | | 0 | | | 0 | | | φ | 0 | |
| $O_{12}$ | Z | | φ | 0 | 0 | 0 | 0 | 0 | 0 | 0 | 0 | 0 | 0 | 0 | 1 | 0 | 0 | 1 | 0 | 1 |
| $O_{11}$ | Y | | φ | 0 | 0 | 0 | 0 | 0 | C | 0 | C | 0 | 0 | 0 | 0 | C | 0 | 0 | 0 | C | 0 | C |
| $O_{10}$ | | | φ | 0 | 0 | 0 | 0 | 0 | | 0 | | 0 | 0 | 0 | 0 | | 0 | 0 | 0 | | 0 | |
| $O_9$ | | | φ | 1 | 1 | 1 | 1 | 1 | | 1 | | 1 | 1 | 1 | 1 | | 1 | 1 | 1 | | 0 | |
| $O_8$ | | | φ | 0 | 1 | 1 | 1 | 1 | | 0 | | 0 | 1 | 0 | 1 | | 0 | 1 | 1 | | 1 | |
| $O_7$ | X | | φ | C | C | 1 | 1 | 1 | B | B | B | 0 | 1 | B | B | B | C | 0 | 1 | B | B | B |
| $O_6$ | | | φ | | 0 | 0 | 0 | | | | | 0 | 0 | | | | | 1 | 1 | | | |
| $O_5$ | | | φ | | | $A_1$ | $C_3$ | 0 | | | | 1 | 1 | | | | | $C_3$ | $A_1$ | | | |
| $O_4$ | | | φ | | | $A_0$ | $C_2$ | 1 | | | | 1 | 0 | | | | | $C_2$ | $A_0$ | | | |
| $O_3$ | W | | φ | 0 | A | C | 0 | $C_1$ | A | C | A | 0 | A | 0 | A | A | 0 | A | C | A | C | A |
| $O_2$ | | | φ | 0 | | | 0 | $C_0$ | | 0 | | 0 | | 0 | | | 0 | | | | | |
| $O_1$ | | | φ | 1 | | | $C_1$ | 0 | | 1 | | 0 | | 1 | | | | | | | | |
| $O_0$ | | | φ | 1 | | | $C_0$ | 0 | | 1 | | 1 | | 0 | | | | | | | | | where "!0" indicates that none of the values are equal to zero and φ indicates that the value of the bit does not matter.

Codewords encoded using the segment block encoding table of Table 5 can be decoded using table 6 below:

TABLE 6

| | | | | | | | | | | | | | | | | | |
|---|---|---|---|---|---|---|---|---|---|---|---|---|---|---|---|---|---|
| $I_{12}$ | Z | 0 | 0 | 0 | 0 | 0 | 0 | 0 | 0 | 0 | 0 | 0 | 0 | 0 | 0 | 0 | 1 |
| $I_{11}$ | Y | 0 | 0 | 0 | 0 | 0 | 0 | 0 | 0 | 0 | 0 | 0 | 0 | 0 | 0 | !0 | φ |
| $I_{10}$ | | 0 | 0 | 0 | 0 | 0 | 0 | 0 | 0 | 0 | 0 | 0 | 0 | 0 | | | φ |
| $I_9$ | | 0 | 1 | 1 | 1 | 1 | 1 | 1 | 1 | 1 | 1 | 1 | 1 | 1 | 1 | φ | φ |
| $I_8$ | | 1 | 0 | 0 | 0 | 0 | 0 | 1 | 1 | 1 | 1 | 1 | 1 | 1 | 1 | φ | φ |
| $I_7$ | X | φ | φ | φ | !0 | 0 | φ | 0 | 0 | 1 | !0 | 1 | 1 | 1 | 1 | φ | φ |

TABLE 6-continued

| | | | | | | | | | | | | | | | | | |
|---|---|---|---|---|---|---|---|---|---|---|---|---|---|---|---|---|---|
| $I_6$ | | φ | φ | φ | | 0 | φ | 0 | 1 | 1 | | 0 | 0 | 0 | 0 | φ | φ |
| $I_5$ | | φ | φ | φ | φ | 1 | φ | φ | !0 | !0 | 0 | φ | φ | 0 | 1 | φ | φ |
| $I_4$ | | φ | φ | φ | φ | 1 | φ | φ | | | 0 | 1 | 1 | 1 | 0 | φ | φ |
| $I_3$ | W | φ | 0 | 0 | 0 | 0 | !0 | φ | φ | φ | φ | 0 | !0 | !0 | φ | φ | φ |
| $I_2$ | | φ | 0 | 0 | 0 | 0 | | φ | φ | φ | φ | 0 | | | φ | φ | φ |
| $I_1$ | | φ | 0 | 1 | 1 | 1 | φ | φ | φ | φ | φ | φ | !0 | 0 | φ | φ | φ |
| $I_0$ | | φ | 1 | 0 | 1 | 1 | φ | φ | φ | φ | φ | φ | | 0 | φ | φ | φ |
| $O_{12}$ | D | 1 | 1 | 1 | 0 | 1 | 0 | 1 | 1 | 1 | 0 | 0 | 0 | 0 | 1 | 0 | 1 |
| $O_{11}$ | C | W | 0 | X | X | 0 | W | 0 | $X_1$ | W | X | $X_1$ | W | 1 | 0 | Y | Y |
| $O_{10}$ | | | 0 | | | 0 | | 0 | $X_0$ | | | $X_0$ | | 0 | 0 | | |
| $O_9$ | | | 0 | | | 0 | | 0 | 0 | | | $W_1$ | | $W_3$ | 0 | | |
| $O_8$ | | | 0 | | | 0 | | 0 | 0 | | | $W_0$ | | $W_2$ | 0 | | |
| $O_7$ | B | X | X | 0 | 0 | 0 | X | 0 | 0 | 0 | 0 | 0 | 0 | 0 | 0 | X | X |
| $O_6$ | | | | 0 | 0 | 0 | | 0 | 0 | 0 | 0 | 0 | 0 | 0 | 0 | | |
| $O_5$ | | | | 0 | 0 | 0 | | $X_1$ | 0 | 0 | 0 | 0 | 0 | 0 | 0 | | |
| $O_4$ | | | | 0 | 0 | 0 | | $X_0$ | 0 | 0 | 0 | 0 | 0 | 0 | 0 | | |
| $O_3$ | A | 0 | 0 | 0 | 0 | 0 | 0 | W | W | 0 | W | 0 | 0 | 0 | W | W | W |
| $O_2$ | | 0 | 0 | 0 | 0 | 0 | 0 | | 0 | | 0 | 0 | 0 | 0 | | | |
| $O_1$ | | 0 | 0 | 0 | 0 | 0 | 0 | | $X_1$ | | 1 | $X_1$ | 1 | | | | |
| $O_0$ | | 0 | 0 | 0 | 0 | 0 | 0 | | $X_0$ | | 0 | $X_0$ | 0 | | | | | where $I_{12}$–$I_0$ are the input values to the decoder and $O_{12}$–$O_0$ are the output decoded values from the decoder.

Note that the encoding of Table 5 is simplified because the simplified mapping unit has removed "000" as a possible value for the string ($I_{12}$, $I_{11}$, $I_{10}$). Because of this, many of the data words can be used directly as codewords because they do not violate the k constraint for the RLL code.

In alternative embodiments, the segment block encoder is formed to work in conjunction with the simplified mappings of Tables 2 and 3 above and the logic equations associated with those tables instead of the base 7 mapping.

Figure 7:
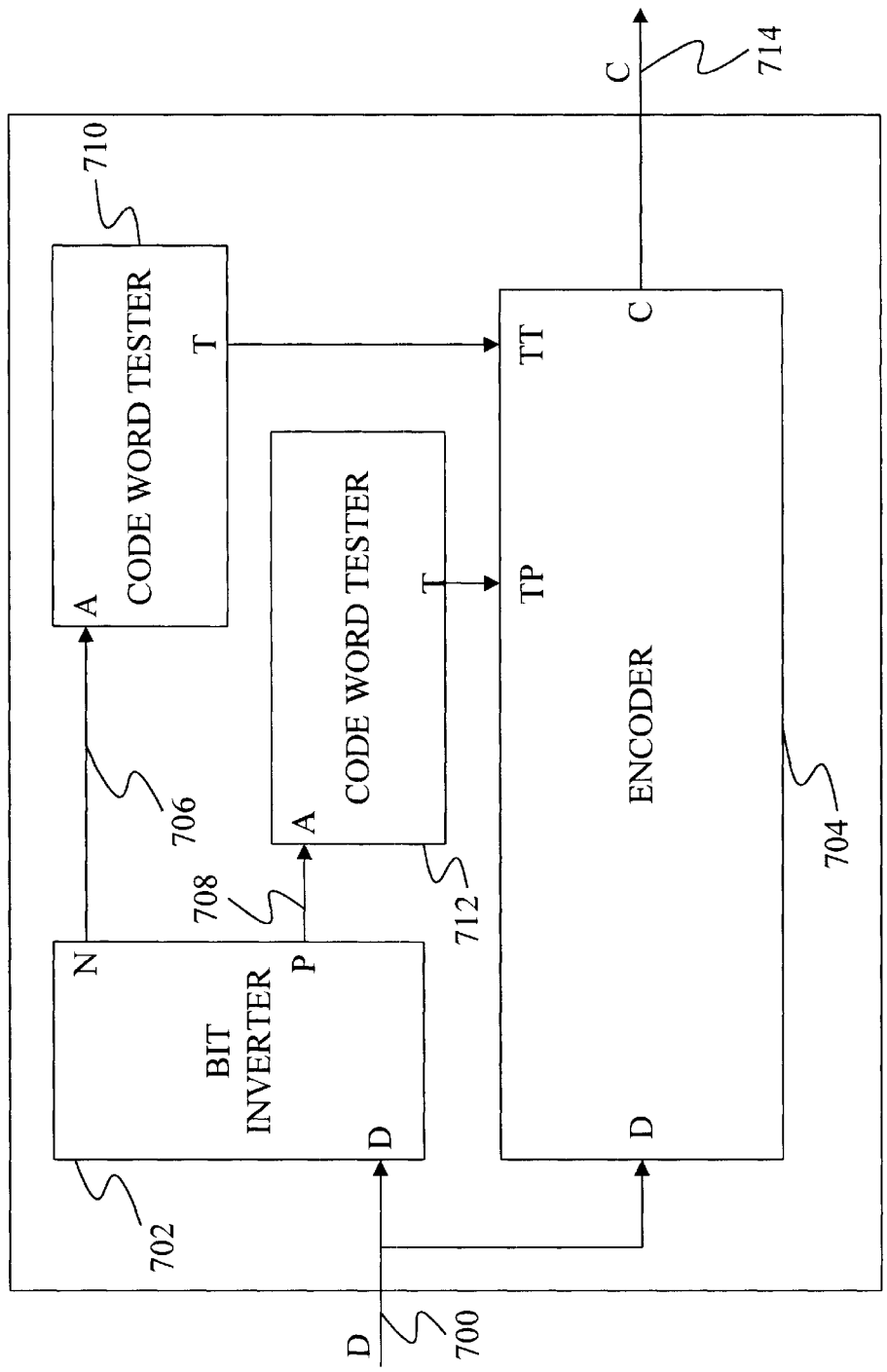
FIG. 7 is a block diagram of one embodiment of a segment encoder under the present invention.

FIG. 7 is a block diagram showing elements of such an encoder. In FIG. 7, the 13-bit data segment appears on a 13-bit line 700 that is input to a bit inverter 702 and an encoder 704. Bit inverter 702 generates two 13-bit outputs 706 and 708. Output 706 is identified by the letter N and output 708 is identified by the letter P. The operation of bit inverter 702 is described by the following logical equations where variables N0–N12 represent bits 0–12 of N output 706, variables P0–P12 represent bits 0 to 12 of P output 708, and variables D0–d12 represent bits 0–12 of D input 700. The operation of bit inverter 702 is thus described as:

N12=!D12

N11=!D11

N10=!D10

N9=!D9

N8=!D8

N7=!D7

N6=!D6

N5=!D5

N4=!D4

N3=!D3

N2=!D2

N1=!D1

N0=!D0

P12=0

P11=0

P10=0

P9=1

P8=N12

P7=N11

P6=N10

P5=N9

P4=N8

P3=N7

P2=N6

P1=N5

P0=N4

N output 706 of bit inverter 702 is provided to a codeword tester 710. Output N12–N0 are represented as input values A12–A0 within code tester 710. P output values 708 of bit inverter 702 are provided to a code tester 712 that is identical to code tester 710. In code tester 712, values P12–P0 are represented as input values A12–A0. The operation of codeword testers 710 and 712 is represented by logical equations:

Input: A12,A11,A10,A9,A8,A7,A6,A5,A4,A3,A2,A1,A0 (13 bits)

Output: T

UA0=A12 | A11 | A10 | A9 | A8

UA1=A11 | A10 | A9 | A8 | A7 | A6 | A5

UA2=A10 | A9 | A8 | A7 | A6 | A5 | A4

UA3=A9 | A8 | A7 | A6 | A5 | A4 | A3

UA4=A8 | A7 | A6 | A5 | A4 | A3 | A2

UA5=A7 | A6 | A5 | A4 | A3 | A2 | A1

UA6=A3 | A2 | A1 | A0

{VA=A12+A11+A10+A9+A8+A7+A6+A5+A4+A3+A2+A1+A0 if (VA>3) UA7=1 else UA7=0}

T=UA0&UA1&UA2&UA3&UA4&UA5&UA6&UA7 where T is the single bit output of the codeword tester. Output T of codeword tester 710 is provided to encoder 704 and appears as input TT in encoder 704. Output T of codeword tester 712 is also provided to encoder 704 and appears as input TP in encoder 704. Note that TP and TT are single bit inputs.

Encoder 704 uses the 13-bit input, D, and the single-bit inputs TP and TT to generate a 13-bit codeword 714. The operation of the encoder is described by the following logical equations where bits 0–12 of the codeword are represented by C0–C12:

Tn=!TT

Ha=TP&D3&D2&D1&D0

Ha9=Ha

Ha8=Ha & N12

Ha7=Ha & N11

Ha6=Ha & N10

Ha5=Ha & N9

Ha4=Ha & N8

Ha3=Ha & N7

Ha2=Ha & N6

Ha1=Ha & N5

Ha0=Ha & N4

G1=(D11&D10)|(D12&(D11|D10))

Hb=!Ha&G1&((D2&D1&D0)|( D3&((D2&(D1|D0))|(D1&D0))))

Hb9=Hb &( !D10 & !D3 )

Hb8=Hb &( D10 | D3 )

Hb7=Hb&(!D11 |( D12 & D3))

Hb6=Hb&(!D12 |( D11 & D3))

Hb5=Hb &D3

Hb4=Hb &( D2 & D0 )

Hb3=Hb &( D2 & D1 )

Hb2=Hb &( !D7 | !D6 | !D5 | !D4 )

Hb1=Hb &( D9 & D6 & D5 )

Hb0=Hb &( D8 & D6 & D4 )

Hc=!Ha&!Hb&D11&D10

Hc9=0

Hc8=Hc

Hc7=0

Hc6=0

Hc5=Hc &( D9 & D4 )

Hc4=Hc & !D4

Hc3=Hc &( !D9 | !D3 )

Hc2=Hc &( !D9 | !D2 )

Hc1=Hc &( D9 & !D1 )

Hc0=Hc & !D0

Hd=!Ha&!Hb&D12&(D11|D10)

Hd9=0

Hd8=Hd

Hd7=Hd &( D11 & D9 )

Hd6=Hd &( D10 & D9 )

Hd5=0

Hd4=0

Hd3=Hd &( !D9 | !D3 )

Hd2=Hd &( !D9 | !D2 )

Hd1=Hd & !D1

Hd0=Hd&(!D0 &( D11 | D9))

G2=!G1&!Ha

He=G2&D3&D2

He9=He & D12

He8=He & !D12

He7=He &( D11 | D10 )

He6=He &( D11 | D10 )

He5=He &( D11 & !D10 )

He4=He & !D10

He3=He & D8

He2=He &( D9 | !D8 )

He1=He&( D1 &( D9 | D8 ))

He0=He & D0

Hf=G2&!He&((D12|D11)|(D3&!D2))

Hf9=Hf & !D3

Hf8=Hf & D3

Hf7=Hf&( D3 &( D12 | D11))

Hf6=Hf &( !D12 &!D11 )

Hf5=Hf &( !D12 &!D3 )

Hf4=Hf & D3

Hf3=Hf &( !D12 & !D10 & !D1 & !D0 )

Hf2=Hf &( D12 | D10 | !D3 )

Hf1=Hf & D1

Hf0=Hf & D0

Hg=G2&!He&!Hf&(!D12|!D11)

Hg9=Hg &( D1 & !D2 )

Hg8=Hg &( D2 | !D1 )

Hg7=Hg & D2

Hg6=Hg & D2

Hg5=Hg & !D2

Hg4=Hg &( D1 | !D2 )

Hg3=0

Hg2=0

Hg1=Hg

Hg0=Hg & D0

C12=(TT&N12)

C11=(TT&N11)

C10=(TT&N10)

C9=(TT&N9) |(Tn&(Ha9|Hb9|Hc9|Hd9|He9|Hf9|Hg9))

C8=(TT&N8) |(Tn&(Ha8|Hb8|Hc8|Hd8|He8|Hf8|Hg8))

C7=(TT&N7) |(Tn&(Ha7|Hb7|Hc7|Hd7|He7|Hf7|Hg7))

C6=(TT&N6) |(Tn&(Ha6|Hb6|Hc6|Hd6|He6|Hf6|Hg6))

C5=(TT&N5) |(Tn&(Ha5|Hb5|Hc5|Hd5|He5|Hf5|Hg5))

C4=(TT&N4) |(Tn&(Ha4|Hb4|Hc4|Hd4|He4|Hf4|Hg4))

C3=(TT&N3) |(Tn&(Ha3|Hb3|Hc3|Hd3|He3|Hf3|Hg3))

C2=(TT&N2) |(Tn&(Ha2|Hb2|Hc2|Hd2|He2|Hf2|Hg2))

C1=(TT&N1) |(Tn&(Ha1|Hb1|Hc|Hd1|He|Hf1|Hg1))

C0=(TT&N0) |(Tn&(Ha0|Hb0|Hc0|Hd0|He0|Hf0|Hg0))

Codewords encoded using the logical equations described above may be decoded using the following logical equations where the input to the decoder is represented by bits C0–C12, the output of the decoder is represented by D0–D12, and a flag output indicative of an invalid codeword is represented by F. Thus, the segment decoder is described in logical equations as:

TT=C12|C11|C10

Tn=!TT

N12=!C12

N11=!C11

N10=!C10

N9=!C9

N8=!C8

N7=!C7

N6=!C6

N5=!C5

N4=!C4

N3=!C3

N2=!C2

N1=!C1

N0=!C0

Ha=Tn&((C9&C8)|(C9&(C7|C6)))

Ha12=Ha & N8

Ha11=Ha & N7

Ha10=Ha & N6

Ha9=Ha & N5

Ha8=Ha & N4

Ha7=Ha & N3

Ha6=Ha & N2

Ha5=Ha & N1

Ha4=Ha & N0

Ha3=Ha

Ha2=Ha

Ha1=Ha

Ha0=Ha

Hb=Tn&!Ha&(((C7|C6)&C5)|((C9|(C7^C6))&!C5&C4&C3&(C2|C1|C0)))

Hb12=Hb &( C9 | C7 )

Hb11=Hb &( C9 | C6 )

Hb10=Hb &( C7 ^ C6 )

Hb9=Hb &( C2 | C1 )

Hb8=Hb &( C2 | C0 )

Hb7=Hb &( !C2 | !C1 | !C0 )

Hb6=Hb &( C1 | C0 | !C2 )

Hb5=Hb &( C1 | C2 | !C0 )

Hb4=Hb &( C0 | C2 | !C1 )

Hb3=Hb & C5

Hb2=Hb &( C4 | C3 )

Hb1=Hb &( C3 | !C4 )

Hb0=Hb &( C4 | !C3 )

Hc=Tn&!Ha&C8&!C7&!C6&(((C5^C4)|(!C5&!C4&!C1))

Hc12=0

Hc1=Hc

Hc10=Hc

Hc9=Hc &( C5 | C4 )

Hc8=Hc

Hc7=Hc

Hc6=Hc

Hc5=Hc

Hc4=Hc & !C4

Hc3=Hc&(!C3 |( !C5 & !C4))

Hc2=Hc&(!C2 |( !C5 & !C4))

Hc1=Hc&(!C1 &( C5 | C4))

Hc0=Hc & !C0

Hd=Tn&!Ha&C8&!C5&!C4&((C7^C6)|(!C7&!C6&C3&C2&C1))

Hd12=Hd

Hd11=Hd&( C7 |( C0 & !C6))

Hd10=Hd&( C6 |( !C7 & !C0))

Hd9=Hd &( C7 |C6)

Hd8=Hd

Hd7=Hd

Hd6=Hd

Hd5=Hd

Hd4=Hd

Hd3=Hd&(!C3 |( !C7 & !C6))

Hd2=Hd&(!C2 |( !C7 & !C6))

Hd1=Hd &!C1

Hd0=Hd&(!C0 &( C7 | C6))

He=Tn&!Ha&!Hb&!Hc&((C7&C6)|(C5&C4))&(C3|C2)

He12=He & C9

He1=He &( C7 & C4 )

He10=He & !C4

He9=He &( C2 &( C3 | C1))

He8=He & C3

He7=He

He6=He

He5=He

He4=He

He3=He

He2=He

He1=He &( C1 | !C3 )

He0=He & C0

Hf=Tn&!Ha&!Hb&!Hc&!Hd&!He&((C9&!C8&!C4)|((C7^C6)&!C5&C4))

Hf12=Hf &( C2 & !C6 & !C5 )

Hf11=Hf &( C5 |( C7 & !C2))

Hf10=Hf &( C6 & C2 )

Hf9=Hf

Hf8=Hf

Hf7=Hf

Hf6=Hf

Hf5=Hf

Hf4=Hf

Hf3=Hf & !C9

Hf2=Hf & C9

Hf1=Hf & C1

Hf0=Hf & C0

Hg=Tn&!Ha&!Hb&!Hc&!Hd&!He&!Hf&((C7&C6)|(C5&C4))

Hg12=0

Hg11=0

Hg10=Hg

Hg9=Hg

Hg8=Hg

Hg7=Hg

Hg6=Hg

Hg5=Hg

Hg4=Hg

Hg3=0

Hg2=Hg & C7

Hg1=Hg&( C9 |(C7 & C4))

Hg0=Hg & C0

F=(Tn&!Ha&!Hb&!Hc&!Hd&!He&!Hf&!Hg)

D12=(TT&N12) |(Tn&(Ha12|Hb12|Hc12|Hd12|He12|Hf12|Hg12))

D11=(TT&N11) |(Tn&(Ha11|Hb11|Hc11|Hd11|He11|Hf11|Hg11))

D10=(TT&N10) |(Tn&(Ha10|Hb10|Hc10|Hd10|He10|Hf10|Hg10))

D9=(TT&N9) |(Tn&(Ha9|Hb9|Hc9|Hd9|He9|Hf9|Hg9))

D8=(TT&N8) |(Tn&(Ha8|Hb8|Hc8|Hd8|He8|Hf8|Hg8))

D7=(TT&N7) |(Tn&(Ha7|Hb7|Hc7|Hd7|He7|Hf7|Hg7))

D6=(TT&N6) |(Tn&(Ha6|Hb6|Hc6|Hd6|He6|Hf6|Hg6))

D5=(TT&N5) |(Tn&(Ha5|Hb5|Hc5|Hd5|He5|Hf5|Hg5))

D4=(TT&N4) |(Tn&(Ha4|Hb4|Hc4|Hd4|He4|Hf4|Hg4))

D3=(TT&N3) |(Tn&(Ha3|Hb3|Hc3|Hd3|He3|Hf3|Hg3))

D2=(TT&N2) |(Tn&(Ha2|Hb2|Hc2|Hd2|He2|Hf2|Hg2))

D1=(TT&N1) |(Tn&(Ha1|Hb1|Hc1|Hd1|He1|Hf1|Hg1))

D0=(TT&N0) |(Tn&(Ha0|Hb0|Hc0|Hd0|He0|Hf0|Hg0))

The encoder and decoders described above by logical equations can be summarized by the following codeword table where the first column of the table indicates the first two hexadecimal digits of the data word and the last hexadecimal digit of the data word is found across the top row of each table. The codeword associated with the complete data word is then found by finding the intersection of the first two hexadecimal values for the data word and the third hexadecimal value for the data word. For example, the data word 0F7 has an associated codeword of 1F08 in the following tables.

TABLE 7

| | \multicolumn{10}{c}{13-bit code words for 64/65 (0,7) code [Min Hwt = 4]} |
|---|---|---|---|---|---|---|---|---|---|---|
| | 0 | 1 | 2 | 3 | 4 | 5 | 6 | 7 | 8 | 9 |
| 00X | 1FFF | 1FFE | 1FFD | 1FFC | 1FFB | 1FFA | 1FF9 | 1FF8 | 1FF7 | 1FF6 |
| 01X | 1FEF | 1FEE | 1FED | 1FEC | 1FEB | 1FEA | 1FE9 | 1FE8 | 1FE7 | 1FE6 |
| 02X | 1FDF | 1FDE | 1FDD | 1FDC | 1FDB | 1FDA | 1FD9 | 1FD8 | 1FD7 | 1FD6 |
| 03X | 1FCF | 1FCE | 1FCD | 1FCC | 1FCB | 1FCA | 1FC9 | 1FC8 | 1FC7 | 1FC6 |
| 04X | 1FBF | 1FBE | 1FBD | 1FBC | 1FBB | 1FBA | 1FB9 | 1FB8 | 1FB7 | 1FB6 |
| 05X | 1FAF | 1FAE | 1FAD | 1FAC | 1FAB | 1FAA | 1FA9 | 1FA8 | 1FA7 | 1FA6 |
| 06X | 1F9F | 1F9E | 1F9D | 1F9C | 1F9B | 1F9A | 1F99 | 1F98 | 1F97 | 1F96 |
| 07X | 1F8F | 1F8E | 1F8D | 1F8C | 1F8B | 1F8A | 1F89 | 1F88 | 1F87 | 1F86 |
| 08X | 1F7F | 1F7E | 1F7D | 1F7C | 1F7B | 1F7A | 1F79 | 1F78 | 1F77 | 1F76 |
| 09X | 1F6F | 1F6E | 1F6D | 1F6C | 1F6B | 1F6A | 1F69 | 1F68 | 1F67 | 1F66 |
| 0AX | 1F5F | 1F5E | 1F5D | 1F5C | 1F5B | 1F5A | 1F59 | 1F58 | 1F57 | 1F56 |
| 0BX | 1F4F | 1F4E | 1F4D | 1F4C | 1F4B | 1F4A | 1F49 | 1F48 | 1F47 | 1F46 |
| 0CX | 1F3F | 1F3E | 1F3D | 1F3C | 1F3B | 1F3A | 1F39 | 1F38 | 1F37 | 1F36 |
| 0DX | 1F2F | 1F2E | 1F2D | 1F2C | 1F2B | 1F2A | 1F29 | 1F28 | 1F27 | 1F26 |
| 0EX | 1F1F | 1F1E | 1F1D | 1F1C | 1F1B | 1F1A | 1F19 | 1F18 | 1F17 | 1F16 |
| 0FX | 1F0F | 1F0F | 1E0D | 1E0C | 1E0B | 1F0A | 1F09 | 1F08 | 1F07 | 1F06 |
| 10X | 1EFF | 1EFE | 1EFD | 1EFC | 1EFB | 1EFA | 1EF9 | 1EF8 | 1EF7 | 1EF6 |
| 11X | 1EEF | 1EEE | 1EED | 1EEC | 1EEB | 1EEA | 1EE9 | 1EE8 | 1EE7 | 1EE6 |
| 12X | 1EDF | 1EDE | 1EDD | 1EDC | 1EDB | 1EDA | 1ED9 | 1ED8 | 1ED7 | 1ED6 |
| 13X | 1ECF | 1ECE | 1ECD | 1ECC | 1ECB | 1ECA | 1EC9 | 1EC8 | 1EC7 | 1EC6 |
| 14X | 1EBF | 1EBE | 1EBD | 1EBC | 1EBB | 1EBA | 1EB9 | 1EB8 | 1EB7 | 1EB6 |
| 15X | 1EAF | 1EAE | 1EAD | 1EAC | 1EAB | 1EAA | 1EA9 | 1EA8 | 1EA7 | 1EA6 |
| 16X | 1E9F | 1E9E | 1E9D | 1E9C | 1E9B | 1E9A | 1E99 | 1E98 | 1E97 | 1E96 |
| 17X | 1E8F | 1E8E | 1E8D | 1E8C | 1E8B | 1E8A | 1E89 | 1E88 | 1E87 | 1E86 |
| 18X | 1E7F | 1E7E | 1E7D | 1E7C | 1E7B | 1E7A | 1E79 | 1E78 | 1E77 | 1E76 |
| 19X | 1E6F | 1E6E | 1E6D | 1E6C | 1E6B | 1E6A | 1E69 | 1E68 | 1E67 | 1E66 |
| 1AX | 1E5F | 1E5E | 1E5D | 1E5C | 1E5B | 1E5A | 1E59 | 1E58 | 1E57 | 1E56 |
| 1BX | 1E4F | 1E4E | 1E4D | 1E4C | 1E4B | 1E4A | 1E49 | 1E48 | 1E47 | 1E46 |
| 1CX | 1E3F | 1E3E | 1E3D | 1E3C | 1E3B | 1E3A | 1E39 | 1E38 | 1E37 | 1E36 |
| 1DX | 1E2F | 1E2E | 1E2D | 1E2C | 1E2B | 1E2A | 1E29 | 1E28 | 1E27 | 1E26 |
| 1EX | 1E1F | 1E1E | 1E1D | 1E1C | 1E1B | 1E1A | 1E19 | 1E18 | 1E17 | 1E16 |
| 20X | 1DFF | 1DFE | 1DFD | 1DFC | 1DFB | 1DFA | 1DF9 | 1DF8 | 1DF7 | 1DF6 |
| 21X | 1DEF | 1DEE | 1DED | 1DEC | 1DEB | 1DEA | 1DE9 | 1DE8 | 1DE7 | 1DE6 |
| 22X | 1DDF | 1DDE | 1DDD | 1DDC | 1DDB | 1DDA | 1DD9 | 1DD8 | 1DD7 | 1DD6 |
| 23X | 1DCF | 1DCE | 1DCD | 1DCC | 1DCB | 1DCA | 1DC9 | 1DC8 | 1DC7 | 1DC6 |
| 24X | 1DBF | 1DBE | 1DBD | 1DBC | 1DBB | 1DBA | 1DB9 | 1DB8 | 1DB7 | 1DB6 |
| 25X | 1DAF | 1DAE | 1DAD | 1DAC | 1DAB | 1DAA | 1DA9 | 1DA8 | 1DA7 | 1DA6 |
| 26X | 1D9F | 1D9E | 1D9D | 1D9C | 1D9B | 1D9A | 1D99 | 1D98 | 1D97 | 1D96 |
| 27X | 1D8F | 1D8E | 1D8D | 1D8C | 1D8B | 1D8A | 1D89 | 1D88 | 1D87 | 1D86 |
| 28X | 1D7F | 1D7E | 1D7D | 1D7C | 1D7B | 1D7A | 1D79 | 1D78 | 1D77 | 1D76 |
| 29X | 1D6F | 1D6E | 1D6D | 1D6C | 1D6B | 1D6A | 1D69 | 1D68 | 1D67 | 1D66 |
| 2AX | 1D5F | 1D5E | 1D5D | 1D5C | 1D5B | 1D5A | 1D59 | 1D58 | 1D57 | 1D56 |
| 2BX | 1D4F | 1D4E | 1D4D | 1D4C | 1D4B | 1D4A | 1D49 | 1D48 | 1D47 | 1D46 |
| 2CX | 1D3F | 1D3E | 1D3D | 1D3C | 1D3B | 1D3A | 1D39 | 1D38 | 1D37 | 1D36 |
| 2DX | 1D2F | 1D2E | 1D2D | 1D2C | 1D2B | 1D2A | 1D29 | 1D28 | 1D27 | 1D26 |
| 2EX | 1D1F | 1D1E | 1D1D | 1D1C | 1D1B | 1D1A | 1D19 | 1D18 | 1D17 | 1D16 |
| 2FX | 1D0F | 1D0E | 1D0D | 1D0C | 1D0B | 1D0A | 1D09 | 1D08 | 1D07 | 1D06 |
| 30X | 1CFF | 1CFE | 1CFD | 1CFC | 1CFB | 1CFA | 1CF9 | 1CF8 | 1CF7 | 1CF6 |
| 31X | 1CEF | 1CEE | 1CED | 1CEC | 1CEB | 1CEA | 1CE9 | 1CE8 | 1CE7 | 1CE6 |
| 32X | 1CDF | 1CDE | 1CDD | 1CDC | 1CDB | 1CDA | 1CD9 | 1CD8 | 1CD7 | 1CD6 |
| 33X | 1CCF | 1CCE | 1CCD | 1CCC | 1CCB | 1CCA | 1CC9 | 1CC8 | 1CC7 | 1CC6 |
| 34X | 1CBF | 1CBE | 1CBD | 1CBC | 1CBB | 1CBA | 1CB9 | 1CB8 | 1CB7 | 1CB6 |
| 35X | 1CAF | 1CAE | 1CAD | 1CAC | 1CAB | 1CAA | 1CA9 | 1CA8 | 1CA7 | 1CA6 |
| 36X | 1C9F | 1C9E | 1C9D | 1C9C | 1C9B | 1C9A | 1C99 | 1C98 | 1C97 | 1C96 |
| 37X | 1C8F | 1C8E | 1C8D | 1C8C | 1C8B | 1C8A | 1C89 | 1C88 | 1C87 | 1C86 |
| 38X | 1C7F | 1C7E | 1C7D | 1C7C | 1C7B | 1C7A | 1C79 | 1C78 | 1C77 | 1C76 |
| 39X | 1C6F | 1C6E | 1C6D | 1C6C | 1C6B | 1C6A | 1C69 | 1C68 | 1C67 | 1C66 |
| 3AX | 1C5F | 1C5E | 1C5D | 1C5C | 1C5B | 1C5A | 1C59 | 1C58 | 1C57 | 1C56 |
| 3BX | 1C4F | 1C4E | 1C4D | 1C4C | 1C4B | 1C4A | 1C49 | 1C48 | 1C47 | 1C46 |
| 3CX | 1C3F | 1C3E | 1C3D | 1C3C | 1C3B | 1C3A | 1C39 | 1C38 | 1C37 | 1C36 |
| 3DX | 1C2F | 1C2E | 1C2D | 1C2C | 1C2B | 1C2A | 1C29 | 1C28 | 1C27 | 1C26 |
| 3EX | 1C1F | 1C1E | 1C1D | 1C1C | 1C1B | 1C1A | 1C19 | 1C18 | 1C17 | 1C16 |
| 3FX | 1C0F | 1C0E | 1C0D | 1C0C | 1C0B | 1C0A | 1C09 | 1C08 | 0158 | 0151 |

| | A | B | C | D | E | F |
|---|---|---|---|---|---|---|
| 00X | 1FF5 | 1FF4 | 1FF3 | 1FF2 | 1FF1 | 03FF |
| 01X | 1FE5 | 1FE4 | 1FE3 | 1FE2 | 1FE1 | 03FE |
| 02X | 1FD5 | 1FD4 | 1FD3 | 1FD2 | 1FD1 | 03FD |
| 03X | 1FC5 | 1FC4 | 1FC3 | 1FC2 | 1FC1 | 03FC |
| 04X | 1FB5 | 1FB4 | 1FB3 | 1FB2 | 1FB1 | 03FB |
| 05X | 1FA5 | 1FA4 | 1FA3 | 1FA2 | 1FA1 | 03FA |
| 06X | 1F95 | 1F94 | 1F93 | 1F92 | 1F91 | 03F9 |
| 07X | 1F85 | 1F84 | 1F83 | 1F82 | 1F81 | 03F8 |
| 08X | 1F75 | 1F74 | 1F73 | 1F72 | 1F71 | 03F7 |

TABLE 7-continued 13-bit code words for 64/65 (0,7) code [Min Hwt = 4]

| | | | | | | |
|---|---|---|---|---|---|---|
| 09X | 1F65 | 1F64 | 1F63 | 1F62 | 1F61 | 03F6 |
| 0AX | 1F55 | 1F54 | 1F53 | 1F52 | 1F51 | 03F5 |
| 0BX | 1F45 | 1F44 | 1F43 | 1F42 | 1F41 | 03F4 |
| 0CX | 1F35 | 1F34 | 1F33 | 1F32 | 1F31 | 03F3 |
| 0DX | 1F25 | 1F24 | 1F23 | 1F22 | 1F21 | 03F2 |
| 0EX | 1F15 | 1F14 | 1F13 | 1F12 | 1F11 | 03F1 |
| 0FX | 1F05 | 1F04 | 1F03 | 1F02 | 0134 | 0135 |
| 10X | 1EF5 | 1EF4 | 1EF3 | 1EF2 | 1EF1 | 03EF |
| 11X | 1EE5 | 1EE4 | 1EE3 | 1EE2 | 1EE1 | 03EE |
| 12X | 1ED5 | 1EDA | 1ED3 | 1ED2 | 1ED1 | 03ED |
| 13X | 1EC5 | 1EC4 | 1EC3 | 1EC2 | 1EC1 | 03EC |
| 14X | 1EB5 | 1EB4 | 1EB3 | 1EB2 | 1EB1 | 03EB |
| 15X | 1EA5 | 1EA4 | 1EA3 | 1EA2 | 1EA1 | 03EA |
| 16X | 1E95 | 1E94 | 1E93 | 1E92 | 1E91 | 03E9 |
| 17X | 1E85 | 1E84 | 1E83 | 1E82 | 1E81 | 03E8 |
| 18X | 1E75 | 1E74 | 1E73 | 1E72 | 1E71 | 03E7 |
| 19X | 1E65 | 1E64 | 1E63 | 1E62 | 1E61 | 03E6 |
| 1AX | 1E55 | 1E54 | 1E53 | 1E52 | 1E51 | 03E5 |
| 1BX | 1E45 | 1E44 | 1E43 | 1E42 | 1E41 | 03E4 |
| 1CX | 1E35 | 1E34 | 1E33 | 1E32 | 1E31 | 03E3 |
| 1DX | 1E25 | 1E24 | 1E23 | 1E22 | 1E21 | 03E2 |
| 1EX | 1E15 | 1E14 | 1E13 | 1E12 | 1E11 | 03E1 |
| 20X | 1DF5 | 1DF4 | 1DF3 | 1DF2 | 1DF1 | 03DF |
| 21X | 1DE5 | 1DE4 | 1DE3 | 1DE2 | 1DE1 | 03DE |
| 22X | 1DD5 | 1DD4 | 1DD3 | 1DD2 | 1DD1 | 03DD |
| 23X | 1DC5 | 1DCA | 1DC3 | 1DC2 | 1DC1 | 03DC |
| 24X | 1DB5 | 1DB4 | 1DB3 | 1DB2 | 1DB1 | 03DB |
| 25X | 1DA5 | 1DA4 | 1DA3 | 1DA2 | 1DA1 | 03DA |
| 26X | 1D95 | 1D94 | 1D93 | 1D92 | 1D91 | 03D9 |
| 27X | 1D85 | 1D84 | 1D83 | 1D82 | 1D81 | 03D8 |
| 28X | 1D75 | 1D74 | 1D73 | 1D72 | 1D71 | 03D7 |
| 29X | 1D65 | 1D64 | 1D63 | 1D62 | 1D61 | 03D6 |
| 2AX | 1D55 | 1D54 | 1D53 | 1D52 | 1D51 | 03D5 |
| 2BX | 1D45 | 1D44 | 1D43 | 1D42 | 1D41 | 03D4 |
| 2CX | 1D35 | 1D34 | 1D33 | 1D32 | 1D31 | 03D3 |
| 2DX | 1D25 | 1D24 | 1D23 | 1D22 | 1D21 | 03D2 |
| 2EX | 1D15 | 1D14 | 1D13 | 1D12 | 1D11 | 03D1 |
| 2FX | 1D05 | 1D04 | 1D03 | 1D02 | 0136 | 0137 |
| 30X | 1CF5 | 1CF4 | 1CF3 | 1CF2 | 1CF1 | 03CF |
| 31X | 1CE5 | 1CE4 | 1CE3 | 1CE2 | 1CE1 | 03CE |
| 32X | 1CD5 | 1CD4 | 1CD3 | 1CD2 | 1CD1 | 03CD |
| 33X | 1CC5 | 1CC4 | 1CC3 | 1CC2 | 1CC1 | 03CC |
| 34X | 1CB5 | 1CB4 | 1CB3 | 1CB2 | 1CB1 | 03CB |
| 35X | 1CA5 | 1CA4 | 1CA3 | 1CA2 | 1CA1 | 03CA |
| 36X | 1C95 | 1C94 | 1C93 | 1C92 | 1C91 | 03C9 |
| 37X | 1C85 | 1C84 | 1C83 | 1C82 | 1C81 | 03C8 |
| 38X | 1C75 | 1C74 | 1C73 | 1C72 | 1C71 | 03C7 |
| 39X | 1C65 | 1C64 | 1C63 | 1C62 | 1C61 | 03C6 |
| 3AX | 1C55 | 1C54 | 1C53 | 1C52 | 1C51 | 03C5 |
| 3BX | 1C45 | 1C44 | 1C43 | 1C42 | 1C41 | 03C4 |
| 3CX | 1C35 | 1C34 | 1C33 | 1C32 | 1C31 | 03C3 |
| 3DX | 1C25 | 1C24 | 1C23 | 1C22 | 1C21 | 03C2 |
| 3EX | 1C15 | 1C14 | 1C13 | 1C12 | 1C11 | 03C1 |
| 3FX | 0152 | 0153 | 013C | 013D | 013E | 013F |

TABLE 8

13-bit code words for 64/65 (0,7) code [Min Hwt = 4]

| | 0 | 1 | 2 | 3 | 4 | 5 | 6 | 7 | 8 | 9 |
|---|---|---|---|---|---|---|---|---|---|---|
| 40X | 1BEF | 1BFE | 1BFD | 1BFC | 1BFB | 1BFA | 1BF9 | 1BF8 | 1BF7 | 1BFB |
| 41X | 1BEF | 1BEE | 1BED | 1BEC | 1BEB | 1BEA | 1BE9 | 1BE8 | 1BE7 | 1BE6 |
| 42X | 1BDF | 1BDE | 1BDD | 1BDC | 1BDB | 1BDA | 1BD9 | 1BD8 | 1BD7 | 1BD6 |
| 43X | 1BCF | 1BCE | 1BCD | 1BCC | 1BCB | 1BCA | 1BC9 | 1BC8 | 1BC7 | 1BC6 |
| 44X | 1BBF | 1BBE | 1BBD | 1BBC | 1BBB | 1BBA | 1BB9 | 1BB8 | 1BB7 | 1B86 |
| 45X | 1BAF | 1BAE | 1BAD | 1BAC | 1BAB | 1BAA | 1BA9 | 1BA8 | 1BA7 | 1BA6 |
| 48X | 1B9F | 1B9E | 1B9D | 1B9C | 1B9B | 1B9A | 1B99 | 1B98 | 1B97 | 1B96 |
| 47X | 1B8F | 1B8E | 1B8D | 1B8C | 1B8B | 1B8A | 1B89 | 1B88 | 1B87 | 1B86 |
| 48X | 1B7F | 1B7E | 1B7D | 1B7C | 1B7B | 1B7A | 1B79 | 1B78 | 1B77 | 1B76 |
| 49X | 186F | 1B6E | 1B6D | 1B6C | 1B6B | 1B6A | 1B69 | 1868 | 1B67 | 1B66 |
| 4AX | 1B5F | 1B5E | 1B5D | 1B5C | 1B5B | 1B5A | 1B59 | 1B58 | 1B57 | 1B56 |
| 4BX | 1B4F | 1B4E | 1B4D | 1B4C | 1B4B | 1B4A | 1B49 | 1B48 | 1B47 | 1B46 |
| 4CX | 1B3F | 1B3E | 1B3D | 1B3C | 1B3B | 1B3A | 1B39 | 1B38 | 1B37 | 1B36 |

TABLE 8-continued

| 13-bit code words for 64/65 (0,7) code [Min Hwt = 4] | | | | | | | | | |
|---|---|---|---|---|---|---|---|---|---|
| 4DX | 1B2F | 1B2E | 1B2D | 1B2C | 1B2B | 1B2A | 1B29 | 1B28 | 1B27 | 1B26 |
| 4EX | 1B1F | 1B1E | 1B1D | 1B1C | 1B1B | 1B1A | 1B19 | 1B18 | 1B17 | 1B16 |
| 4FX | 1B0F | 1B0E | 1B0D | 1BDC | 1B0B | 1B0A | 1B09 | 1B08 | 1B07 | 1B06 |
| 50X | 1AFF | 1AFE | 1AFD | 1AFC | 1AFB | 1AFA | 1AF9 | 1AF8 | 1AF7 | 1AF6 |
| 51X | 1AEF | 1AEE | 1AED | 1AEC | 1AEB | 1AEA | 1AE9 | 1AE8 | 1AE7 | 1AE6 |
| 52X | 1ADF | 1ADE | 1ADD | 1ADC | 1ADB | 1ADA | 1AD9 | 1AD8 | 1AD7 | 1AD6 |
| 53X | 1ACF | 1ACE | 1ACD | 1ACC | 1ACB | 1ACA | 1AC9 | 1AC8 | 1AC7 | 1AC6 |
| 54X | 1ABF | 1ABE | 1ABD | 1ABC | 1ABB | 1ABA | 1AB9 | 1AB8 | 1AB7 | 1AB6 |
| 55X | 1AAF | 1AAE | 1AAD | 1AAC | 1AAB | 1AAA | 1AA9 | 1AA8 | 1AA7 | 1AA6 |
| 56X | 1A9F | 1A9E | 1A9D | 1A9C | 1A9B | 1A9A | 1A99 | 1A98 | 1A97 | 1A96 |
| 57X | 1A8F | 1A8E | 1ABD | 1ABC | 1ABB | 1A0A | 1A89 | 1A88 | 1A87 | 1A86 |
| 58X | 1A7F | 1A7E | 1A7D | 1A7C | 1A7B | 1A7A | 1A79 | 1A78 | 1A77 | 1A76 |
| 59X | 1A6F | 1A6E | 1A6D | 1A6C | 1ABA | 1A69 | 1A68 | 1A67 | 1A66 | |
| 5AX | 1A5F | 1A5E | 1A5D | 1A5C | 1A5B | 1A5A | 1A59 | 1A58 | 1A57 | 1A56 |
| 5BX | 1A4F | 1A4E | 1A4D | 1A4C | 1A4B | 1A4A | 1A49 | 1A48 | 1A47 | 1A46 |
| 5CX | 1A3F | 1A3E | 1A3D | 1A3C | 1A3B | 1A3A | 1A39 | 1A38 | 1A37 | 1A35 |
| 5DX | 1A2F | 1A2E | 1A2D | 1A2C | 1A2B | 1A2A | 1A29 | 1A28 | 1A27 | 1A26 |
| 5EX | 1A1F | 1A1E | 1A1D | 1A1C | 1A1B | 1A1A | 1A19 | 1A18 | 1A17 | 1A16 |
| 5FX | 1A0F | 1A0E | 1A0D | 1A0C | 1A0B | 1A0A | 1A09 | 1A08 | 1A07 | 1A06 |
| 60X | 19FF | 19FE | 19FD | 19FC | 19FB | 19FA | 19F9 | 19F8 | 19F7 | 19F6 |
| 61X | 19EF | 19EE | 19ED | 19EC | 19EB | 19EA | 19E9 | 19E8 | 19E7 | 19E6 |
| 62X | 19DF | 19DE | 19DD | 19DC | 19DB | 19DA | 19D9 | 19D8 | 19D7 | 19D6 |
| 63X | 15CF | 19CE | 19CD | 19CC | 19CB | 19CA | 19C9 | 19C8 | 19C7 | 19C6 |
| 64X | 19BF | 19BE | 198D | 198C | 19BB | 19BA | 19B9 | 19B8 | 19B7 | 19B6 |
| 65X | 19AF | 19AE | 19AD | 19AC | 19AB | 19AA | 19A9 | 19A8 | 19A7 | 19A6 |
| 66X | 199F | 199E | 199D | 19DC | 199B | 199A | 1999 | 1998 | 1997 | 1996 |
| 67X | 198F | 198E | 198D | 198C | 198B | 19BA | 1989 | 1988 | 1987 | 1986 |
| 68X | 197F | 197E | 197D | 197C | 197B | 197A | 1979 | 1978 | 1977 | 1976 |
| 69X | 196F | 196E | 196D | 196C | 196B | 196A | 1969 | 1968 | 1967 | 1966 |
| 6AX | 195F | 195E | 195D | 195C | 195B | 195A | 1959 | 1958 | 1957 | 1955 |
| 6BX | 194F | 194E | 194D | 194C | 194B | 194A | 1949 | 1948 | 1947 | 1946 |
| 6CX | 193F | 193E | 193D | 193C | 193B | 193A | 1939 | 1938 | 1937 | 1936 |
| 6DX | 192F | 192E | 192D | 192C | 192B | 192A | 1929 | 1928 | 1927 | 1926 |
| 6EX | 191F | 191E | 191D | 191C | 191B | 191A | 1919 | 1918 | 1917 | 1916 |
| 6FX | 190F | 190E | 190D | 190C | 190B | 19DA | 1909 | 1908 | 1907 | 19D5 |
| 70X | 18FF | 18FE | 18FD | 18FC | 18FB | 18FA | 18F9 | 18F8 | 18F7 | 18F6 |
| 71X | 18EF | 18EE | 18ED | 18EC | 18EB | 18EA | 18E9 | 18E8 | 18E7 | 18E6 |
| 72X | 18DF | 18DE | 18DD | 18DC | 18DB | 18DA | 18D9 | 18D8 | 18D7 | 18D6 |
| 73X | 18CF | 18CE | 18CD | 18CC | 18CB | 18CA | 18C9 | 18C8 | 18C7 | 18C6 |
| 74X | 186F | 18BE | 18BD | 186C | 18BB | 18BA | 18B9 | 18B8 | 18B7 | 18B6 |
| 75X | 18AF | 18AE | 18AD | 18AC | 18AB | 18AA | 18A9 | 18A8 | 18A7 | 18A6 |
| 76X | 189F | 189E | 189D | 18DC | 1898 | 189A | 1899 | 1898 | 1897 | 1896 |
| 77X | 188F | 188E | 188D | 188C | 188B | 188A | 1889 | 1888 | 1887 | 1886 |
| 78X | 187F | 187E | 187D | 187C | 187B | 187A | 1879 | 1878 | 1877 | 1876 |
| 79X | 186F | 186E | 186D | 186C | 186B | 186A | 1869 | 1888 | 1867 | 1868 |
| 7AX | 185F | 185E | 185D | 185C | 185B | 185A | 1859 | 1858 | 1857 | 1856 |
| 7BX | 184F | 184E | 184D | 184C | 184B | 184A | 1849 | 1848 | 1847 | 1846 |
| 7CX | 183F | 183E | 183D | 183C | 183B | 183A | 1839 | 1838 | 1837 | 1836 |
| 7DX | 182F | 182E | 182D | 182C | 182B | 182A | 1829 | 1828 | 1827 | 1826 |
| 7EX | 181F | 181E | 181D | 181C | 181B | 181A | 1819 | 1818 | 1817 | 1816 |
| 7FX | 0132 | 0133 | 0232 | 0233 | 01C2 | 01C3 | 01D2 | 01D3 | 0154 | 0155 |

| | A | B | C | D | E | F |
|---|---|---|---|---|---|---|
| 40X | 1BF5 | 1BF4 | 1EF3 | 1BF2 | 1BF1 | 03BF |
| 41X | 1BE5 | 1BE4 | 1BE3 | 1BE2 | 1BE1 | 03BE |
| 42X | 1BD5 | 1BD4 | 1B03 | 1BD2 | 1BD1 | 03BD |
| 43X | 1BC5 | 1BC4 | 1BC3 | 1BC2 | 1BC1 | 03BC |
| 44X | 1BB5 | 1BBA | 1BB3 | 1BB2 | 1BB1 | 038B |
| 45X | 1BA5 | 1BA4 | 1BA3 | 1BA2 | 1BA1 | 03BA |
| 48X | 1B95 | 1B94 | 1B93 | 1B92 | 1B91 | 0389 |
| 47X | 1B85 | 1B84 | 1B83 | 1B82 | 1B81 | 0388 |
| 48X | 1B75 | 1B74 | 1B73 | 1B72 | 1B71 | 0387 |
| 49X | 1B65 | 1B64 | 1B63 | 1862 | 1B61 | 0386 |
| 4AX | 1B55 | 1B54 | 1B53 | 1B52 | 1B51 | 0385 |
| 4BX | 1B45 | 1B44 | 1B43 | 1B42 | 1B41 | 0384 |
| 4CX | 1B35 | 1B34 | 1B33 | 1B32 | 1B31 | 03B3 |
| 4DX | 1B25 | 1B24 | 1B23 | 1B22 | 1B21 | 03B2 |
| 4EX | 1B15 | 1B14 | 1B13 | 1B12 | 1B11 | 0381 |
| 4FX | 1B05 | 1B04 | 1B03 | 1B02 | 01C4 | 01C5 |
| 50X | 1AF5 | 1AF4 | 1AF3 | 1AF2 | 1AF1 | 03AF |
| 51X | 1AE5 | 1AE4 | 1AE3 | 1AE2 | 1AE1 | 03AE |
| 52X | 1AD5 | 1AD4 | 1AD3 | 1AD2 | 1AD1 | 03AD |
| 53X | 1AC5 | 1AC4 | 1AC3 | 1AC2 | 1AC1 | 03AC |
| 54X | 1AB5 | 1AB4 | 1AB3 | 1AB2 | 1AB1 | 03AB |
| 55X | 1AA5 | 1AA4 | 1AA3 | 1AA2 | 1AA1 | 03AA |
| 56X | 1A95 | 1A94 | 1A93 | 1A92 | 1A91 | 03A9 |

TABLE 8-continued

13-bit code words for 64/65 (0,7) code [Min Hwt = 4]

|  |  |  |  |  |  |  |
|---|---|---|---|---|---|---|
| 57X | 1A85 | 1A84 | 1A83 | 1A82 | 1A81 | 03A8 |
| 58X | 1A75 | 1A74 | 1A73 | 1A72 | 1A71 | 03A7 |
| 59X | 1A65 | 1A64 | 1A63 | 1A62 | 1A61 | 03A6 |
| 5AX | 1A55 | 1A54 | 1A53 | 1A52 | 1A51 | 03A5 |
| 5BX | 1A45 | 1A44 | 1A43 | 1A42 | 1A41 | 05A4 |
| 5CX | 1A35 | 1A34 | 1A33 | 1A32 | 1A31 | 05A3 |
| 5DX | 1A25 | 1A24 | 1A23 | 1A22 | 1A21 | 03A2 |
| 5EX | 1A15 | 1A14 | 1A13 | 1A12 | 1A11 | 03A1 |
| 5FX | 1A05 | 1A04 | 01C8 | 01C9 | 01CA | 01CB |
| 60X | 19F5 | 19F4 | 19F3 | 19F2 | 19F1 | 039F |
| 61X | 19E5 | 19E4 | 19E3 | 19E2 | 19E1 | 039E |
| 62X | 19D5 | 19D4 | 19D3 | 19D2 | 19D1 | 039D |
| 63X | 19C5 | 19C4 | 19C3 | 19C2 | 19C1 | 03DC |
| 64X | 19B5 | 19B4 | 19B3 | 19B2 | 19B1 | 039B |
| 65X | 19A5 | 19A4 | 19A3 | 19A2 | 19A1 | 039A |
| 66X | 1995 | 1994 | 1993 | 1992 | 1991 | 0399 |
| 67X | 1985 | 1984 | 1983 | 1982 | 1981 | 0398 |
| 68X | 1975 | 1974 | 1973 | 1972 | 1971 | 0397 |
| 69X | 1965 | 1964 | 1963 | 1962 | 1961 | 0396 |
| 6AX | 1955 | 1954 | 1953 | 1952 | 1951 | 0395 |
| 6BX | 1945 | 1944 | 1943 | 1942 | 1941 | 0394 |
| 6CX | 1935 | 1934 | 1933 | 1932 | 1931 | 0393 |
| 6DX | 1925 | 1924 | 1923 | 1922 | 1921 | 0392 |
| 6EX | 1915 | 1914 | 1913 | 1912 | 1911 | 0391 |
| 6FX | 1905 | 1904 | 1903 | 1902 | 01C6 | 01C7 |
| 70X | 18F5 | 18F4 | 18F3 | 18F2 | 18F1 | 038F |
| 71X | 18E5 | 18E4 | 18E3 | 18E2 | 18E1 | 038E |
| 72X | 18D5 | 18D4 | 18D3 | 18D2 | 18D1 | 038D |
| 73X | 18C5 | 1804 | 18C3 | 1DC2 | 18C1 | 038C |
| 74X | 18B5 | 18B4 | 18B3 | 18B2 | 18B1 | 038B |
| 75X | 1BA5 | 1BA4 | 1BA3 | 1BA2 | 1BA1 | 03BA |
| 76X | 1895 | 1894 | 1893 | 1892 | 1891 | 0389 |
| 77X | 1885 | 1884 | 1883 | 1882 | 1881 | 0388 |
| 78X | 1875 | 1874 | 1873 | 1872 | 1871 | 0387 |
| 79X | 1865 | 1864 | 1863 | 1862 | 1861 | 0386 |
| 7AX | 1855 | 1854 | 1853 | 1852 | 1851 | 0385 |
| 7BX | 1845 | 1844 | 1843 | 1842 | 1841 | 0384 |
| 7CX | 1835 | 1834 | 1833 | 1832 | 1831 | 0383 |
| 7DX | 1825 | 1824 | 1823 | 1822 | 1821 | 0382 |
| 7EX | 1815 | 1814 | 1813 | 1812 | 1811 | 0381 |
| 7FX | 0156 | 0157 | 01CC | 01CD | 01CE | 01CF |

TABLE 9

13-bit code words for 64/65 (0,7) code [Min Hwt = 4]

|  | 0 | 1 | 2 | 3 | 4 | 5 | 6 | 7 | 8 | 9 |
|---|---|---|---|---|---|---|---|---|---|---|
| 80X | 17FF | 17FE | 17FD | 17FC | 17FB | 17FA | 17F9 | 17F8 | 17F7 | 17F6 |
| 81X | 17EF | 17EE | 17ED | 17EC | 17EB | 17EA | 17E9 | 17E8 | 17E1 | 17E6 |
| 82X | 17DF | 17DE | 17DD | 17DC | 17DB | 17DA | 17D9 | 17D8 | 17D7 | 17D6 |
| 83X | 17CF | 17CE | 17CD | 17CC | 17CB | 17CA | 17C9 | 17C8 | 17C7 | 17C6 |
| 84X | 17BF | 17BE | 17BD | 17BC | 17BB | 17BA | 17B9 | 17B8 | 17B7 | 17B6 |
| 85X | 17AF | 17AE | 17AD | 17AC | 17AB | 17AA | 17A9 | 17A8 | 17A7 | 17A6 |
| 86X | 179F | 179E | 179D | 179C | 179B | 179A | 1799 | 1798 | 1797 | 1796 |
| 87X | 178F | 178E | 178D | 178C | 1788 | 17BA | 1789 | 1788 | 1787 | 1786 |
| 88X | 177F | 177E | 177D | 177C | 177B | 177A | 1779 | 1778 | 1777 | 1776 |
| 89X | 176F | 176E | 176D | 176C | 1786 | 17BA | 1769 | 1768 | 1767 | 1766 |
| 8AX | 175F | 175E | 175D | 175C | 175B | 175A | 1759 | 1758 | 1757 | 1756 |
| 8BX | 174F | 174E | 174D | 174C | 174B | 174A | 1749 | 1748 | 1747 | 1746 |
| 8CX | 173F | 173E | 173D | 173C | 173B | 173A | 1739 | 1738 | 1737 | 1736 |
| 8DX | 172F | 172E | 172D | 172C | 172B | 172A | 1729 | 1728 | 1727 | 1726 |
| 8EX | 171F | 171E | 171D | 171C | 171B | 171A | 1719 | 1718 | 1717 | 1716 |
| 8FX | 170F | 170E | 170D | 170C | 1708 | 170A | 1709 | 1708 | 1707 | 1706 |
| 90X | 16FF | 16FE | 16FD | 16FC | 16FB | 16FA | 16F9 | 16F8 | 16F7 | 16F6 |
| 91X | 16EF | 16EE | 16ED | 16EC | 16EB | 16EA | 16E9 | 16E8 | 16E7 | 16E6 |
| 92X | 16DF | 16DE | 16DD | 16DC | 16DB | 16DA | 16D9 | 16D8 | 16D7 | 16D5 |
| 93X | 16CF | 16CE | 16CD | 16CC | 16CB | 16CA | 16C9 | 16C8 | 16C7 | 16C6 |
| 94X | 16BF | 16BE | 16BD | 16BC | 16BB | 16BA | 1889 | 16B8 | 16B7 | 16B6 |
| 95X | 16AF | 16AE | 16AD | 16AC | 16AB | 16AA | 16A9 | 16A8 | 16A7 | 16A6 |
| 96X | 169F | 169E | 169D | 169C | 169B | 169A | 1699 | 1698 | 1697 | 1696 |
| 97X | 168F | 168E | 168D | 168C | 168B | 16BA | 1689 | 1688 | 1687 | 1686 |
| 98X | 167F | 167E | 167D | 167C | 1678 | 167A | 1679 | 1678 | 1677 | 1676 |
| 99X | 166F | 166E | 166D | 166C | 166B | 166A | 1669 | 1688 | 1667 | 1666 |

TABLE 9-continued

| 13-bit code words for 64/65 (0,7) code [Min Hwt = 4] | | | | | | | | | |
|---|---|---|---|---|---|---|---|---|---|
| 9AX | 165F | 165E | 165D | 165C | 165B | 165A | 1659 | 1658 | 1657 | 1656 |
| 9BX | 164F | 164E | 164D | 164C | 164B | 164A | 1649 | 1648 | 1647 | 1646 |
| 9CX | 163F | 163E | 163D | 163C | 163B | 163A | 1639 | 1636 | 1637 | 1636 |
| 9DX | 162F | 162E | 162D | 162C | 162B | 162A | 1629 | 1628 | 1627 | 1626 |
| 9EX | 161F | 161E | 161D | 161C | 161B | 161A | 1619 | 1618 | 1617 | 1616 |
| 9FX | 160F | 160E | 160D | 160C | 160B | 160A | 1609 | 1608 | 1607 | 1606 |
| A0X | 15FF | 15FE | 15FD | 15FC | 15FB | 15FA | 15F9 | 15F8 | 15F7 | 15F6 |
| A1X | 15EF | 15EE | 15ED | 15EC | 15EB | 15EA | 15E9 | 15E8 | 15E7 | 15E6 |
| A2X | 15DF | 15DE | 15DD | 15DC | 15DB | 15DA | 15D9 | 15D8 | 15D7 | 15D6 |
| A3X | 15CF | 15CE | 15CD | 15CC | 15CB | 15CA | 15C9 | 15C8 | 15C7 | 15C5 |
| A4X | 15BF | 15BE | 15BD | 15BC | 15BB | 15BA | 15B9 | 15B8 | 15B7 | 15B5 |
| A5X | 15AF | 15AE | 15AD | 15AC | 15AB | 15AA | 15A9 | 15A8 | 15A7 | 15A6 |
| A6X | 159F | 159E | 159D | 159C | 159B | 15AA | 1599 | 1598 | 1597 | 1596 |
| A7X | 15BF | 15BE | 158D | 15BC | 158B | 15BA | 1589 | 1588 | 1587 | 1566 |
| A8X | 157F | 157E | 157D | 157C | 157B | 157A | 1579 | 1578 | 1577 | 1576 |
| A9X | 156F | 156E | 156D | 15BC | 156B | 15BA | 1569 | 1568 | 1567 | 1566 |
| AAX | 155F | 155E | 155D | 155C | 155B | 155A | 1559 | 1558 | 1557 | 1556 |
| ABX | 154F | 154E | 154D | 154C | 154B | 154A | 1549 | 1548 | 1547 | 1546 |
| ACX | 153F | 153E | 153D | 153C | 153B | 155A | 1539 | 1538 | 1537 | 1536 |
| ADX | 152F | 152E | 152D | 152C | 152B | 152A | 1529 | 1528 | 1527 | 1526 |
| AEX | 151F | 151E | 151D | 151C | 151B | 151A | 1519 | 1518 | 1517 | 1516 |
| AFX | 150F | 150E | 150D | 150C | 150B | 150A | 1509 | 1508 | 1507 | 1506 |
| B0X | 14FF | 14FE | 14FD | 14FC | 14FB | 14FA | 14F9 | 14F8 | 14F7 | 14F6 |
| B1X | 14EF | 14EE | 14ED | 14EC | 14EB | 14EA | 14E9 | 14E8 | 14E7 | 14E6 |
| B2X | 14DF | 14DE | 14DD | 14DC | 14DB | 14DA | 14D9 | 14D8 | 14D7 | 14D6 |
| B3X | 14CF | 14CE | 14CD | 14CC | 14CB | 14CA | 14C9 | 14C8 | 14C7 | 14C5 |
| B4X | 14BF | 14BE | 14BD | 14BC | 14BB | 14BA | 14B9 | 14B8 | 14B7 | 14B6 |
| B5X | 14AF | 14AE | 14AD | 14AC | 14AB | 14AA | 14A9 | 14A8 | 14A7 | 14A6 |
| B6X | 149F | 149E | 149D | 149C | 149B | 149A | 1499 | 1498 | 1497 | 1496 |
| B7X | 148F | 148E | 148D | 148C | 148B | 148A | 1489 | 1488 | 1487 | 1486 |
| B8X | 147F | 147E | 147D | 147C | 147B | 147A | 1479 | 1478 | 1477 | 1476 |
| B9X | 146F | 146E | 146D | 146C | 146B | 14BA | 1469 | 1468 | 1467 | 1466 |
| BAX | 145F | 145E | 145D | 145C | 145B | 145A | 1459 | 1458 | 1457 | 1456 |
| BBX | 144F | 144E | 144D | 144C | 144B | 144A | 1449 | 1448 | 1447 | 1446 |
| BCX | 143F | 143E | 1433 | 143C | 143B | 1434 | 1439 | 1438 | 1437 | 1436 |
| BDX | 142F | 142E | 142D | 142C | 142B | 142A | 1429 | 1428 | 1427 | 1426 |
| BEX | 141F | 141E | 141D | 141C | 141B | 141A | 1419 | 1418 | 1417 | 1416 |
| BFX | 140F | 140E | 140D | 140C | 140B | 140A | 1409 | 0227 | 0198 | 0191 |

| | A | B | C | D | E | F |
|---|---|---|---|---|---|---|
| 80X | 17F5 | 17F4 | 17F3 | 17F2 | 17F1 | 037F |
| 81X | 17E5 | 17E4 | 17E3 | 17E2 | 17E1 | 037E |
| 82X | 17D5 | 17D4 | 17D3 | 17D2 | 17D1 | 17D1 |
| 83X | 17C5 | 17C4 | 17C3 | 17C2 | 17C1 | 037C |
| 84X | 17B5 | 17B4 | 17B3 | 17B2 | 17B1 | 037B |
| 85X | 17A5 | 17A4 | 17A3 | 17A2 | 17A1 | 037A |
| 86X | 1795 | 1794 | 1793 | 1792 | 1791 | 0379 |
| 87X | 1785 | 1784 | 1783 | 1782 | 1781 | 0378 |
| 88X | 1775 | 1774 | 1773 | 1772 | 1771 | 0377 |
| 89X | 1765 | 1764 | 1763 | 1762 | 1761 | 0376 |
| 8AX | 1755 | 1754 | 1753 | 1752 | 1751 | 0375 |
| 8BX | 1745 | 1744 | 1743 | 1742 | 1741 | 0374 |
| 8CX | 1735 | 1734 | 1733 | 1732 | 1731 | 0373 |
| 8DX | 1725 | 1724 | 1723 | 1722 | 1721 | 0372 |
| 8EX | 1715 | 1714 | 1713 | 1712 | 1711 | 0371 |
| 8FX | 1705 | 1704 | 1703 | 1702 | 0104 | 01D5 |
| 90X | 16F5 | 16F4 | 16F3 | 16F2 | 16F1 | 036F |
| 91X | 16E5 | 16E4 | 16E3 | 16E2 | 16E1 | 036E |
| 92X | 16D5 | 16D4 | 16D3 | 16D2 | 16D1 | 036D |
| 93X | 1BC5 | 16C4 | 16C3 | 16C2 | 16C1 | 036C |
| 94X | 16B5 | 16BA | 1BB3 | 1682 | 16B1 | 036B |
| 95X | 16A5 | 16A4 | 16A3 | 16A2 | 16A1 | 036A |
| 96X | 1695 | 1694 | 1693 | 1692 | 1691 | 0369 |
| 97X | 1685 | 1664 | 1683 | 1682 | 1681 | 0368 |
| 98X | 1675 | 1674 | 1673 | 1672 | 1671 | 0367 |
| 99X | 1665 | 1664 | 1663 | 1662 | 1661 | 0366 |
| 9AX | 1655 | 1654 | 1653 | 1652 | 1651 | 0365 |
| 9BX | 1645 | 1644 | 1643 | 1642 | 1641 | 0364 |
| 9CX | 1635 | 1634 | 1633 | 1632 | 1631 | 0363 |
| 9DX | 1625 | 1624 | 1623 | 1622 | 1621 | 0362 |
| 9EX | 1615 | 1614 | 1613 | 1612 | 1611 | 0361 |
| 9FX | 1605 | 1604 | 01D8 | 01D9 | 01DA | 01DB |
| A0X | 15F5 | 15F4 | 15F3 | 15F2 | 15F1 | 035F |
| A1X | 15E5 | 15E4 | 15E3 | 15E2 | 15E1 | 035E |
| A2X | 15D5 | 15D4 | 15D3 | 15D2 | 15D1 | 035D |
| A3X | 15C5 | 1504 | 15C3 | 15C2 | 15C1 | 035C |

TABLE 9-continued 13-bit code words for 64/65 (0,7) code [Min Hwt = 4]

| | | | | | | |
|---|---|---|---|---|---|---|
| A4X | 15B5 | 1584 | 15B3 | 15B2 | 15B1 | 035B |
| A5X | 15A5 | 15A4 | 15A3 | 15A2 | 15A1 | 035A |
| A6X | 1595 | 1594 | 1593 | 1592 | 1591 | 0359 |
| A7X | 1585 | 1564 | 1583 | 15B2 | 1581 | 0358 |
| A8X | 1575 | 1574 | 1573 | 1572 | 1571 | 0357 |
| A9X | 1565 | 1564 | 1563 | 1562 | 1561 | 0356 |
| AAX | 1555 | 1554 | 1553 | 1552 | 1551 | 0355 |
| ABX | 1545 | 1544 | 1543 | 1542 | 1541 | 0354 |
| ACX | 1535 | 1534 | 1533 | 1532 | 1531 | 0353 |
| ADX | 1525 | 1524 | 1523 | 1522 | 1521 | 0352 |
| AEX | 1515 | 1514 | 1513 | 1512 | 1511 | 0351 |
| AFX | 1505 | 1504 | 1503 | 1502 | 01D5 | 01D7 |
| B0X | 14F5 | 14F4 | 14F3 | 14F2 | 14F1 | 034F |
| B1X | 14E5 | 14E4 | 14E3 | 14E2 | 14E1 | 034E |
| B2X | 14D5 | 14D4 | 14D3 | 14D2 | 14D1 | 034D |
| B3X | 14C5 | 1404 | 14C3 | 14C2 | 14C1 | 034C |
| B4X | 14B5 | 1484 | 14B5 | 14B2 | 14B1 | 034B |
| B5X | 14A5 | 14A4 | 14A3 | 14A2 | 14A1 | 034A |
| B6X | 1495 | 1494 | 1493 | 1492 | 1491 | 0349 |
| B7X | 1485 | 1484 | 1483 | 1482 | 1481 | 0348 |
| B8X | 1475 | 1474 | 1473 | 1472 | 1471 | 0347 |
| B9X | 1465 | 1464 | 1463 | 1462 | 1461 | 0346 |
| BAX | 1455 | 1454 | 1453 | 1452 | 1451 | 0345 |
| BBX | 1445 | 1444 | 1443 | 1442 | 1441 | 0344 |
| BCX | 1435 | 1434 | 1433 | 1432 | 1431 | 0343 |
| BDX | 1425 | 1424 | 1423 | 1422 | 1421 | 0342 |
| BEX | 1415 | 1414 | 1413 | 1412 | 1411 | 0341 |
| BFX | 0192 | 0193 | 01DC | 01DD | 01DE | 01DF |

TABLE 10

13-bit code words for 64/65 (0,7) code [Min Hwt = 4]

| | 0 | 1 | 2 | 3 | 4 | 5 | 6 | 7 | 8 | 9 |
|---|---|---|---|---|---|---|---|---|---|---|
| C0X | 13FF | 13FE | 13FD | 13FC | 13FB | 13FA | 13F9 | 13F8 | 13F7 | 13F6 |
| C1X | 13EF | 13EE | 13ED | 13EC | 13EB | 13EA | 13E9 | 13E8 | 13E7 | 13E6 |
| C2X | 13DF | 13DE | 13DD | 13DC | 13DB | 13DA | 13D9 | 13D8 | 13D7 | 13D6 |
| C3X | 13CF | 13CE | 13CD | 13CC | 13CB | 13CA | 13C9 | 13C8 | 13C7 | 13C6 |
| C4X | 13BF | 13BE | 13BD | 13BC | 13BB | 13BA | 13B9 | 13B8 | 13B7 | 13B6 |
| C5X | 13AF | 13AE | 13AD | 13AC | 13AB | 13AA | 13A9 | 13A8 | 13A7 | 13A6 |
| C6X | 139F | 139E | 139D | 139C | 139B | 139A | 1399 | 1398 | 1397 | 1396 |
| C7X | 138F | 138E | 138D | 138C | 138B | 138A | 1389 | 1388 | 1387 | 1386 |
| C8X | 137F | 137E | 137D | 137C | 137B | 137A | 1379 | 1378 | 1377 | 1376 |
| C9X | 136F | 136E | 136D | 136C | 136B | 136A | 1369 | 1368 | 1367 | 1366 |
| CAX | 135F | 135E | 135D | 135C | 135B | 135A | 1359 | 1358 | 1357 | 1356 |
| CBX | 134F | 134E | 134D | 134C | 134B | 134A | 1349 | 1348 | 1347 | 1346 |
| CCX | 133F | 133E | 133D | 133C | 133B | 133A | 1339 | 1338 | 1337 | 1336 |
| CDX | 132F | 132E | 132D | 132C | 132B | 132A | 1329 | 1328 | 1327 | 1326 |
| CEX | 131F | 131E | 131D | 131C | 131B | 131A | 1319 | 1318 | 1317 | 1316 |
| CFX | 130F | 130E | 130D | 130C | 130B | 130A | 1309 | 1308 | 1307 | 1306 |
| D0X | 12FF | 12FE | 12FD | 12FC | 12FB | 12FA | 12F9 | 12F8 | 12F7 | 12F6 |
| D1X | 12EF | 12EE | 12ED | 12EC | 12EB | 12EA | 12E9 | 12E8 | 12E7 | 12E6 |
| D2X | 12DF | 12DE | 12DD | 12DC | 12DB | 12DA | 12D9 | 12D8 | 12D7 | 12D6 |
| D3X | 12CF | 12CE | 12CD | 12CC | 12CB | 12CA | 12C9 | 12C8 | 12C7 | 12C6 |
| D4X | 12BF | 12BE | 12BD | 12BC | 12BB | 12BA | 12B9 | 12B8 | 12B7 | 12B6 |
| D5X | 12AF | 12AE | 12AD | 12AC | 12AB | 12AA | 12A9 | 12A8 | 12A7 | 12A6 |
| D6X | 129F | 129E | 129D | 129C | 129B | 129A | 1299 | 1298 | 1297 | 1296 |
| D7X | 128F | 128E | 128D | 128C | 12BB | 128A | 1289 | 1288 | 1287 | 1286 |
| D8X | 127F | 127E | 127D | 127C | 127B | 127A | 1279 | 1278 | 1277 | 1276 |
| D9X | 126F | 126E | 126D | 126C | 126B | 126A | 1269 | 1268 | 1267 | 1266 |
| DAX | 125F | 125E | 125D | 125C | 125B | 125A | 1259 | 1258 | 1257 | 1256 |
| DBX | 124F | 124E | 124D | 124C | 124B | 124A | 1249 | 1248 | 1247 | 1246 |
| DCX | 123F | 123E | 123D | 123C | 123B | 123A | 1239 | 1238 | 1237 | 1236 |
| DDX | 122F | 122E | 122D | 122C | 122B | 122A | 1229 | 1228 | 1227 | 1226 |
| DEX | 121F | 121E | 121D | 121C | 121B | 121A | 1219 | 1218 | 1217 | 1216 |
| DFX | 120F | 120E | 120D | 120C | 120B | 120A | 1209 | 0159 | 1207 | 1206 |
| E0X | 11FF | 11FE | 11FD | 11FC | 11FB | 11FA | 11F9 | 11F8 | 11F7 | 11F6 |
| E1X | 11EF | 11EE | 11ED | 11EC | 11EB | 11EA | 11E9 | 11E8 | 11E7 | 11E6 |
| E2X | 11DE | 11DE | 11DD | 11DC | 11DB | 11DA | 11D9 | 11D8 | 11D7 | 11D6 |
| E3X | 11CF | 11CE | 11CD | 11CC | 11CB | 11CA | 11C9 | 11C8 | 11C7 | 11C6 |
| E4X | 11BF | 11BE | 11BD | 11BC | 11BB | 11BA | 11B9 | 11B8 | 11B7 | 11B6 |
| E5X | 11AF | 11AE | 11AD | 11AC | 11AB | 11AA | 11A9 | 11A8 | 11A7 | 11A6 |
| E6X | 119F | 119E | 119D | 119C | 119B | 119A | 1199 | 1198 | 1197 | 1196 |

TABLE 10-continued

| | | | 13-bit code words for 64/65 (0,7) code [Min Hwt = 4] | | | | | | |
|---|---|---|---|---|---|---|---|---|---|
| E7X | 118F | 118E | 118D | 11BC | 118B | 118A | 1189 | 1188 | 1187 | 1186 |
| E8X | 117F | 117E | 117D | 117C | 117B | 117A | 1179 | 1178 | 1177 | 1176 |
| E9X | 116F | 116E | 116D | 116C | 116B | 11BA | 1169 | 1168 | 1167 | 1166 |
| EAX | 115F | 115E | 115D | 115C | 115B | 115A | 1159 | 1158 | 1157 | 1156 |
| EBX | 114F | 114E | 114D | 114C | 114B | 114A | 1149 | 1148 | 1147 | 1146 |
| ECX | 113F | 113E | 113D | 113C | 113B | 113A | 1139 | 1138 | 1137 | 1136 |
| EDX | 112F | 112E | 112D | 112C | 112B | 112A | 1129 | 1128 | 1127 | 1126 |
| EEX | 111F | 111E | 111D | 111C | 111B | 111A | 1119 | 1118 | 1117 | 1116 |
| EFX | 110F | 110E | 110D | 110C | 110B | 110A | 1109 | 015A | 1107 | 1106 |
| F0X | 10FF | 10FE | 10FD | 10FC | 10FB | 10FA | 10F9 | 10F8 | 10F7 | 10F6 |
| F1X | 10EF | 10EE | 10ED | 10EC | 10EB | 10EA | 10E9 | 10E8 | 10E7 | 10E6 |
| F2X | 10DF | 10DE | 10DD | 10DC | 10DB | 10DA | 10D9 | 10D8 | 10D7 | 10D6 |
| F3X | 10CF | 10CE | 10CD | 10CC | 10CB | 10CA | 10C9 | 10C8 | 10C7 | 10C6 |
| F4X | 10BF | 10BE | 10BD | 10BC | 10BB | 10BA | 10B9 | 10B8 | 10B7 | 10B6 |
| F5X | 10AF | 10AE | 10AD | 10AC | 10AB | 10AA | 10A9 | 10A8 | 10A7 | 10A6 |
| F6X | 109F | 109E | 109D | 10DC | 109B | 109A | 1099 | 109B | 1097 | 1096 |
| F7X | 108F | 108E | 108D | 108C | 108B | 108A | 1089 | 015F | 1087 | 1086 |
| F8X | 107F | 107E | 107D | 107C | 107B | 107A | 1079 | 1078 | 1077 | 1076 |
| F9X | 106F | 106E | 106D | 106C | 106B | 10BA | 1069 | 1068 | 1067 | 1066 |
| FAX | 105F | 105E | 105D | 105C | 105B | 105A | 1059 | 1058 | 1057 | 1056 |
| FBX | 104F | 104E | 104D | 104C | 104B | 104A | 1049 | 015C | 1047 | 1046 |
| FCX | 103F | 103E | 103D | 103C | 103B | 103A | 1039 | 1038 | 1037 | 1036 |
| FDX | 102F | 102E | 102D | 102C | 102B | 102A | 1029 | 015D | 1027 | 1026 |
| FEX | 011F | 011E | 011D | 011C | 011B | 011A | 0119 | 015E | 0117 | 0116 |
| FFX | 012F | 012E | 012D | 012C | 012B | 012A | 0129 | 015B | 0127 | 0126 |

| | A | B | C | D | E | F |
|---|---|---|---|---|---|---|
| C0X | 13F5 | 13F4 | 13F3 | 13F2 | 13F1 | 033F |
| C1X | 13E5 | 13E4 | 13E3 | 13E2 | 13E1 | 033E |
| C2X | 13D5 | 13D4 | 13D3 | 13D2 | 13D1 | 033D |
| C3X | 13C5 | 13C4 | 13C3 | 13C2 | 13C1 | 033C |
| C4X | 13B5 | 13B4 | 13B3 | 13B2 | 13B1 | 033B |
| C5X | 13A5 | 1344 | 13A3 | 13A2 | 13A1 | 033A |
| C6X | 1395 | 1394 | 1393 | 1392 | 1391 | 0339 |
| C7X | 1385 | 1384 | 1383 | 1382 | 1381 | 0338 |
| C8X | 1375 | 1374 | 1373 | 1372 | 1371 | 0337 |
| C9X | 1365 | 1384 | 1363 | 1362 | 1361 | 0336 |
| CAX | 1355 | 1354 | 1353 | 1352 | 1351 | 0335 |
| CBX | 1345 | 1344 | 1343 | 1342 | 1341 | 0334 |
| CCX | 1335 | 1334 | 1333 | 1332 | 1331 | 0333 |
| CDX | 1325 | 1324 | 1323 | 1322 | 1321 | 0332 |
| CEX | 1315 | 1314 | 1313 | 1312 | 1311 | 0331 |
| CFX | 1305 | 1304 | 1303 | 1302 | 0168 | 0178 |
| D0X | 12F5 | 12F4 | 12F3 | 12F2 | 12F1 | 032F |
| D1X | 12E5 | 12E4 | 12E3 | 12E2 | 12E1 | 032E |
| D2X | 12D5 | 12D4 | 12D3 | 12D2 | 12D1 | 032D |
| D3X | 12C5 | 12C4 | 12C3 | 12C2 | 12C1 | 032C |
| D4X | 12B5 | 12B4 | 12B3 | 12B2 | 12B1 | 032B |
| D5X | 12A5 | 12A4 | 12A3 | 12A2 | 12A1 | 032A |
| D6X | 1295 | 1294 | 1293 | 1292 | 1291 | 0329 |
| D7X | 1285 | 1284 | 1283 | 1282 | 1281 | 0328 |
| D8X | 1275 | 1274 | 1273 | 1272 | 1271 | 0327 |
| D9X | 1265 | 1264 | 1263 | 1262 | 1261 | 0326 |
| DAX | 1255 | 1254 | 1253 | 1252 | 1251 | 0325 |
| DBX | 1245 | 1244 | 1243 | 1242 | 1241 | 0324 |
| DCX | 1235 | 1234 | 1233 | 1232 | 1231 | 0323 |
| DDX | 1225 | 1224 | 1223 | 1222 | 1221 | 0322 |
| DEX | 1215 | 1214 | 1213 | 1212 | 1211 | 0321 |
| DFX | 1205 | 0161 | 010D | 0171 | 0169 | 0179 |
| E0X | 11F5 | 11F4 | 11F3 | 11F2 | 11F1 | 031F |
| E1X | 11E5 | 11E4 | 11E3 | 11E2 | 11E1 | 031E |
| E2X | 11D5 | 11D4 | 11D3 | 11D2 | 11D1 | 031D |
| E3X | 11C5 | 11C4 | 11C3 | 11C2 | 11C1 | 031C |
| E4X | 11B5 | 11B4 | 11B3 | 11B2 | 11B1 | 031B |
| E5X | 11A5 | 11A4 | 11A3 | 11A2 | 11A1 | 031A |
| E6X | 1195 | 1194 | 1193 | 1192 | 1191 | 0319 |
| E7X | 1185 | 1184 | 1183 | 1182 | 1181 | 0318 |
| E8X | 1175 | 1174 | 1173 | 1172 | 1171 | 0317 |
| E9X | 1165 | 1164 | 1163 | 1162 | 1161 | 0316 |
| EAX | 1155 | 1154 | 1153 | 1152 | 1151 | 0315 |
| EBX | 1145 | 1144 | 1143 | 1142 | 1141 | 0314 |
| ECX | 1135 | 1134 | 1133 | 1132 | 1131 | 0313 |
| EDX | 1125 | 1124 | 1123 | 1122 | 1121 | 0312 |
| EEX | 1115 | 1114 | 1113 | 1112 | 1111 | 0311 |
| EFX | 1105 | 0162 | 1103 | 0172 | 01BA | 017A |
| F0X | 10F5 | 10F4 | 10F3 | 10F2 | 10F1 | 030F |

TABLE 10-continued 13-bit code words for 64/65 (0,7) code [Min Hwt = 4]

|     |      |      |      |      |      |      |
|-----|------|------|------|------|------|------|
| F1X | 10E5 | 10E4 | 10E3 | 10E2 | 10E1 | 030E |
| F2X | 10D5 | 1004 | 10D3 | 10D2 | 10D1 | 030D |
| F3X | 10C5 | 10C4 | 10C3 | 10C2 | 10C1 | 03DC |
| F4X | 10B5 | 10B4 | 10B3 | 10B2 | 10B1 | 030B |
| F5X | 10A5 | 10A4 | 10A3 | 10A2 | 10A1 | 030A |
| F6X | 1095 | 1094 | 1093 | 1092 | 1091 | 0309 |
| F7X | 1085 | 0167 | 1083 | 0177 | 016F | 017F |
| F8X | 1075 | 1074 | 1073 | 1072 | 1071 | 0307 |
| F9X | 1065 | 1064 | 1063 | 1062 | 1061 | 0306 |
| FAX | 1055 | 1054 | 1053 | 1052 | 1051 | 0305 |
| FBX | 1045 | 0164 | 1043 | 0174 | 016C | 017C |
| FCX | 1035 | 1034 | 1033 | 1032 | 1031 | 0303 |
| FDX | 1025 | 0165 | 1023 | 0175 | 016D | 017D |
| FEX | 0115 | 0166 | 0113 | 0176 | 016E | 017E |
| FFX | 0125 | 0163 | 0123 | 0173 | 016B | 017B |

TABLE 11

13-bit code words for 64/65 (0,7) code [Min Hwt = 4]

|     | 0 | 1 | 2 | 3 | 4 | 5 | 6 | 7 | 8 | 9 |
|-----|------|------|------|------|------|------|------|------|------|------|
| 100X | 0FFF | 0FFE | 0FFD | 0FFC | 0FFB | 0FFA | 0FF9 | 0FFB | 0FF7 | 0FF6 |
| 100X | 0FEF | 0FEE | 0FED | 0FEC | 0FEB | 0FEA | 0FE9 | 0FEB | 0FE7 | 0EE6 |
| 102X | 0FDF | 0FDE | 0FDD | 0FDC | 0FDB | 0FDA | 0FD9 | 0FD8 | 0FD7 | 0FD6 |
| 103X | 0FCF | 0FCE | 0FCD | 0FCC | 0FCB | 0FCA | 0FC9 | 0FC8 | 0FC7 | 0FC6 |
| 104X | 0FBF | 0FBE | 0FBD | 0FBC | 0FBB | 0FBA | 0FB9 | 0FBB | 0FB7 | 0FB6 |
| 105X | 0FAF | 0FAE | 0FAD | 0FAC | 0FAB | 0FAA | 0FA9 | 0FA8 | 0FA7 | 0FA6 |
| 106X | 0F9F | 0F9E | 0F9D | 0F9C | 0F9B | 0F9A | 0F99 | 0F98 | 0F97 | 0F96 |
| 107X | 0F8F | 0F8E | 0F8D | 0F8C | 0F8B | 0F8A | 0F89 | 0F88 | 0F87 | 0F88 |
| 108X | 0F7F | 0F7E | 0F7D | 0F7C | 0F7B | 0F7A | 0F79 | 0F78 | 0F77 | 0F76 |
| 109X | 0F6F | 0F6E | 0F6D | 0F6C | 0F6B | 0F6A | 0F69 | 0F68 | 0F67 | 0F66 |
| 10AX | 0F5F | 0F5E | 0F5D | 0F5C | 0F5B | 0F5A | 0F59 | 0F58 | 0F57 | 0F56 |
| 10BX | 0F4F | 0F4E | 0F4D | 0F4C | 0F4B | 0F4A | 0F49 | 0F4B | 0F47 | 0F46 |
| 10CX | 0F3F | 0F3E | 0F3D | 0F3C | 0F3B | 0F3A | 0F39 | 0F38 | 0F37 | 0F36 |
| 10DX | 0F2F | 0F2E | 0F2D | 0F2C | 0F2B | 0F2A | 0F29 | 0F28 | 0F27 | 0F26 |
| 10EX | 0F1F | 0F1E | 0F1D | 0F1C | 0F1B | 0F1A | 0F19 | 0F18 | 0F17 | 0F16 |
| 10FX | 0F0F | 0F0E | 0F0D | 0F0C | 0F0B | 0F0A | 0F09 | 0F08 | 0F07 | 0F06 |
| 110X | 0EFF | 0EFE | 0EFD | 0EFC | 0EFB | 0EFA | 0EF9 | 0EF8 | 0EF7 | 0EF6 |
| 111X | 0EEF | 0EEE | 0EED | 0EEC | 0EEB | 0EEA | 0EE9 | 0EE8 | 0EE7 | 0EE6 |
| 112X | 0EDF | 0EDE | 0EDD | 0EDC | 0EDB | 0EDA | 0ED9 | 0ED8 | 0ED7 | 0ED6 |
| 113X | 0ECF | 0ECE | 0ECD | 0ECC | 0ECB | 0ECA | 0EC9 | 0EC8 | 0EC7 | 0EC6 |
| 114X | 0EBF | 0EBE | 0EBD | 0EBC | 0EBB | 0EBA | 0EB9 | 0EB8 | 0EB7 | 0EB6 |
| 115X | 0EAF | 0EAE | 0EAD | 0EAC | 0EAB | 0EAA | 0EA9 | 0EA8 | 0EA7 | 0EA6 |
| 116X | 0E9F | 0E9E | 0E9D | 0E9C | 0E9B | 0E9A | 0E99 | 0E98 | 0E97 | 0E96 |
| 117X | 0E8F | 0E8E | 0E8D | 0E8C | 0E8B | 0E8A | 0E89 | 0E88 | 0E87 | 0E86 |
| 118X | 0E7F | 0E7E | 0E7D | 0E7C | 0E7B | 0E7A | 0E79 | 0E78 | 0E77 | 0E7B |
| 119X | 0E6F | 0E6E | 0EBD | 0E6C | 0E6B | 0E6A | 0E69 | 0E68 | 0E67 | 0E66 |
| 11AX | 0E5F | 0E5E | 0E5D | 0E5C | 0E5B | 0E5A | 0E59 | 0E58 | 0E57 | 0E56 |
| 11BX | 0E4F | 0E4E | 0E4D | 0E4C | 0E4B | 0E4A | 0E49 | 0E48 | 0E47 | 0E46 |
| 11CX | 0E3F | 0E3E | 0E3D | 0E3C | 0E3B | 0E3A | 0E39 | 0E38 | 0E37 | 0E36 |
| 11DX | 0E2F | 0E2E | 0E2D | 0E2C | 0E2B | 0E2A | 0E29 | 0E28 | 0E27 | 0E26 |
| 11EX | 0E1F | 0E1E | 0E1D | 0E1C | 0E1B | 0E1A | 0E19 | 0E18 | 0E17 | 0E16 |
| 11FX | 0E0F | 0E0E | 0E0D | 0E0C | 0E0B | 0E0A | 0E09 | 0E08 | 0E07 | 0E06 |
| 120X | 0DFF | 0DFE | 0DFD | 0DFC | 0DFB | 0DFA | 0DF9 | 0DF8 | 0DF7 | 0DFB |
| 121X | 0DEF | 0DEE | 0DED | 0DEC | 0DEB | 0DEA | 0DE9 | 0DE8 | 0DE7 | 0DE6 |
| 122X | 0DDF | 0DDE | 0DDD | 0DDC | 0DDB | 0DDA | 0DD9 | 0DD8 | 0DD7 | 0DD6 |
| 123X | 0DCF | 0DCE | 0DCD | 0DCC | 0DCB | 0DCA | 0DC9 | 0DC8 | 0DC7 | 0DC6 |
| 124X | 0DBF | 0DBE | 0DBD | 0DBC | 0DBB | 0DBA | 0DB9 | 0DB8 | 0DB7 | 0DB6 |
| 125X | 0DAF | 0DAE | 0DAD | 0DAC | 0DAB | 0DAA | 0DA9 | 0DA8 | 0DA7 | 0DA6 |
| 126X | 0D9F | 0D9E | 0D9D | 0D9C | 0D9B | 0D9A | 0D99 | 0D98 | 0D97 | 0D96 |
| 127X | 0D8F | 0DBE | 0D8D | 0D8C | 0DBB | 0DBA | 0DB9 | 0DB8 | 0D87 | 0D86 |
| 128X | 0D7F | 0D7E | 0D7D | 0D7C | 0D7B | 0D7A | 0D79 | 0D78 | 0D77 | 0D76 |
| 129X | 0D6F | 0D6E | 0D6D | 0D6C | 0D6B | 0D6A | 0D69 | 0D68 | 0D67 | 0D66 |
| 12AX | 0D5F | 0D5E | 0D5D | 0D5C | 0D5B | 0D5A | 0D59 | 0D58 | 0D57 | 0D56 |
| 12BX | 0D4F | 0D4E | 0D4D | 0D4C | 0D4B | 0D4A | 0D49 | 0D48 | 0D47 | 0D46 |
| 12CX | 0D3F | 0D3E | 0D3D | 0D3C | 0D3B | 0D3A | 0D39 | 0D38 | 0D37 | 0D36 |
| 12DX | 0D2F | 0D2E | 0D2D | 0D2C | 0D2B | 0D2A | 0D29 | 0D28 | 0D27 | 0D26 |
| 12EX | 0D1F | 0D1E | 0D1D | 0D1C | 0D1B | 0D1A | 0D19 | 0D18 | 0D17 | 0D16 |
| 12FX | 0D0F | 0D0E | 0D0D | 0D0C | 0D0B | 0D0A | 0D09 | 0D08 | 0D07 | 0D06 |
| 130X | 0CFF | 0CFE | 0CFD | 0CFC | 0CFB | 0CFA | 0CF9 | 0CF8 | 0CF7 | 0CF6 |
| 131X | 0CEF | 0CEE | 0CED | 0CEC | 0CEB | 0CEA | 0CE9 | 0CE8 | 0CE7 | 0CE6 |
| 132X | 0CDF | 0CDE | 0CDD | 0CDC | 0CDB | 0CDA | 0CD9 | 0CD8 | 0CD7 | 0CD6 |
| 133X | 0CCF | 0CCE | 0CCD | 0CCC | 0CCB | 0CCA | 0CC9 | 0CC8 | 0CC7 | 0CC6 |

TABLE 11-continued 13-bit code words for 64/65 (0,7) code [Min Hwt = 4]

| | | | | | | | | | |
|---|---|---|---|---|---|---|---|---|---|
| 134X | 0CBF | 0CBE | 0CBD | 0CBC | 0CBB | 0CBA | 0CB9 | 0CB8 | 0CB7 | 0CB6 |
| 135X | 0CAF | 0CAE | 0CAD | 0CAC | 0CAB | 0CAA | 0CA9 | 0CA8 | 0CA7 | 0CA6 |
| 136X | 0C9F | 0C9E | 0C9D | 0C9C | 0C9B | 0C9A | 0C99 | 0C98 | 0C97 | 0C96 |
| 137X | 0C8F | 0C8E | 0C8D | 0C8C | 0C8B | 0C8A | 0C89 | 0C88 | 0C87 | 0C86 |
| 138X | 0C7F | 0C7E | 0C7D | 0C7C | 0C7B | 0C7A | 0C79 | 0C78 | 0C77 | 0C76 |
| 139X | 0C6F | 0C6E | 0C6D | 0C6C | 0C6B | 0C6A | 0C69 | 0C68 | 0C67 | 0C66 |
| 13AX | 0C5F | 0C5E | 0C5D | 0C5C | 0C5B | 0C5A | 0C59 | 0C58 | 0C57 | 0C56 |
| 13BX | 0C4F | 0C4E | 0C4D | 0C4C | 0C4B | 0C4A | 0C49 | 0C48 | 0C47 | 0C46 |
| 13CX | 0C3F | 0C3E | 0C3D | 0C3C | 0C3B | 0C3A | 0C39 | 0C38 | 0C37 | 0C36 |
| 13DX | 0C2F | 0C2E | 0C2D | 0C2C | 0C2B | 0C2A | 0C29 | 0C28 | 0C27 | 0C26 |
| 13EX | 0C1F | 0C1E | 0C1D | 0C1C | 0C1B | 0C1A | 0C19 | 0C18 | 0C17 | 0C16 |
| 13FX | 0C0F | 0C0E | 0C0D | 0C0C | 0C0B | 0C0A | 0C09 | 0207 | 0194 | 0195 |

| | A | B | C | D | E | F |
|---|---|---|---|---|---|---|
| 100X | 0FF5 | 0FF4 | 0FF3 | 0FF2 | 0FF1 | 02FF |
| 100X | 0FE5 | 0FE4 | 0FE3 | 0FE2 | 0FE1 | 02FE |
| 102X | 0FD5 | 0FD4 | 0FD3 | 0FD2 | 0FD1 | 02FD |
| 103X | 0FC5 | 0FC4 | 0FC3 | 0FC2 | 0FC1 | 02FC |
| 104X | 0FB5 | 0FB4 | 0FB3 | 0FE2 | 0FB1 | 02FB |
| 105X | 0FA5 | 0FA4 | 0FA3 | 0FA2 | 0FA1 | 02FA |
| 106X | 0F95 | 0F94 | 0F93 | 0F92 | 0F91 | 02F9 |
| 107X | 0F85 | 0F84 | 0F83 | 0FB2 | 0F81 | 02FB |
| 108X | 0F75 | 0F74 | 0F73 | 0F72 | 0F71 | 02F7 |
| 109X | 0F65 | 0F64 | 0F63 | 0F62 | 0FB1 | 02F6 |
| 10AX | 0F55 | 0F54 | 0F53 | 0F52 | 0F51 | 02F5 |
| 10BX | 0F45 | 0F44 | 0F43 | 0F42 | 0F41 | 02F4 |
| 10CX | 0F35 | 0F34 | 0F33 | 0F32 | 0F31 | 02F3 |
| 10DX | 0F25 | 0F24 | 0F23 | 0F22 | 0F21 | 02F2 |
| 10EX | 0F15 | 0F14 | 0F13 | 0F12 | 0F11 | 02F1 |
| 10FX | 0F05 | 0F04 | 0F03 | 0F02 | 0234 | 0235 |
| 110X | 0EF5 | 0EF4 | 0EF3 | 0EF2 | 0EF1 | 02EF |
| 111X | 0EE5 | 0EE4 | 0EE3 | 0EE2 | 0EE1 | 02EE |
| 112X | 0ED5 | 0ED4 | 0ED3 | 0ED2 | 0ED1 | 02ED |
| 113X | 0EC5 | 0EC4 | 0EC3 | 0EC2 | 0EC1 | 02EC |
| 114X | 0EB5 | 0EB4 | 0EB3 | 0EB2 | 0EB1 | 02EB |
| 115X | 0EA5 | 0EA4 | 0EA3 | 03A2 | 0EA1 | 02EA |
| 116X | 0E95 | 0E94 | 0E93 | 0E92 | 0E91 | 02E9 |
| 117X | 0E85 | 0E84 | 0E83 | 0E82 | 0E81 | 02E8 |
| 118X | 0E75 | 0E74 | 0E73 | 0E72 | 0E71 | 02E7 |
| 119X | 0E65 | 0E64 | 0E63 | 0E62 | 0E61 | 02E6 |
| 11AX | 0E55 | 0E54 | 0E53 | 0E52 | 0E51 | 02E5 |
| 11BX | 0E45 | 0E44 | 0E43 | 0E42 | 0E41 | 02E4 |
| 11CX | 0E35 | 0E34 | 0E33 | 0E32 | 0E31 | 02E3 |
| 11DX | 0E25 | 0E24 | 0E23 | 0E22 | 0E21 | 02E2 |
| 11EX | 0E15 | 0E14 | 0E13 | 0E12 | 0E11 | 02E1 |
| 11FX | 0E05 | 0E04 | 0238 | 0239 | 023A | 023B |
| 120X | 0DF5 | 0DF4 | 0DF3 | 0DF2 | 0DF1 | 02DF |
| 121X | 0DE5 | 0DE4 | 0DE3 | 0DE2 | 0DE1 | 02DE |
| 122X | 0DD5 | 0DD4 | 0DD3 | 0DD2 | 0DD1 | 02DD |
| 123X | 0DC5 | 0DC4 | 0DC3 | 0DC2 | 0DC1 | 02DC |
| 124X | 0DB5 | 0DB4 | 0DB3 | 0DB2 | 0DB1 | 02DB |
| 125X | 0DA5 | 0DA4 | 0DA3 | 0DA2 | 0DA1 | 02DA |
| 126X | 0D95 | 0D94 | 0D93 | 0D92 | 0D91 | 02D9 |
| 127X | 0D85 | 0D84 | 0DB3 | 0D62 | 0DB1 | 02D8 |
| 12BX | 0D75 | 0D74 | 0D73 | 0D72 | 0D71 | 02D7 |
| 129X | 0D65 | 0D64 | 0D63 | 0D62 | 0D61 | 0206 |
| 12AX | 0D55 | 0D54 | 0D53 | 0D52 | 0D51 | 02D5 |
| 12BX | 0D45 | 0D44 | 0D43 | 0D42 | 0D41 | 02D4 |
| 12CX | 0D35 | 0D34 | 0D33 | 0D32 | 0D31 | 02D3 |
| 12DX | 0D25 | 0D24 | 0D23 | 0D22 | 0D21 | 02D2 |
| 12EX | 0D15 | 0D14 | 0D13 | 0D12 | 0D11 | 02D1 |
| 12FX | 0D05 | 0D04 | 0D03 | 0D02 | 0236 | 0237 |
| 130X | 0CF5 | 0CF4 | 0CF3 | 0CF2 | 0CF1 | 02CF |
| 131X | 0CE5 | 0CE4 | 0CE3 | 0CE2 | 0CE1 | 02CE |
| 132X | 0CD5 | 0CD4 | 0CD3 | 0CD2 | 0CD1 | 02CD |
| 133X | 0CC5 | 0CC4 | 0CC3 | 0CC2 | 0CC1 | 02CC |
| 134X | 0CB5 | 0CB4 | 0CB3 | 0CB2 | 0CB1 | 02CB |
| 135X | 0CA5 | 0CA4 | 0CA3 | 0CA2 | 0CA1 | 02CA |
| 136X | 0C95 | 0C94 | 0C93 | 0C92 | 0C91 | 02C9 |
| 137X | 0C85 | 0C84 | 0C83 | 0C82 | 0C81 | 02C8 |
| 138X | 0C75 | 0C74 | 0C73 | 0C72 | 0C71 | 02C7 |
| 139X | 0C65 | 0C64 | 0C63 | 0C62 | 0C61 | 02C6 |
| 13AX | 0C55 | 0C54 | 0C53 | 0C52 | 0C51 | 02C5 |
| 13BX | 0C45 | 0C44 | 0C43 | 0C42 | 0C41 | 02C4 |
| 13CX | 0C35 | 0C34 | 0C33 | 0C32 | 0C31 | 02C3 |
| 13DX | 0C25 | 0C24 | 0C23 | 0C22 | 0C21 | 02C2 |

TABLE 11-continued

13-bit code words for 64/65 (0,7) code [Min Hwt = 4]

| | | | | | | |
|---|---|---|---|---|---|---|
| 13EX | 0C15 | 0C14 | 0C13 | 0C12 | 0C11 | 02C1 |
| 13FX | 0196 | 0197 | 023C | 023D | 023E | 023F |

TABLE 12

13-bit code words for 64/65 (0,7) code [Min Hwt = 4]

| | 0 | 1 | 2 | 3 | 4 | 5 | 6 | 7 | 8 | 9 |
|---|---|---|---|---|---|---|---|---|---|---|
| 140X | 0BFF | 0BFE | 0BFD | 0BFC | 0BFB | 0BFA | 0BF9 | 0BF8 | 0BF7 | 0BF6 |
| 141X | 0BEF | 0BEE | 0BED | 0BEC | 0BEB | 0BEA | 0BE9 | 0BE8 | 0BE7 | 0BE6 |
| 142X | 0BDF | 0BDE | 0BDD | 0BDC | 0BDB | 0BDA | 0BD9 | 0BD8 | 0BD7 | 0BD6 |
| 143X | 0BCF | 0BCE | 0BCD | 0BCC | 0BCB | 0BCA | 0BC9 | 0BC8 | 0BC7 | 0BC6 |
| 144X | 0BBF | 0BBE | 0BBD | 0BBC | 0BBB | 0BBA | 0BB9 | 0BB8 | 0BB7 | 0BB6 |
| 145X | 0BAF | 0BAE | 0BAD | 0BAC | 0BAB | 0BAA | 0BA9 | 0BA8 | 0BA7 | 0BA6 |
| 146X | 0B9F | 0B9E | 0B9D | 0B9C | 0B9B | 0B9A | 0B99 | 0B98 | 0B97 | 0B96 |
| 147X | 0B8F | 0B8E | 0B8D | 0B8C | 0B8B | 0B8A | 0B89 | 0B88 | 0B87 | 0B86 |
| 148X | 0B7F | 0B7E | 0B7D | 0B7C | 0B7B | 0B7A | 0B79 | 0B78 | 0B77 | 0B76 |
| 149X | 0B6F | 0B6E | 0B6D | 0B6C | 0B6B | 0B6A | 0B69 | 0B68 | 0B67 | 0B66 |
| 14AX | 0B5F | 0B5E | 0B5D | 0B5C | 0B5B | 0B5A | 0B59 | 0B58 | 0B57 | 0B56 |
| 14BX | 0B4F | 0B4E | 0B4D | 0B4C | 0B4B | 0B4A | 0B49 | 0B48 | 0B47 | 0B46 |
| 14CX | 0B3F | 0B3E | 0B3D | 0B3C | 0B3B | 0B3A | 0B39 | 0B38 | 0B37 | 0B36 |
| 14DX | 0B2F | 0B2E | 0B2D | 0B2C | 0B2B | 0B2A | 0B29 | 0B28 | 0B27 | 0B26 |
| 14EX | 0B1F | 0B1E | 0B1D | 0B1C | 0B1B | 0B1A | 0B19 | 0B18 | 0B17 | 0B16 |
| 14FX | 0B0F | 0B0E | 0B0D | 0B0C | 0B0B | 0B0A | 0B09 | 0B08 | 0B07 | 0B06 |
| 150X | 0AFF | 0AFE | 0AFD | 0AFC | 0AFB | 0AFA | 0AF9 | 0AF8 | 0AF7 | 0AF6 |
| 151X | 0AEF | 0AEE | 0AED | 0AEC | 0AEB | 0AEA | 0AE9 | 0AE8 | 0AE7 | 0AE6 |
| 152X | 0ADF | 0ADE | 0ADD | 0ADC | 0ADB | 0ADA | 0AD9 | 0AD8 | 0AD7 | 0AD6 |
| 153X | 0ACF | 0ACE | 0ACD | 0ACC | 0ACB | 0ACA | 0AC9 | 0AC8 | 0AC7 | 0AC6 |
| 154X | 0ABF | 0ABE | 0ABD | 0ABC | 0ABB | 0ABA | 0AB9 | 0AB8 | 0AB7 | 0AB6 |
| 155X | 0AAF | 0AAE | 0AAD | 0AAC | 0AAB | 0AAA | 0AA9 | 0AA8 | 0AA7 | 0AA6 |
| 156X | 0A9F | 0A9E | 0A9D | 0A9C | 0A9B | 0A9A | 0A99 | 0A98 | 0A97 | 0A96 |
| 157X | 0A8F | 0ABE | 0ABD | 0ABC | 0ABB | 0A8A | 0A89 | 0AB8 | 0A87 | 0A86 |
| 158X | 0A7F | 0A7E | 0A7D | 0A7C | 0A7B | 0A7A | 0A79 | 0A78 | 0A77 | 0A76 |
| 159X | 0A6F | 0A6E | 0A6D | 0A8C | 0A6B | 0A6A | 0A69 | 0A68 | 0A67 | 0A66 |
| 15AX | 0A5F | 0A5E | 0A5D | 0A5C | 0A5B | 0A5A | 0A59 | 0A58 | 0A57 | 0A56 |
| 15BX | 0A4F | 0A4E | 0A4D | 0A4C | 0A4B | 0A4A | 0A49 | 0A48 | 0A47 | 0A46 |
| 15CX | 0A3F | 0A3E | 0A3D | 0A3C | 0A3B | 0A3A | 0A39 | 0A38 | 0A37 | 0A36 |
| 15DX | 0A2F | 0A2E | 0A2D | 0A2C | 0A2B | 0A2A | 0A29 | 0A28 | 0A27 | 0A26 |
| 15EX | 0A1F | 0A1E | 0A1D | 0A1C | 0A1B | 0A1A | 0A19 | 0A18 | 0A17 | 0A18 |
| 15FX | 0A0F | 0A0E | 0A0D | 0A0C | 0A0B | 0A0A | 0A09 | 0199 | 0A07 | 0A08 |
| 160X | 09FF | 09FE | 09FD | 09FC | 09FB | 09FA | 09F9 | 09F8 | 09F7 | 09F6 |
| 161X | 09EF | 09EE | 09ED | 09EC | 09EB | 09EA | 09E9 | 09E8 | 09E7 | 09E6 |
| 162X | 09DF | 09DE | 09DD | 09DC | 09DB | 09DA | 09D9 | 09D8 | 09D7 | 09D6 |
| 163X | 09CF | 09CE | 09CD | 09CC | 09CB | 09CA | 09C9 | 09C8 | 09C7 | 09C6 |
| 164X | 09BF | 09BE | 09BD | 09BC | 09BB | 09BA | 09B9 | 09B8 | 09B7 | 09B6 |
| 165X | 09AF | 09AE | 09AD | 09AC | 09AB | 09AA | 09A9 | 09A8 | 09A7 | 09A6 |
| 166X | 099F | 099E | 099D | 099C | 099B | 099A | 0999 | 0998 | 0997 | 0996 |
| 167X | 098F | 098E | 098D | 098C | 098B | 098A | 0989 | 0988 | 0987 | 0988 |
| 168X | 097F | 097E | 097D | 097C | 097B | 097A | 0979 | 0978 | 0977 | 0976 |
| 169X | 096F | 096E | 096D | 096C | 096B | 096A | 0969 | 0968 | 0967 | 0966 |
| 16AX | 095F | 095E | 095D | 095C | 095B | 095A | 0959 | 0958 | 0957 | 0956 |
| 16BX | 094F | 094E | 094D | 094C | 094B | 094A | 0949 | 0948 | 0947 | 0946 |
| 16CX | 093E | 093E | 093D | 093C | 093B | 093A | 0939 | 0938 | 0937 | 0936 |
| 16DX | 092F | 092E | 092D | 092C | 092B | 092A | 0929 | 0928 | 0927 | 0926 |
| 16EX | 091F | 091E | 091D | 091C | 091B | 091A | 0919 | 0918 | 0917 | 0916 |
| 16FX | 090F | 090E | 090D | 090C | 090B | 090A | 0909 | 019A | 0907 | 0906 |
| 170X | 08FF | 08FE | 08FD | 08FC | 08FB | 08FA | 08F9 | 08F8 | 08F7 | 08F6 |
| 171X | 08EF | 08EE | 08ED | 08EC | 08EB | 08EA | 08E9 | 08E8 | 08E7 | 08E6 |
| 172X | 08DF | 08DE | 08DD | 08DC | 08DB | 08DA | 08D9 | 08D8 | 08D7 | 08D6 |
| 173X | 08CF | 08CE | 08CD | 08CC | 08CB | 08CA | 08C9 | 08C8 | 08C7 | 08C6 |
| 174X | 08BF | 08BE | 08BD | 08BC | 08BB | 08BA | 08B9 | 08B8 | 08B7 | 08B6 |
| 175X | 08AF | 08AE | 08AD | 08AC | 08AB | 08AA | 08A9 | 08A8 | 08A7 | 08A6 |
| 176X | 089F | 089E | 089D | 089C | 089B | 089A | 0899 | 0898 | 0897 | 0896 |
| 177X | 08BF | 088E | 08BD | 08BC | 088B | 08BA | 08B9 | 019F | 0887 | 0888 |
| 178X | 087F | 087E | 087D | 087C | 087B | 087A | 0879 | 0878 | 0877 | 0876 |
| 179X | 086F | 086E | 086D | 086C | 086B | 086A | 0869 | 0888 | 0887 | 0886 |
| 17AX | 085F | 085E | 085D | 085C | 085B | 085A | 0859 | 0858 | 0857 | 0856 |
| 17BX | 084F | 084E | 084D | 084C | 084B | 084A | 0849 | 019C | 0847 | 0846 |
| 17CX | 083F | 083E | 083D | 083C | 083B | 083A | 0839 | 0838 | 0837 | 0836 |
| 17DX | 082F | 082E | 082D | 082C | 082B | 082A | 0829 | 019D | 0827 | 0826 |
| 17EX | 081F | 081E | 081D | 081C | 081B | 081A | 0819 | 019E | 0817 | 0818 |
| 17FX | 014F | 014E | 014D | 014C | 014B | 014A | 0149 | 019B | 0147 | 0146 |

TABLE 12-continued

| | | A | B | C | D | E | F |
|---|---|---|---|---|---|---|---|
| | 140X | 0BF5 | 0BF4 | 0BF3 | 0BF2 | 0BF1 | 02BF |
| | 141X | 0BE5 | 0BE4 | 0BE3 | 0BE2 | 0BE1 | 02BE |
| | 142X | 0BD5 | 0B04 | 0BD3 | 0BD2 | 0BD1 | 02BD |
| | 143X | 0BC5 | 0BC4 | 0BC3 | 0BC2 | 0BC1 | 02BC |
| | 144X | 0BB5 | 0BB4 | 0BB3 | 0BB2 | 0BB1 | 02BB |
| | 145X | 0BA5 | 0BA4 | 0BA3 | 0BA2 | 0BA1 | 02BA |
| | 146X | 0B95 | 0B94 | 0B93 | 0B92 | 0B91 | 02B9 |
| | 147X | 0B85 | 0B84 | 0B83 | 0B82 | 0B81 | 02B8 |
| | 148X | 0B75 | 0B74 | 0B73 | 0B72 | 0B71 | 02B7 |
| | 149X | 0B65 | 0B64 | 0B63 | 0B62 | 0B61 | 02B6 |
| | 14AX | 0B55 | 0B54 | 0B53 | 0B52 | 0B51 | 02B5 |
| | 14BX | 0B45 | 0B44 | 0B43 | 0B42 | 0B41 | 0294 |
| | 14CX | 0B35 | 0B34 | 0B33 | 0B32 | 0B31 | 02B3 |
| | 14DX | 0B25 | 0B24 | 0B23 | 0B22 | 0B21 | 02B2 |
| | 14EX | 0B15 | 0B14 | 0B13 | 0B12 | 0B11 | 02B1 |
| | 14FX | 0B05 | 0B04 | 0B03 | 0BD2 | 01A8 | 01B8 |
| | 150X | 0AF5 | 0AF4 | 0AF3 | 0AF2 | 0AF1 | 02AF |
| | 151X | 0AE5 | 0AE4 | 0AE3 | 0AE2 | 0AE1 | 02AE |
| | 152X | 0AD5 | 0AD4 | 0AD3 | 0AD2 | 0AD1 | 02AD |
| | 153X | 0AC5 | 0AC4 | 0AC3 | 0AC2 | 0AC1 | 02AC |
| | 154X | 0AB5 | 0AB4 | 0AB3 | 0AB2 | 0AB1 | 02AB |
| | 155X | 0AA5 | 0AA4 | 0AA3 | 0AA2 | 0AA1 | 02AA |
| | 156X | 0A95 | 0A94 | 0A93 | 0A92 | 0A91 | 02A9 |
| | 157X | 0A85 | 0A84 | 0A83 | 0AB2 | 0A81 | 02A8 |
| | 158X | 0A75 | 0A74 | 0A73 | 0A72 | 0A71 | 02A7 |
| | 159X | 0A85 | 0A84 | 0A63 | 0A82 | 0A61 | 02A6 |
| | 15AX | 0A55 | 0A54 | 0A53 | 0A52 | 0A51 | 02A5 |
| | 15BX | 0A45 | 0A44 | 0A43 | 0A42 | 0A41 | 02A4 |
| | 15CX | 0A35 | 0A34 | 0A33 | 0A32 | 0A31 | 02A3 |
| | 15DX | 0A25 | 0A24 | 0A23 | 0A22 | 0A21 | 02A2 |
| | 15EX | 0A15 | 0A14 | 0A13 | 0A12 | 0A11 | 02A1 |
| | 15FX | 0A05 | 01A1 | 010E | 01B1 | 01A9 | 01B9 |
| | 160X | 09F5 | 09F4 | 09F3 | 09F2 | 09F1 | 029F |
| | 161X | 09E5 | 09E4 | 09E3 | 09E2 | 09E1 | 029E |
| | 162X | 09D5 | 09D4 | 09D3 | 09D2 | 09D1 | 029D |
| | 163X | 09C5 | 09C4 | 09C3 | 09C2 | 09C1 | 029C |
| | 164X | 09B5 | 09B4 | 09B3 | 09B2 | 09B1 | 029B |
| | 165X | 09A5 | 09A4 | 09A3 | 09A2 | 09A1 | 029A |
| | 166X | 0995 | 0994 | 0993 | 0992 | 0991 | 0299 |
| | 167X | 0985 | 0984 | 0983 | 0982 | 0981 | 0298 |
| | 168X | 0975 | 0974 | 0973 | 0972 | 0971 | 0297 |
| | 169X | 0965 | 0964 | 0963 | 0962 | 0961 | 0296 |
| | 16AX | 0955 | 0954 | 0953 | 0952 | 0951 | 0295 |
| | 16BX | 0945 | 0944 | 0943 | 0942 | 0941 | 0294 |
| | 16CX | 0935 | 0934 | 0933 | 0932 | 0931 | 0293 |
| | 16DX | 0925 | 0924 | 0923 | 0922 | 0921 | 0292 |
| | 16EX | 0915 | 0914 | 0913 | 0912 | 0911 | 0291 |
| | 16FX | 0905 | 01A2 | 0903 | 01B2 | 01AA | 01BA |
| | 170X | 08F5 | 08F4 | 08F3 | 08F2 | 08F1 | 028F |
| | 171X | 08E5 | 08E4 | 08E3 | 08E2 | 08E1 | 02BE |
| | 172X | 08D5 | 08D4 | 08D3 | 08D2 | 08D1 | 028D |
| | 173X | 08C5 | 08C4 | 08C3 | 08C2 | 08C1 | 028C |
| | 174X | 08B5 | 0804 | 08B3 | 08B2 | 08B1 | 028B |
| | 175X | 08A5 | 08A4 | 08A3 | 08A2 | 08A1 | 02BA |
| | 176X | 0895 | 0894 | 0893 | 0892 | 0891 | 02B9 |
| | 177X | 0885 | 01A7 | 0883 | 01B7 | 01AF | 01BF |
| | 178X | 0875 | 0874 | 0873 | 0872 | 0871 | 0287 |
| | 179X | 0885 | 0884 | 0883 | 0882 | 0881 | 0286 |
| | 17AX | 0855 | 0854 | 0853 | 0852 | 0851 | 0285 |
| | 17BX | 0845 | 01A4 | 0843 | 01B4 | 01AC | 01BC |
| | 17CX | 0835 | 0834 | 0833 | 0832 | 0831 | 0283 |
| | 17DX | 0825 | 01A5 | 0823 | 01B5 | 01AD | 01BD |
| | 17EX | 0815 | 01A6 | 0813 | 01B6 | 01AE | 01BE |
| | 17FX | 0145 | 01A3 | 0143 | 01B3 | 01AB | 01BB |

TABLE 13

| 13-bit code words for 64/65 (0,7) code [Min Hwt = 4] ||||||||||
| --- | --- | --- | --- | --- | --- | --- | --- | --- | --- |
| | 0 | 1 | 2 | 3 | 4 | 5 | 6 | 7 | 8 | 9 |
| 180X | 07FF | 07FE | 07FD | 07FC | 07FB | 07FA | 07F9 | 07F8 | 07F7 | 07F6 |
| 181X | 07EF | 07EE | 07ED | 07EC | 07EB | 07EA | 07E9 | 07E8 | 07E7 | 07E6 |
| 182X | 07DF | 07DE | 070D | 07DC | 070B | 07DA | 07D9 | 0708 | 0707 | 07D6 |
| 183X | 07CF | 07CE | 07CD | 07CC | 07CB | 07CA | 07C9 | 07C8 | 07C7 | 07C6 |
| 184X | 07BF | 07BE | 07BD | 07BC | 07BB | 07BA | 07B9 | 07B8 | 07B7 | 07B6 |
| 165X | 07AF | 07AE | 07AD | 07AC | 07AB | 07AA | 07A9 | 07A8 | 07A7 | 07A6 |
| 186X | 079F | 079E | 079D | 079C | 079B | 079A | 0799 | 0798 | 0797 | 0796 |
| 187X | 078F | 078E | 078D | 078C | 078B | 078A | 0789 | 0788 | 0787 | 0786 |
| 188X | 077F | 077E | 077D | 077C | 077B | 077A | 0779 | 0778 | 0777 | 0776 |
| 189X | 076F | 076E | 076D | 076C | 076B | 076A | 0769 | 0768 | 0767 | 0766 |
| 18AX | 075F | 075E | 075D | 075C | 075B | 075A | 0759 | 0758 | 0757 | 0756 |
| 18BX | 074F | 074E | 074D | 074C | 074B | 074A | 0749 | 0748 | 0747 | 0746 |
| 18CX | 073F | 073E | 073D | 073C | 073B | 073A | 0739 | 0738 | 0737 | 0736 |
| 18DX | 072F | 072E | 072D | 072C | 072B | 072A | 0729 | 0728 | 0727 | 0726 |
| 18EX | 071F | 071E | 071D | 071C | 071B | 071A | 0719 | 0718 | 0717 | 0716 |
| 18FX | 070F | 07DE | 070D | 070C | 070B | 070A | 0709 | 0708 | 07D7 | 0706 |
| 190X | 06FF | 06FE | 06FD | 0BFC | 06FB | 06FA | 06F9 | 06F8 | 06F7 | 06F6 |
| 191X | 06EF | 06EE | 06ED | 06EC | 06EB | 06EA | 06E9 | 06E8 | 06E7 | 06E6 |
| 192X | 06DF | 06DE | 06DD | 06DC | 06DB | 06DA | 06D9 | 06D8 | 06D7 | 06D6 |
| 193X | 06CF | 06CE | 06CD | 06CC | 06CB | 06CA | 06C9 | 06C8 | 06C7 | 06C6 |
| 194X | 06BF | 0BBE | 06BD | 06BC | 06BB | 06BA | 06B9 | 06B8 | 06B7 | 06B6 |
| 195X | 06AF | 06AE | 06AD | 06AC | 06AB | 06AA | 06A9 | 06A8 | 0BA7 | 06A6 |
| 196X | 069F | 069E | 069D | 069C | 069B | 069A | 0699 | 0698 | 0697 | 0696 |
| 197X | 068F | 068E | 068D | 068C | 068B | 068A | 0689 | 0688 | 0687 | 0686 |
| 198X | 067F | 067E | 067D | 067C | 067B | 067A | 0679 | 0678 | 0677 | 0676 |
| 199X | 066F | 066E | 066D | 066C | 066B | 066A | 0669 | 0668 | 0667 | 0666 |
| 19AX | 065F | 065E | 065D | 065C | 065B | 065A | 0659 | 0658 | 0657 | 0656 |
| 19BX | 064F | 064E | 064D | 064C | 064B | 064A | 0649 | 0648 | 0647 | 0646 |
| 19CX | 063F | 063E | 063D | 063C | 063B | 063A | 0639 | 0638 | 0637 | 0636 |
| 19DX | 062F | 062E | 062D | 062C | 062B | 062A | 0629 | 0628 | 0627 | 0626 |
| 19EX | 061F | 061E | 061D | 061C | 061B | 061A | 0619 | 0618 | 0617 | 0616 |
| 19FX | 060F | 060E | 060D | 060C | 060B | 060A | 0609 | 0219 | 0607 | 0606 |
| 1ADX | 05FF | 05FE | 05FD | 05FC | 05FB | 05FA | 05F9 | 05F8 | 05F7 | 05F6 |
| 1A1X | 05EF | 05EE | 05ED | 05EC | 05EB | 05EA | 05E9 | 05E8 | 05E7 | 05E6 |
| 1A2X | 05DF | 05DE | 05DD | 05DC | 05DB | 05DA | 05D9 | 05D8 | 05D7 | 05D6 |
| 1A3X | 05CF | 05CE | 05CD | 05CC | 05CB | 05CA | 05C9 | 05C8 | 05C7 | 05C6 |
| 1A4X | 05BF | 05BE | 05BD | 05BC | 05BB | 05BA | 05B9 | 05B8 | 05B7 | 05B6 |
| 1A5X | 05AF | 05AE | 05AD | 05AC | 05AB | 05AA | 05A9 | 05A8 | 05A7 | 05A6 |
| 1A6X | 059F | 059E | 059D | 059C | 059B | 059A | 0599 | 0598 | 0597 | 0596 |
| 1A7X | 058F | 058E | 058D | 058C | 058B | 058A | 0589 | 0588 | 0587 | 0586 |
| 1A8X | 057F | 057E | 057D | 057C | 057B | 057A | 0579 | 0578 | 0577 | 0576 |
| 1A9X | 056F | 056E | 056D | 056C | 056B | 056A | 0569 | 0568 | 0567 | 0566 |
| 1AAX | 055F | 055E | 055D | 055C | 055B | 055A | 0559 | 0558 | 0557 | 0556 |
| 1ABX | 054F | 064E | 054D | 054C | 054B | 054A | 0549 | 0648 | 0647 | 0646 |
| 1ACX | 053F | 053E | 053D | 053C | 053B | 053A | 0539 | 0538 | 0537 | 0536 |
| 1ADX | 052F | 052E | 052D | 052C | 052B | 05ZA | 0529 | 0528 | 0527 | 0526 |
| 1AEX | 051F | 051E | 051D | 051C | 051B | 051A | 0519 | 0518 | 0517 | 0516 |
| 1AFX | 050F | 050E | 050D | 050C | 050B | 050A | 0509 | 021A | 0507 | 0506 |
| 1BDX | 04FF | 04FE | 04FD | 04FC | 04FB | 04FA | 04F9 | 04F8 | 04F7 | 04F6 |
| 1B1X | 04EF | 04EE | 04ED | 04EC | 04EB | 04EA | 04E9 | 04E8 | 04E7 | 04E6 |
| 1B2X | 04DF | 04DE | 04DD | 04DC | 04DB | 04DA | 04D9 | 04D8 | 04D7 | 04D6 |
| 1B3X | 04CF | 04CE | 04CD | 04CC | 04CB | 04CA | 04C9 | 04C8 | 04C7 | 04C6 |
| 1B4X | 04BF | 04BE | 04BD | 04BC | 04BB | 04BA | 04B9 | 04B8 | 04B7 | 04B6 |
| 1B5X | 04AF | 04AE | 04AD | 04AC | 04AB | 04AA | 04A9 | 04A8 | 04A7 | 04A6 |
| 1B6X | 049F | 049E | 049D | 049C | 049B | 049A | 0499 | 0498 | 0497 | 0496 |
| 1B7X | 048F | 048E | 048D | 048C | 048B | 048A | 0489 | 021F | 0487 | 0486 |
| 1B8X | 047F | 047E | 047D | 047C | 047B | 047A | 0479 | 0478 | 0477 | 0476 |
| 1B9X | 046F | 046E | 046D | 046C | 046B | 046A | 0469 | 0468 | 0467 | 0466 |
| 1BAX | 045F | 045E | 045D | 045C | 045B | 045A | 0459 | 0458 | 0457 | 0458 |
| 1BBX | 044F | 044E | 044D | 044C | 044B | 044A | 0449 | 021C | 0447 | 0446 |
| 1BCX | 043F | 043E | 043D | 043C | 043B | 043A | 0439 | 0438 | 0437 | 0436 |
| 1BDX | 042F | 042E | 042D | 042C | 042B | 042A | 0429 | 021D | 0427 | 0426 |
| 1BEX | 041F | 041E | 041D | 041C | 041B | 041A | 0419 | 021E | 0417 | 0416 |
| 1BFX | 040F | 040E | 040D | 018C | 040B | 018A | 0189 | 021B | 0187 | 0186 |

| | | | | A | B | C | D | E | F |
| --- | --- | --- | --- | --- | --- | --- | --- | --- | --- |
| | | | 180X | 07F5 | 07F4 | 07F3 | 07F2 | 07F1 | 027F |
| | | | 181X | 07E5 | 07E4 | 07E3 | 07E2 | 07E1 | 027E |
| | | | 182X | 07D5 | 0704 | 07D3 | 07D2 | 07D1 | 0270 |
| | | | 183X | 07C5 | 07C4 | 07C3 | 07C2 | 07C1 | 027C |
| | | | 184X | 07B5 | 07B4 | 07B3 | 07B2 | 07B1 | 027B |
| | | | 165X | 07A5 | 07A4 | 07A3 | 07A2 | 07A1 | 027A |
| | | | 186X | 0795 | 0794 | 0793 | 0792 | 0791 | 0279 |
| | | | 187X | 0785 | 0784 | 0783 | 0762 | 0781 | 0278 |

TABLE 13-continued 13-bit code words for 64/65 (0,7) code [Min Hwt = 4]

| | | | | | | |
|---|---|---|---|---|---|---|
| 188X | 0775 | 0774 | 0773 | 0772 | 0771 | 0277 |
| 189X | 0765 | 0764 | 0763 | 0762 | 0761 | 0276 |
| 18AX | 0755 | 0754 | 0753 | 0752 | 0751 | 0275 |
| 18BX | 0745 | 0744 | 0743 | 0742 | 0741 | 0274 |
| 18CX | 0735 | 0734 | 0733 | 0732 | 0731 | 0273 |
| 18DX | 0725 | 0724 | 0723 | 0722 | 0721 | 0272 |
| 18EX | 0715 | 0714 | 0713 | 0712 | 0711 | 0271 |
| 18FX | 0705 | 0704 | 0703 | 0702 | 01E8 | 01F8 |
| 190X | 06F5 | 06F4 | 06F3 | 06F2 | 06F1 | 026F |
| 191X | 06E5 | 06E4 | 0BE3 | 06E2 | 06E1 | 026E |
| 192X | 06D5 | 06D4 | 06D3 | 06D2 | 06D1 | 026D |
| 193X | 06C5 | 06C4 | 06C3 | 06C2 | 06C1 | 026C |
| 194X | 0BB5 | 06B4 | 06B3 | 06B2 | 06B1 | 026B |
| 195X | 06A5 | 06A4 | 06A3 | 06A2 | 06A1 | 026A |
| 196X | 0695 | 0694 | 0693 | 0692 | 0691 | 0269 |
| 197X | 0685 | 0684 | 0683 | 06B2 | 0681 | 0268 |
| 198X | 0675 | 0674 | 0673 | 0672 | 0671 | 0267 |
| 199X | 0665 | 0664 | 0663 | 0662 | 0661 | 0266 |
| 19AX | 0655 | 0654 | 0653 | 0652 | 0651 | 0265 |
| 19BX | 0645 | 0644 | 0643 | 0642 | 0641 | 0264 |
| 19CX | 0635 | 0634 | 0633 | 0632 | 0631 | 0263 |
| 19DX | 0625 | 0624 | 0623 | 0622 | 0621 | 0262 |
| 19EX | 0615 | 0B14 | 0613 | 0612 | 0611 | 0261 |
| 19FX | 06D5 | 01E1 | 01DF | 01F1 | 01E9 | 01F9 |
| 1ADX | 05F5 | 05F4 | 05F3 | 05F2 | 05F1 | 025F |
| 1A1X | 05E5 | 05E4 | 05E3 | 05E2 | 05E1 | 025E |
| 1A2X | 05D5 | 05D4 | 05D3 | 05D2 | 05D1 | 025D |
| 1A3X | 05C5 | 05C4 | 05C3 | 05C2 | 05C1 | 025C |
| 1A4X | 05B5 | 05B4 | 05B3 | 05B2 | 05B1 | 025B |
| 1A5X | 05A5 | 05A4 | 05A3 | 05A2 | 05A1 | 025A |
| 1A6X | 0595 | 0594 | 0593 | 0592 | 0591 | 0259 |
| 1A7X | 0585 | 0584 | 0583 | 0582 | 0581 | 0258 |
| 1A8X | 0575 | 0574 | 0573 | 0572 | 0571 | 0257 |
| 1A9X | 0565 | 0564 | o563 | 0562 | 0561 | 0256 |
| 1AAX | 0555 | 0554 | 0553 | 0552 | 0551 | 0255 |
| 1ABX | 0545 | 0544 | 0643 | 0642 | 0641 | 0254 |
| 1ACX | 0535 | 0534 | 0533 | 0532 | 0531 | 0253 |
| 1ADX | 0525 | 0524 | 0523 | 0522 | 0521 | 0252 |
| 1AEX | 0515 | 0514 | 0513 | 0512 | 0511 | 0251 |
| 1AFX | 05D5 | 01E2 | 05D3 | 01F2 | 01EA | 01FA |
| 1BDX | 04F5 | 04F4 | 04F3 | 04F2 | 04F1 | 024F |
| 1B1X | 04E5 | 04E4 | 04E3 | 04E2 | 04E1 | 024E |
| 1B2X | 04D5 | 04D4 | 04D3 | 04D2 | 04D1 | 024D |
| 1B3X | 04C5 | 04C4 | 04C3 | 04C2 | 04C1 | 024C |
| 1B4X | 04B5 | 04B4 | 04B3 | 04B2 | 04B1 | 024B |
| 1B5X | 04A5 | 04A4 | 04A3 | 04A2 | 04A1 | 024A |
| 1B6X | 0495 | 0494 | 0493 | 0492 | 0491 | 0249 |
| 1B7X | 0485 | 01E7 | 0483 | 01F7 | 01EF | 01FF |
| 1B8X | 0475 | 0474 | 0473 | 0472 | 0471 | 0247 |
| 1B9X | 0465 | 0464 | 0463 | 0462 | 0461 | 0246 |
| 1BAX | 0455 | 0454 | 0453 | 0452 | 0451 | 0245 |
| 1BBX | 0445 | 01E4 | 0443 | 01F4 | 01EC | 01FC |
| 1BCX | 0435 | 0434 | 0433 | 0432 | 0431 | 0243 |
| 1BDX | 0425 | 01E5 | 0423 | 01F5 | 01ED | 01FD |
| 1BEX | 0415 | 01E6 | 0413 | 01F6 | 01EE | 01FE |
| 1BFX | 0185 | 01E3 | 0183 | 01F3 | 01EB | 01FB |

Although the encoder and decoder described above have been described with reference to a rate 64/65 encoder, any rate may be used with appropriate changes to the simplified mapping and the segment block encoders. For example, a 99/100 rate encoder can be constructed by separating the 99 bits of the data word into a 14-bit segment and an 85-bit segment. The 14-bit segment is then mapped into five 3-bit segments using the same process as described above. The 85-bit segment is divided into five 17-bit subsegments. These subsegments are combined with the 3-bit segments to form five 20-bit segments that are then encoded by a 20 bit to 20 bit encoder. The resulting code segments are concatenated to form the 100-bit codeword.

Figure 8:
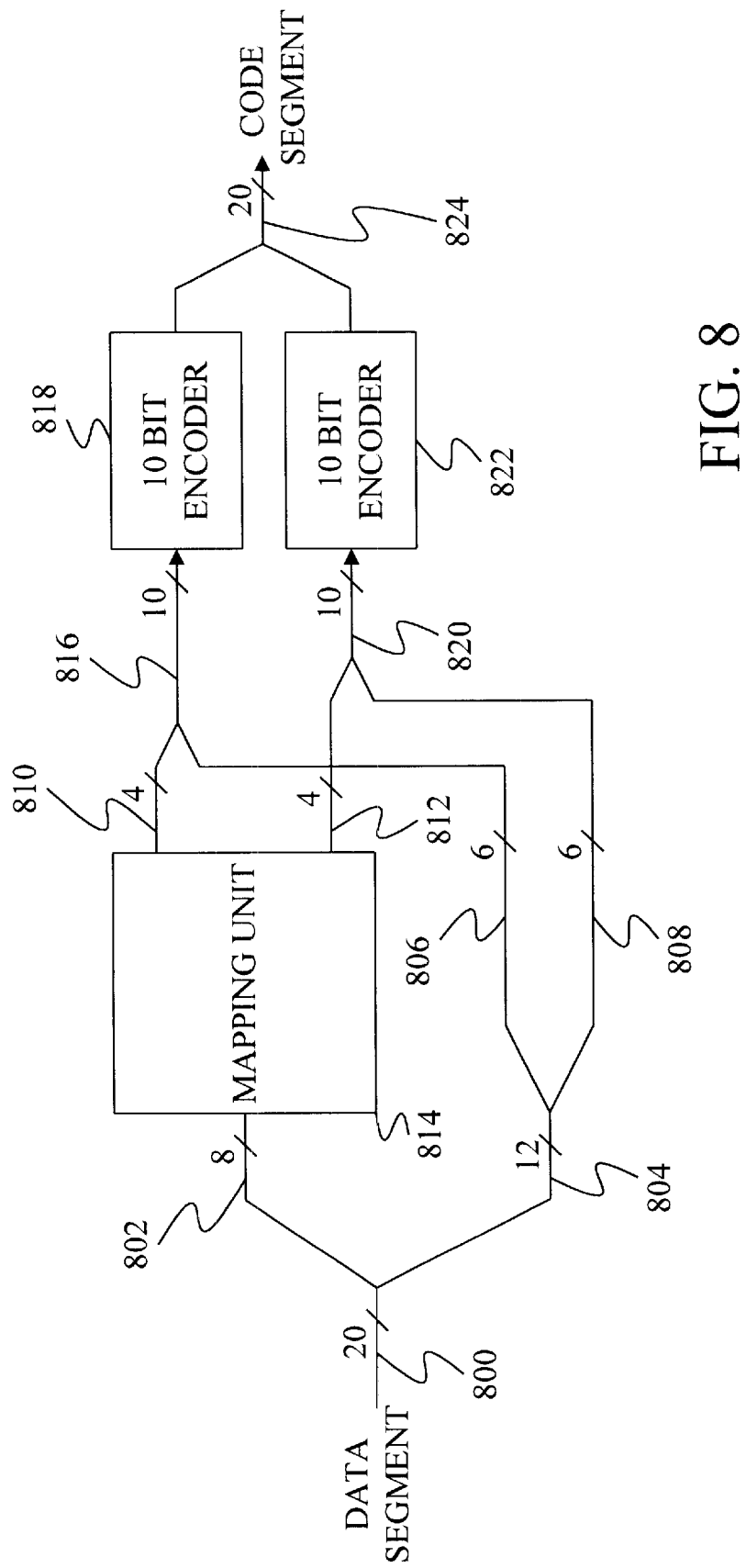
FIG. 8 is a block diagram of a second embodiment of a segment encoder under the present invention.

FIG. 8 provides a block diagram of one embodiment of a segment encoder for encoding 20-bit data segments into 20-bit code segments. In FIG. 8, each 20-bit data segment 800 is divided into an 8-bit segment 802 and a 12-bit segment 804. The 12-bit segment is further divided into two 6-bit segments 806 and 808.

Eight-bit section 802 is mapped into two 4-bit sections 810 and 812 by a mapping unit 814. Under one embodiment, this mapping is performed by representing the 8-bit value as a base 15 number, where 4-bit value 810 and 812 are each binary representations of base-15 digits.

One of the embodiments of the mapping performed by mapping unit 814 can be summarized by:

TABLE 14

| $I_7$ | $I_6$ | $I_5$ | $I_4$ | $I_3$ | $I_2$ | $I_1$ | $I_0$ | $G_3$ | $G_2$ | $G_1$ | $G_0$ | $F_3$ | $F_2$ | $F_1$ | $F_0$ |
|---|---|---|---|---|---|---|---|---|---|---|---|---|---|---|---|
| 0 | 0 | 0 | $\phi$ | $\phi$ | $\phi$ | $\phi$ | $\phi$ | $\phi$ | $\phi$ | $\phi$ | $\phi$ | $\phi$ | $\phi$ | $\phi$ | $\phi$ |
| | | !0 | $\phi$ | 0 | 0 | 0 | 0 | 0 | 0 | 0 | 1 | $I_7$ | $I_6$ | $I_5$ | $I_4$ |
| | | '0 | $\phi$ | | | !0 | | $I_7$ | $I_6$ | $I_5$ | $I_4$ | $I_3$ | $I_2$ | $I_0$ | $I_0$ |

Where I7–I0 represents the 8-bit input segment G3–G0 represents one 4-bit output segment and F3–F0 represents another output segment. Note that the mapping in Table 14 assumes that a simplified mapping unit such as simplified mapping unit 516 has been used to designate input bits I7, I6, and I5 and that the simplified mapping unit will not set (I7, I6, I5) equal to "000".

Four-bit section 810 is combined with 6-bit section 806 to form a 10-bit segment 816 that is input to a 10-bit encoder 818. Similarly, 4-bit section 812 is combined with 6-bit section 808 to form a 10-bit section 820 that is input to 10-bit encoder 822. Ten-bit encoders 818 and 822 are identical and each generates a 10-bit code section. The two 10-bit code sections are combined to form a 20-bit code segment 824.

Under one embodiment that works with the mapping of table 14, each 10-bit encoder converts the 10-bit data segments into 10-bit codeword sub-segments as found in Table 15 below:

TABLE 15

| $I_9$ | $I_8$ | $I_7$ | $I_6$ | $I_5$ | $I_4$ | $I_3$ | $I_2$ | $I_1$ | $I_0$ | $O_9$ | $O_8$ | $I_7$ | $O_6$ | $O_5$ | $O_4$ | $O_3$ | $O_2$ | $O_1$ | $O_0$ |
|---|---|---|---|---|---|---|---|---|---|---|---|---|---|---|---|---|---|---|---|
| $\phi$ | 0 | 0 | 0 | 1 | $\phi$ | $\phi$ | $\phi$ | $\phi$ | $\phi$ | $\phi$ | $\phi$ | $\phi$ | $\phi$ | $\phi$ | $\phi$ | $\phi$ | $\phi$ | $\phi$ | $\phi$ |
| | | !0 | | $\phi$ | 0 | 0 | 0 | 0 | 0 | 1 | 0 | 0 | 0 | 0 | $I_9$ | $I_8$ | $I_7$ | $I_6$ | $I_5$ |
| | | !0 | | $\phi$ | | | !0 | | | $I_5$ | $I_9$ | $I_8$ | $I_7$ | $I_6$ | $I_4$ | $I_3$ | $I_2$ | $I_1$ | $I_0$ |

In table 15, the 10-bit word input to the encoder is designated by bits I9–I0 and the 10-bit output word is designated by bits O9–O0. In table 15 input bits I9–I6 are provided by mapping unit 814.

The two 6-bit values that are split off from 10-bit decoded values 910 and 912 are combined to form a 12-bit value 922 that is then combined with 8-bit section 920 to form a 20-bit data segment 924.

In the embodiments discussed above, the segment block encoders and decoders operate in a parallel fashion. In other embodiments, the segment block encoders operate in a sequential fashion. Under such embodiments, a single segment block encoder is used repeatedly to encode the entire data word.

Figure 10:
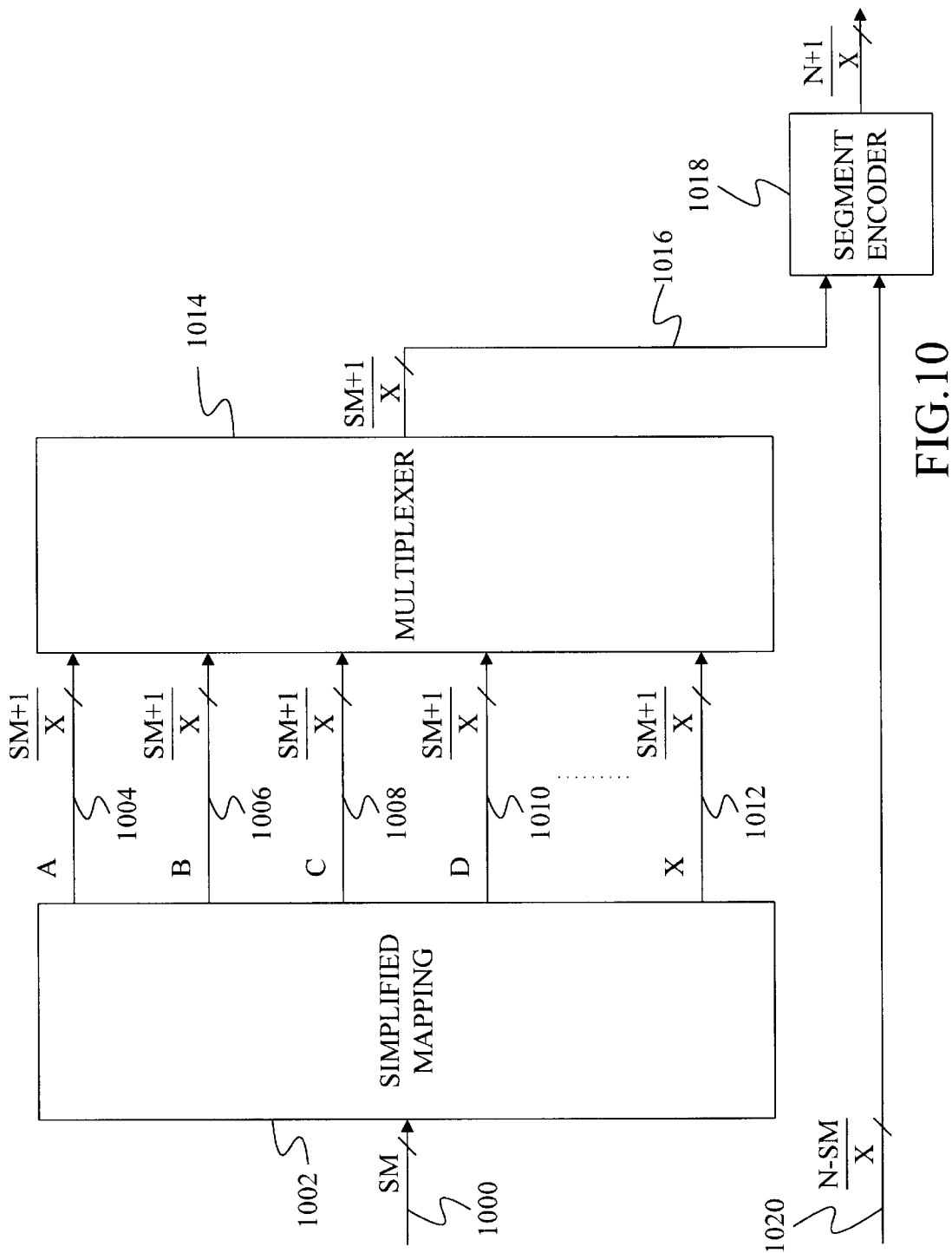
FIG. 10 is a block diagram of a sequential encoder under an embodiment of the present invention.

FIG. 10 provides a block diagram of such a sequential encoder. Table 16 below shows a timing table that illustrates the location of certain values within the encoder during different parts of the encoding process.

TABLE 16

| ENCODING | SIGNAL ASSIGNMENT BY ENCODING CYCLE | | | | |
|---|---|---|---|---|---|
| CYCLE | 1 | 2 | 3 | 4 | X |
| SM_IN | $D_{n-1}:D_p$ | | | | |
| SE_IN | $D_{p-1}:$ $D_{p(1-1/x)}$ | $D_{p(1-1/x)-1}:$ $D_{p(1-2/x)}$ | $D_{p(1-2/x)-1}:$ $D_{p(1-3/x)}$ | $D_{p(1-3/x)-1}:$ $D_{p(1-4/x)}$ | $D_{p(1-(x-1)/x)-1}:$ $D_0$ |
| MUX_OUT | A | B | C | D | X |
| SE_OUT | CSA | CSB | CSC | CSD | CSX |

Figure 9:
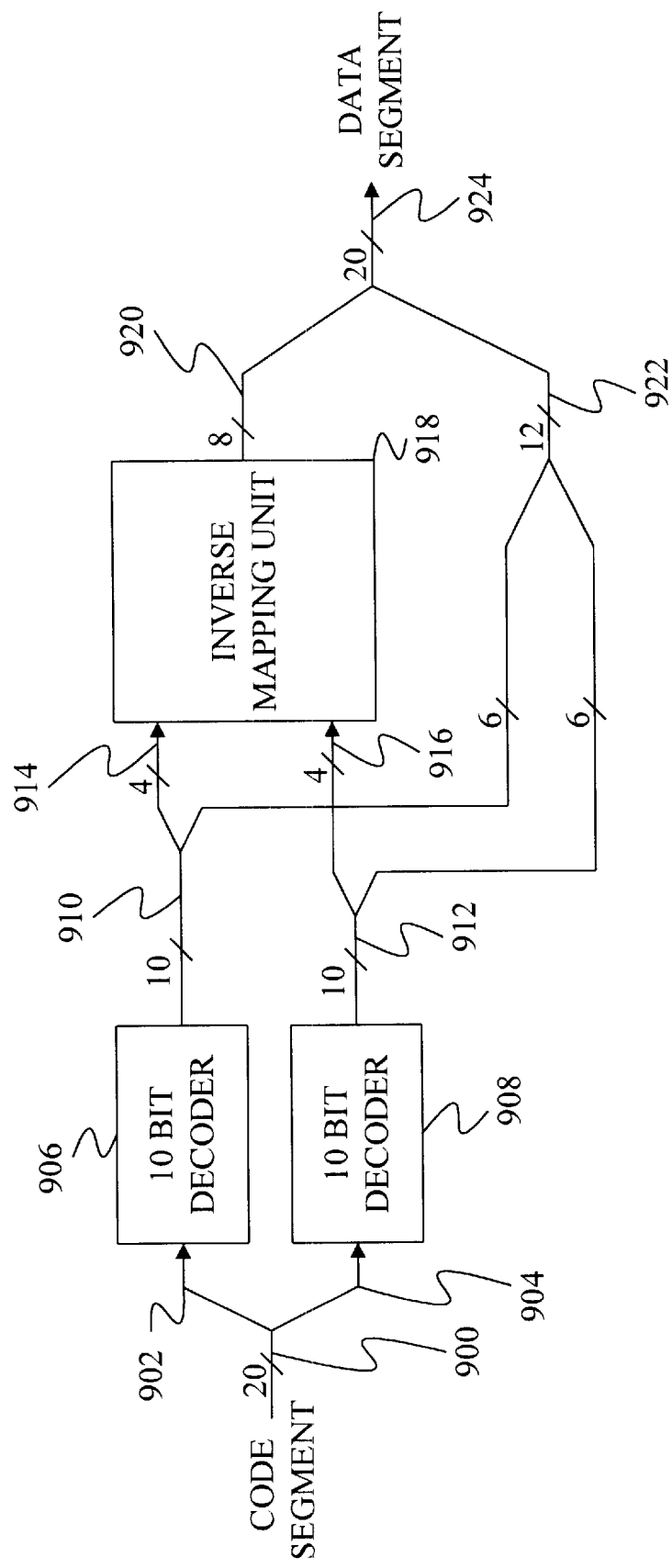
FIG. 9 is a block diagram of a second embodiment of a segment decoder under the present invention.

FIG. 9 provides a block diagram of a 20-bit segment decoder that performs the inverse of the encoding operation performed by the encoder of FIG. 8. In FIG. 9, a 20-bit codeword segment 900 is divided into two 10-bit codeword sub-segments 902 and 904. The two 10-bit codeword sub-segments are provided to 10-bit decoders 906 and 908, respectively, which decode the sub-segments using an inverse function of the encoding function applied by encoders 818 and 822 of FIG. 8. The 10-bit decoded values 910 and 912 provided by the decoders are each separated into a 4-bit segment and a 6-bit segment. The two 4-bit segments 914 and 916 are provided to an inverse mapping unit 918 that provides an inverse of the mapping provided by mapping unit 814 of FIG. 8. This results in an 8-bit output section 920.

Where p equals the number of bits (n–SM) not provided to simplified mapping unit 1002 and the designation $D_s:D_e$ represents the bits spanning from starting bit $D_s$ to ending bit $D_e$.

As shown in FIG. 10 and Table 16, during a first encoding cycle, a first section 1000 of the data word is applied to a simplified mapping unit 1002. In FIG. 10 and table 16, the number of bits applied to simplified mapping unit 1002 is represented generically by "SM". Using the simplified mapping units described above, SM would be equal to 14.

Simplified mapping unit 1002 maps the SM bits at its input into x sections that each have (SM+1)/x bits. Each of the sections is output in parallel as shown by output lines 1004, 1006, 1008, 1010, and 1012, which are also designated as A, B, C, D, and X in Table 16.

The parallel outputs provided by simplified mapping unit 1002 are input to a multiplexer 1014, which selects a different one of the parallel inputs as its output at each encoding cycle. The output of multiplexer 1014 is shown as output 1016, which is provided to a segment encoder 1018. The value on output 1016 is shown in Table 16 in the row identified as MUX_OUT.

During the first encoding cycle, segment encoder 1018 also receives the next (n−SM)/x bits in the input data word where n is the number of total bits in the data word, SM is the number of bits provided to the simplified mapping, and x is the number of encoding cycles. This input is provided to encoder 1018 along encoding line 1020.

Given the values on encoder input lines 1016 and 1020, encoder 1018 generates a single codeword during the first encoding cycle. Since encoder input line 1016 has (SM+1)/x bits and encoder input line 1020 has (n−SM)/x bits, the total number of input bits is equal to (n+1)/x. Thus, segment encoder 1018 is encoding an (n+1)/x data segment into an (n+1)/x codeword segment. As such, any of the segment encoders described above may be used as segment encoder 1018.

With the production of the codeword, designated as CSA in Table 16, the first encoding cycle is complete and the second encoding cycle may begin. During the second encoding cycle, the next (n−SM)/x bits in the data word is applied to encoder 1018 along encoding line 1020. At the same time, multiplexer 1014 passes the value on input line 1006 to its output 1016. Using the values on input lines 1016 and 1020, encoder 1018 then encodes this value to produce a codeword designated as CSB in Table 16.

This process of sequentially encoding the data word continues until the last (n−SM)/x bits in the data word and the last parallel output of simplified mapping unit 1002 have been applied to encoder 1018 to produce a codeword segment. In Table 16, this last encoding step is shown as encoding cycle x.

Figure 11:
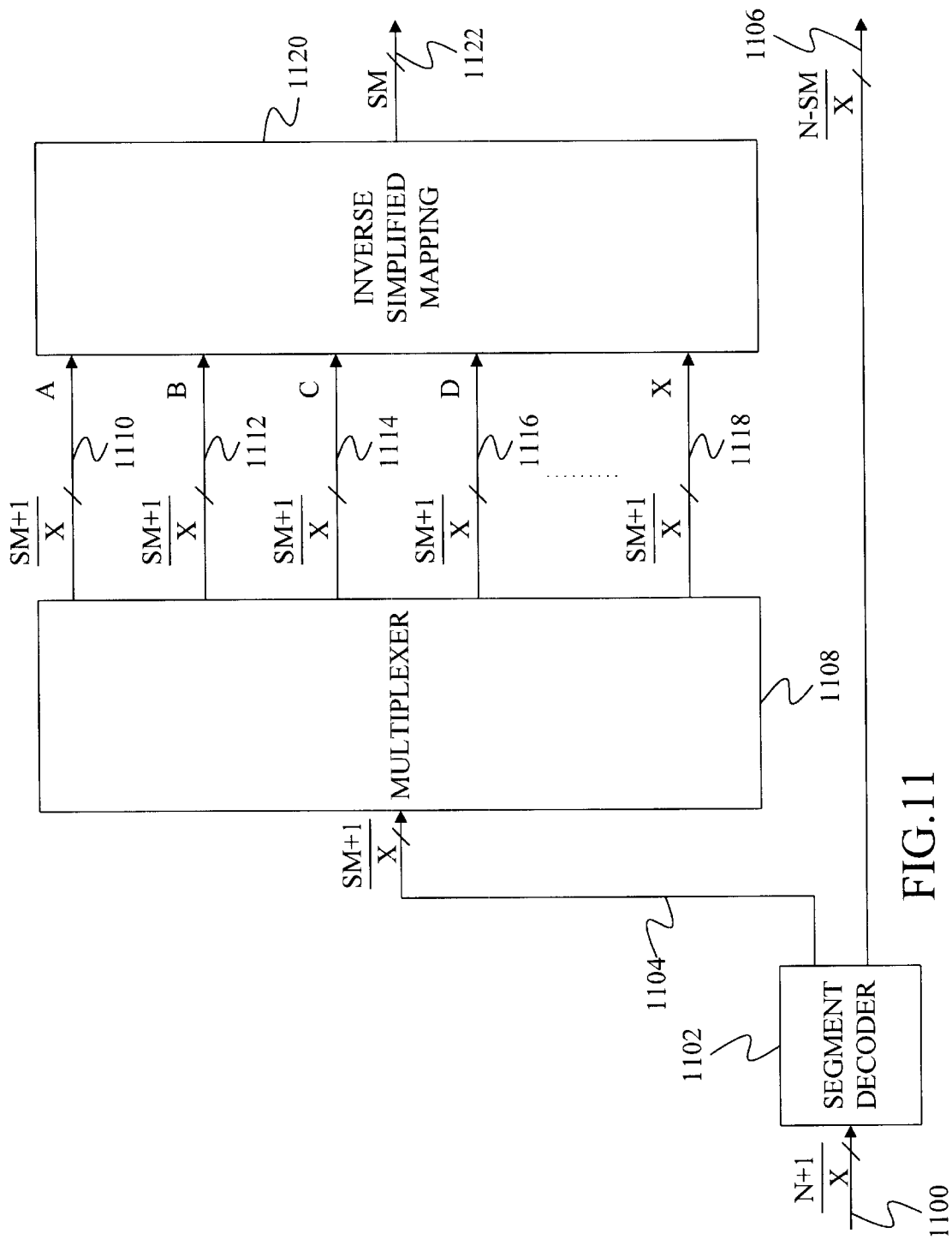
FIG. 11 is a block diagram of a sequential decoder under an embodiment of the present invention.

An additional aspect of the present invention is a sequential decoder that provides an inverse of the mapping provided by the sequential encoder of FIG. 10. FIG. 11 provides a block diagram of such a sequential decoder. In FIG. 11, each codeword is divided into x segments with each segment having (n+1)/x bits. During a first decoding cycle, the first (n+1)/x bits appear on input line 1100 as input to a segment decoder 1102. Segment decoder 1102 provides an inverse of the coding function provided by segment encoder 1018 of FIG. 10.

Segment decoder 1102 divides the resulting decoded data segment into a first section 1104 having (SM+1)/x bits and a second section 1106 having (n−SM)/x bits.

The (SM+1)/x bits on line 1104 is provided to a multiplexer 1108 which routes the bits to an appropriate output line based on the current decoding cycle. In FIG. 11, five decoding lines 1110, 1112, 1114, 1116, and 1118 are shown that each carry (SM+1)/x bits. At each decoding cycle, multiplexer 1108 places the output from segment decoder 1102 on a different one of the output lines. Thus, after an entire codeword has been provided to segment decoder 1102, each of the output lines from multiplexer 1108 has carried a portion of a decoded segment.

With each decoding cycle, segment decoder 1102 produces a different portion of the data word on output line 1106. Under one embodiment, these individual portions of the data word are stored for later combination with the remaining portions of the data word before any further operations are performed on these decoded portions. In other embodiments, additional operations are performed on the individual portions of the data word before the entire data word has been decoded.

Once the entire codeword has been decoded by segment decoder 1102, inverse simplified mapping unit 1120 converts the values it has received on inputs 1110, 1112, 1114, 1116, and 1118 into a section 1122 of the data word having SM bits. The inverse mapping performed by inverse simplified mapping unit 1120 is the inverse of the mapping performed by mapping unit 1002 of FIG. 10. In one embodiment, section 1122 is then combined with the remaining portions of the data word to form a complete data word.

Note that the sequential encoder of FIG. 10 does not require that a sequential decoder be used to decode the codewords. A parallel decoder may be used to decode the codewords. Similarly, the sequential decoder of FIG. 11 may be used to decode codewords that have been formed by a parallel encoder.

The sequential encoder and decoder of FIGS. 10 and 11 may be used to encode and decode data words and codewords of any size. In one embodiment of the present invention, the sequential encoder was used to encode 64-bit data words into 65-bit codewords. In other embodiments, the sequential encoder is used to encode 99-bit data words into 100-bit codewords.

In summary, a method of encoding data words 300 into code words 334 is provided. The method includes mapping the data words 300 into a number of data segments 304, 306, 308, 310, and 312, each data segment having a number of bits equal to the number of bits in a codeword 334 (n+1) divided by the number (x) of data segments 304, 306, 308, 310, and 312. Each data segment 304, 306, 308, 310, and 312 is then encoded into a codeword segment 324, 326, 328, 330, and 332 having the same number of bits as the data segment. The codeword segments 324, 326, 328, 330, and 332 are then concatenated to form the codeword.

A decoder 168 is also provided for a disc drive 100. The decoder 168 decodes codewords 400 into data words 434 and includes at least one segment decoder 412, 414, 416, 418, and 420 for decoding each of a plurality of equally sized segments 402, 404, 406, 408, and 410 of the codeword 400. The decoding performed by segment decoder 412, 414, 416, 418 and 420 results in a plurality of data segments 422, 424, 426, 428, and 430 that are each the same size as the codeword segments. An inverse mapping unit 432 maps the plurality of data segments 422, 424, 426, 428, and 430 into a single data word 434.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the read channel while maintaining substantially the same functionality without departing from the scope and spirit of the present invention. In addition, although the preferred embodiment described herein is directed to a read channel for a disc drive system, it will be appreciated by those skilled in the art that the teachings of the present invention can be applied to other systems, like communication systems or other storage systems, without departing from the scope and spirit of the present invention.

What is claimed is:

1. A method of encoding data words into codewords, the method comprising steps of:
   (a) mapping the data words into a number of data segments, each data segment having a number of bits equal to the number of bits in the codeword divided by the number of data segments;
   (b) encoding each data segment into a codeword segment having the same number of bits as the data segment; and
   (c) concatenating the codeword segments together to form the codeword.

2. The method of claim 1 wherein each codewords has one more bit than its respective data words.

3. The method of claim 1 wherein mapping step (a) comprises:
   (a)(1) dividing each data word into a simplified mapping section and a number of passthrough sections, the number of passthrough sections equaling the number of data segments;
   (a)(2) mapping the simplified mapping section into a number of mapped sections, the number of mapped sections equaling the number of data segments; and
   (a)(3) combining each mapped section with a passthrough section to form a data segment.

4. The method of claim 3 wherein mapping step (a)(2) comprises limiting each mapped section to having values found in just a subset of all possible values for the mapped section.

5. The method of claim 4 wherein each mapped section has the same number of bits as all other mapped sections.

6. The method of claim 4 wherein mapping step (a)(2) comprises converting the simplified mapping section from being represented by a plurality of base two digits to being represented by a plurality of mapped digits that have a base that is different than two, wherein each mapped section is a binary representation of a mapped digit.

7. The method of claim 6 wherein each mapped digit is a binary representation of a base seven number.

8. The method of claim 1 wherein encoding step (b) comprises encoding the data segments in parallel using a number of identical encoders that is equal to the number of data segments.

9. The method of claim 1 wherein encoding step (b) comprises encoding the data segments sequentially using a single encoder.

10. The method of claim 1 wherein encoding step (b) comprises encoding the data segments such that the codeword meets at least one Run Length Limited code constraint.

11. The method of claim 1 wherein encoding step (b) further comprises steps of:
    (b)(1) dividing the data segments into a number of direct sections and a remapping section;
    (b)(2) remapping the remapping section into a number of remappped sections, the number of remapped sections equaling the number of direct sections;
    (b)(3) combining each remapped section with a direct section to form a number of combined sections;
    (b)(4) encoding each combined section to form an encoded section; and
    (b)(5) combining the encoded sections to form the code segment.

12. The method of claim 1 wherein the method forms part of a process of passing data through a channel, the process further comprising:
    detecting the codewords after the codewords pass through the channel; and
    decoding the codewords into data words.

13. A decoder for decoding codewords into data words, the decoder comprising:
    at least one segment decoder for decoding each of a plurality of equally sized segments of the codeword to form a plurality of data segments each being the same size as the codeword segments; and
    an inverse mapping unit that maps the plurality of data segments into a single data word.

14. The decoder of claim 13 wherein the inverse mapping unit comprises a simplified inverse mapping unit that combines a portion of each data segment together as a single input and that maps the single input to a single output having one less bit than the single input.

15. The decoder of claim 13 wherein the at least one segment decoder comprises a plurality of identical segment decoders that operate in parallel.

16. The decoder of claim 13 wherein the at least one segment decoder comprises a single segment decoder that sequentially decodes the codeword segments into data segments.

17. The decoder of claim 13 wherein valid decoded data segments are limited to a subset of all possible values that could be represented by the bits of the data segment.

18. The decoder of claim 13 wherein the segment decoder comprises:
    at least one smaller decoder for decoding each of a plurality of smaller portions of the code segment to form intermediate data portions; and
    a second inverse mapping unit that combines a part of each intermediate data portion as a single input value and that maps the single input value into a portion of the data segment.

19. The decoder of claim 13 wherein the decoder forms part of a disc drive.

20. A disc drive for reading data from tracks along a disc, the disc drive comprising:
    a read head that is positionable over a track and is capable of generating a read signal; and
    decoding means coupled to the read head for decoding codewords represented by the read signal to produce data words by dividing each codeword into equally-sized segments, decoding each segment into a data segment, and mapping the data segments into a data word.

21. A method of decoding codewords into data words, the method comprising:
    (a) dividing each codeword into codeword segments;
    (b) decoding each codeword segment into a data segment having the same number of bits; and
    (c) inverse mapping the data segments into a single data word.

* * * * *

UNITED STATES PATENT AND TRADEMARK OFFICE
CERTIFICATE OF CORRECTION

PATENT NO.    : 6,480,125 B2
DATED         : November 12, 2002
INVENTOR(S)   : Rub et al.

It is certified that error appears in the above-identified patent and that said Letters Patent is hereby corrected as shown below:

Columns 11 and 12,
Table 5, replace row $O_{12}$ with the following:

| $O_{12}$ | Z | φ | 0 | 0 | 0 | 0 | 0 | 0 | 0 | 0 | 0 | 0 | 0 | 0 | 1 | 0 | 0 | 0 | 1 | 0 | 1 |
|---|---|---|---|---|---|---|---|---|---|---|---|---|---|---|---|---|---|---|---|---|---|

Columns 21 and 22,
Table 7,
Column 5, line 1BX, replace "1EAA" with -- 1E4A --.
Between Row 1EX and 20X, Columns 0-9, add the following row:

| 1FX | 1E0F | 1E0E | 1E0D | 1E0C | 1E0B | 1E0A | 1E09 | 1E08 | 1E07 | 1E06 |
|---|---|---|---|---|---|---|---|---|---|---|

Column 7, line 24X, replace "1DBB" with -- 1DB8 --.
Column B, line 03X, replace "1FD4" with -- 1FC4 --.
Between row 1EX and 20X, add the following row:

| 1FX | 1E05 | 1E04 | 0138 | 0139 | 013A | 013B |
|---|---|---|---|---|---|---|

Columns 23 and 24,
Table 8,
Column 9, line 40X, replace "1BFB" with -- 1BF6 --.
Line 44X, replace "1BD6" with -- 1BB6 --.
Line 48X, first occurrence, should be -- 46X --.
Column 7, line 49X, replace "1868" with -- 1B68 --.

Columns 25 and 26,
Table 8 (cont.),
Column 3, line 4FX, replace "1BDC" with -- 1B0C --.
Column 2, line 57X, replace "1ABD" with -- 1A8D --.
Column 3, line 57X, replace "1ABC" with -- 1A8C --.
Column 4, line 57X, replace "1ABB" with -- 1A8B --.
Column 5, line 57X, replace "1A0A" with -- 1A8A --.
Column 3, line 59X, replace "1A5C" with -- 1A6C --.
Column 4, line 59X, replace "1A5B" with -- 1A6C --.
Column 5, line 59X, replace "1ABA" with -- 1A6A --.
Column 2, line 64X, replace "198D" with -- 19BD --.
Column 3, line 64X, replace "198C" with -- 19BC --.
Column 3, line 66X, replace "19DC" with -- 199C --.

UNITED STATES PATENT AND TRADEMARK OFFICE
CERTIFICATE OF CORRECTION

PATENT NO. : 6,480,125 B2  Page 2 of 6
DATED : November 12, 2002
INVENTOR(S) : Rub et al.

It is certified that error appears in the above-identified patent and that said Letters Patent is hereby corrected as shown below:

Columns 25 and 26 (cont.),
Table 8,
Column 5, line 67X, replace "19BA" with -- 198A --.
Column 5, line 6FX, replace "19DA" with -- 190A --.
Column 9, line 6FX, replace "19D5" with -- 1905 --.
Column 3, line 74X, replace "186C" with -- 18BC --.
Column 3, line 76X, replace "18DC" with -- 189C --.
Column 4, line 76X, replace "1898" with -- 189B --.
Column 7, line 79X, replace "1888" with -- 1868 --.
Column 9, line 79X, replace "1868" with -- 1866 --.
Column C, line 42X, replace "1B03" with -- 1BD3 --.
Column B, line 44X, replace "1BBA" with -- 1BB4 --.
Column F, line 44X, replace "038B" with -- 03BB --.
Line 48X, first occurrence, should be -- 46X --.
Column F, line 47X, replace "0388" with -- 03B8 --.
Column F, line 48X, replace "0387" with -- 03B7 --.
Column D, line 49X, replace "1862" with -- 1B62 --.
Column F, line 49X, replace "0386" with -- 03B6 --.
Column F, line 4AX, replace "0385" with -- 03B5 --.
Column F, line 4BX, replace "0384" with -- 03B4 --.
Column F, line 4EX, replace "0381" with -- 03B1 --.

Columns 27 and 28,
Table 8 (cont.),
Column F, line 63X, replace "03DC" with -- 039C --.
Column B, line 73X, replace "1804" with -- 18C4 --.
Column D, line 73X, replace "1DC2" with -- 18C2 --.
Column A, line 75X, replace "1BA5" with -- 18A5 --.
Column B, line 75X, replace "1BA4" with -- 18A4 --.
Column C, line 75X, replace "1BA3" with -- 18A3 --.
Column D, line 75X, replace "1BA2" with -- 18A2 --.
Column E, line 75X, replace "1BA1" with -- 18A1 --.
Column F, line 75X, replace "03BA" with -- 038A --.

UNITED STATES PATENT AND TRADEMARK OFFICE
CERTIFICATE OF CORRECTION

PATENT NO. : 6,480,125 B2
DATED : November 12, 2002
INVENTOR(S) : Rub et al.

It is certified that error appears in the above-identified patent and that said Letters Patent is hereby corrected as shown below:

Columns 27 and 28 (cont.),
Table 9,
Column 8, line 81X, replace "17E1" with -- 17E7 --.
Column 4, line 87X, replace "1788" with -- 178B --.
Column 5, line 87X, replace "17BA" with -- 178A --.
Column 4, line 89X, replace "1786" with -- 176B --.
Column 5, line 89X, replace "17BA" with -- 176A --.
Column 8, line 8FX, replace "1708" with -- 170B --.
Column 6, line 94X, replace "1889" with -- 16B9 --.
Column 5, line 97X, replace "16BA" with -- 168A --.
Column 4, line 98X, replace "1678" with -- 167B --.
Column 7, line 99X, replace "1688" with -- 1668 --.
Column 7, line 9CX, replace "1636" with -- 1638 --.
Column 9, line B3X, replace "14C5" with -- 14C6 --.
Column 5, line B9X, replace "14BA" with -- 146A --.
Column 2, line BCX, replace "1433" with -- 143D --.
Column 5, line BCX, replace "1434" with -- 143A --.
Column F, line 82X, replace "17D1" with -- 037D --.
Column E, line 8FX, replace "0104" with -- 01D4 --.
Line 98X, second occurrence, should be -- 9BX --.
Column B, line A3X, replace "1504" with -- 15C4 --.
Column B, line A4X, replace "1584" with -- 15B4 --.
Column B, line A7X, replace "1564" with -- 1584 --.
Column D, line A7X, replace "15B2" with -- 1582 --.
Column E, line AFX, replace "01D5" with -- 01D6 --.
Column B, line B3X, replace "1404" with -- 14C4 --.
Column B, line B4X, replace "1484" with -- 14B4 --.
Column C, line B4X, replace "14B5" with -- 14B3 --.

Columns 31 and 32,
Table 10,
Column 4, line D7X, replace "12BB" with -- 128B --.
Column 0, line E2X, replace "11DE" with -- 11DF --.

UNITED STATES PATENT AND TRADEMARK OFFICE
CERTIFICATE OF CORRECTION

PATENT NO. : 6,480,125 B2
DATED : November 12, 2002
INVENTOR(S) : Rub et al.

It is certified that error appears in the above-identified patent and that said Letters Patent is hereby corrected as shown below:

Columns 33 and 34,
Table 10,
Column 3, line E7X, replace "11BC" with -- 118C --.
Column 5, line E9X, replace "11BA" with -- 116A --.
Column 3, line F6X, replace "10DC" with -- 109C --.
Column 7, line F6X, replace "109B" with -- 1098 --.
Column 5, line F9X, replace "10BA" with -- 106A --.
Column B, line C5X, replace "1344" with -- 13A4 --.
Column B, line C9X, replace "1384" with -- 1364 --.
Column E, line EFX, replace "01BA" with -- 016A --.
Column B, line F2X, replace "1004" with -- 10D4 --.

Columns 35 and 36,
Table 11,
Line "100X", second occurrence, should be -- 101X --.
Column 9, line 118X, replace "0E7B" with -- 0E76 --.
Column 2, line 119X, replace "0EBD" with -- 0E6D --.
Column 1, line 127X, replace "0DBE" with -- 0D8E --.
Column 4, line 127X, replace "0DBB" with -- 0D8B --.
Column 5, line 127X, replace "0DBA" with -- 0D8A --.
Column 6, line 127X, replace "0DB9" with -- 0D89 --.
Column 7, line 127X, replace "0DB8" with -- 0D88 --.
Line "100X", second occurrence, should be -- 101X --.

Columns 37 and 38,
Table 11,
Column D, line 107X, replace "0FB2" with -- 0F82 --.
Column F, line 107X, replace "02FB" with -- 02F8 --.
Column E, line 109X, replace "0FB1" with -- 0F61 --.
Column C, line 127X, replace "0DB3" with -- 0D83 --.
Column D, line 127X, replace "0D62" with -- 0D82 --.
Column E, line 127X, replace "0DB1" with -- 0D81 --.
Line 12BX, first occurrence, should be -- 128X --.
Column F, line 129X, replace "0206" with -- 02D6 --.

Columns 39 and 40,
Table 12,
Column 1, line 157X, replace "0ABE" with -- 0A8E --.
Column 2, line 157X, replace "0ABD" with -- 0A8D --.
Column 3, line 157X, replace "0ABC" with -- 0A8C --.
Column 4, line 157X, replace "0ABB" with -- 0A8B --.

UNITED STATES PATENT AND TRADEMARK OFFICE
CERTIFICATE OF CORRECTION

PATENT NO. : 6,480,125 B2
DATED : November 12, 2002
INVENTOR(S) : Rub et al.

It is certified that error appears in the above-identified patent and that said Letters Patent is hereby corrected as shown below:

Columns 39 and 40 (cont.),
Table 12 (cont.),
Column 7, line 157X, replace "0AB8" with -- 0A88 --.
Column 3, line 159X, replace "0A8C" with -- 0A6C --.
Column D, line 107X, replace "0FB2" with -- 0F82 --.
Column 9, line 15EX, replace "0A18" with -- 0A16 --.
Column 9, line 15FX, replace "0A08" with -- 0A06 --.
Column 9, line 167X, replace "0988" with -- 0986 --.
Column 0, line 177X, replace "08BF" with -- 088F --.
Column 2, line 177X, replace "08BD" with -- 088D --.
Column 3, line 177X, replace "08BC" with -- 088C --.
Column 5, line 177X, replace "08BA" with -- 088A --.
Column 6, line 177X, replace "08B9" with -- 0889 --.
Column 9, line 177X, replace "0888" with -- 0886 --.
Column 7, line 179X, replace "0888" with -- 0868 --.
Column 8, line 179X, replace "0887" with -- 0867 --.
Column 9, line 179X, replace "0886" with -- 0866 --.
Column 9, line 17EX, replace "0818" with -- 0816 --.

Columns 41 and 42,
Table 12,
Column B, line 142X, replace "0B04" with -- 0BD4 --.
Column D, line 157X, replace "0AB2" with -- 0A82 --.
Column A, line 159X, replace "0A85" with -- 0A65 --.
Column B, line 159X, replace "0A84" with -- 0A64 --.
Column D, line 159X, replace "0A82" with -- 0A62 --.
Column F, line 171X, replace "02BE" with -- 028E --.
Column B, line 174X, replace "0804" with -- 08B4 --.
Column F, line 175X, replace "02BA" with -- 028A --.
Column F, line 176X, replace "02B9" with -- 0289 --.
Column A, line 179X, replace "0885" with -- 0865 --.
Column B, line 179X, replace "0884" with -- 0864 --.
Column C, line 179X, replace "0883" with -- 0863 --.
Column D, line 179X, replace "0882" with -- 0862 --.

Columns 43 and 44,
Table 13,
Column 2, line 182X, replace "070D" with -- 07DD --.
Column 4, line 182X, replace "070B" with -- 07DB --.
Column 7, line 182X, replace "0708" with -- 07D8 --.
Column 8, line 182X, replace "0707" with -- 07D7 --.

UNITED STATES PATENT AND TRADEMARK OFFICE
CERTIFICATE OF CORRECTION

PATENT NO.    : 6,480,125 B2
DATED         : November 12, 2002
INVENTOR(S)   : Rub et al.

It is certified that error appears in the above-identified patent and that said Letters Patent is hereby corrected as shown below:

<u>Columns 43 and 44 (cont.),</u>
Table 13 (cont.),
Column 1, line 18FX, replace "07DE" with -- 070E --.
Column 8, line 18FX, replace "07D7" with -- 0707 --.
Line 1ADX, first occurrence, should be -- 1AOX --.
Column 5, line 1ADX, replace "05ZA" with -- 052A --.
Line 1BDX, first occurrence, should be -- 1B0X --.
Column 9, line 1BAX, replace "0458" with -- 0456 --.
Column B, line 182X, replace "0704" with -- 07D4 --.
Column F, line 182X, replace "0270" with -- 027D --.
Column D, line 187X, replace "0762" with -- 0782 --.

<u>Columns 45 and 46,</u>
Table 13,
Column D, line 197X, replace "06B2" with -- 0682 --.
Column B, line 19EX, replace "0B14" with -- 0614 --.
Column A, line 19FX, replace "06D5" with -- 0605 --.
Column C, line 19FX, replace "01DF" with -- 010F --.
Line 1ADX, first occurrence, should be -- 1A0X --.
Column C, line 1A9X, replace "o563" with -- 0563 --.
Column D, line 1ABX, replace "0642" with -- 0542 --.
Column E, line 1ABX, replace "0641" with -- 0541 --.
Column A, line 1AFX, replace "05D5" with -- 0505 --.
Column C, line 1AFX, replace "05D3" with -- 0503 --.
Line 1BDX, first occurrence, should be -- 1B0X --.

Signed and Sealed this

Seventeenth Day of June, 2003

JAMES E. ROGAN
*Director of the United States Patent and Trademark Office*